US012100764B2

(12) United States Patent
Nasu et al.

(10) Patent No.: US 12,100,764 B2
(45) Date of Patent: Sep. 24, 2024

(54) SEMICONDUCTOR DEVICE

(71) Applicant: ROHM CO., LTD., Kyoto (JP)

(72) Inventors: Kentaro Nasu, Kyoto (JP); Yasuhiro Kondo, Kyoto (JP); Takaaki Yoshioka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 456 days.

(21) Appl. No.: 17/428,555

(22) PCT Filed: Feb. 7, 2020

(86) PCT No.: PCT/JP2020/004938
§ 371 (c)(1),
(2) Date: Aug. 4, 2021

(87) PCT Pub. No.: WO2020/162620
PCT Pub. Date: Aug. 13, 2020

(65) Prior Publication Data
US 2022/0140141 A1    May 5, 2022

(30) Foreign Application Priority Data

Feb. 7, 2019  (JP) ................................ 2019-021005

(51) Int. Cl.
*H01L 29/78*  (2006.01)
*H01L 29/06*  (2006.01)
(Continued)

(52) U.S. Cl.
CPC ........ *H01L 29/7825* (2013.01); *H01L 29/063* (2013.01); *H01L 29/1095* (2013.01);
(Continued)

(58) Field of Classification Search
CPC ............... H01L 29/7825; H01L 29/063; H01L 29/1095; H01L 29/1608; H01L 29/66068;
(Continued)

(56) References Cited

U.S. PATENT DOCUMENTS 4,453,305 A     6/1984  Janes et al.
6,316,807 B1 *  11/2001 Fujishima ........... H01L 29/7809
                                                     257/E29.267
(Continued)

FOREIGN PATENT DOCUMENTS

CN    101154684 A     4/2008
CN    105489653 A  *  4/2016 ........... H01L 21/047
(Continued)

OTHER PUBLICATIONS

International Preliminary Report on Patentability issued for International Patent Application No. PCT/JP2020/004938, Date of mailing: Aug. 19, 2021, 16 pages including English translation.
(Continued)

*Primary Examiner* — Mohammed Shamsuzzaman
(74) *Attorney, Agent, or Firm* — HSML P.C.

(57) ABSTRACT

A semiconductor device includes a semiconductor layer that has a main surface, a trench gate structure that includes a trench formed in the main surface and having a first sidewall at one side, a second sidewall at the other side and a bottom wall in a cross-sectional view, an insulation layer formed on an inner wall of the trench, and a gate electrode embedded in the trench with the insulation layer between the trench and the gate electrode and having an upper end portion positioned at a bottom-wall side with respect to the main surface, a plurality of first-conductivity-type drift regions that are respectively formed in a region at the first sidewall side of the trench and in a region at the second sidewall side of the trench such as to face each other with the trench interposed therebetween in a surface layer portion of the main surface and that are positioned in a region at the main surface side with respect to the bottom wall, and a plurality of first-conductivity-type source/drain regions that are formed in (Continued)

surface layer portions of the plurality of drift regions, respectively.

19 Claims, 39 Drawing Sheets

(51) Int. Cl.
  *H01L 29/10* (2006.01)
  *H01L 29/16* (2006.01)
  *H01L 29/66* (2006.01)
(52) U.S. Cl.
  CPC .... *H01L 29/1608* (2013.01); *H01L 29/66068* (2013.01); *H01L 29/7819* (2013.01)
(58) Field of Classification Search
  CPC ......... H01L 29/7819; H01L 2224/0239; H01L 27/0727; H01L 24/05; H01L 24/13; H01L 24/14; H01L 29/0847; H01L 2224/02351; H01L 2224/0401; H01L 2224/05008; H01L 2224/05124; H01L 2224/05147; H01L 2224/05569; H01L 2224/05572; H01L 2224/05624; H01L 2224/05644; H01L 2224/05647; H01L 2224/05655; H01L 2224/05666; H01L 2224/05686; H01L 2224/13024; H01L 2224/131; H01L 2224/14151; H01L 2224/14155; H01L 29/0696; H01L 29/1045; H01L 29/66621; H01L 29/7834
  See application file for complete search history.

(56) References Cited

U.S. PATENT DOCUMENTS

| | | | | |
|---|---|---|---|---|
| 6,452,231 B1* | 9/2002 | Nakagawa | ......... | H01L 27/0623 257/E29.267 |
| 6,518,623 B1* | 2/2003 | Oda | ................. | H01L 29/7838 257/E21.429 |
| 8,319,279 B2* | 11/2012 | Kawaguchi | ............. | H01L 29/78 257/E21.373 |
| 9,099,520 B2* | 8/2015 | Rahimo | ............ | H01L 29/66348 |
| 10,840,369 B2* | 11/2020 | Okumura | .......... | H01L 29/66734 |
| 2004/0038467 A1* | 2/2004 | Darwish | ............. | H01L 29/0634 257/E29.066 |
| 2006/0038223 A1* | 2/2006 | Darwish | ............. | H01L 29/7811 257/E29.066 |
| 2007/0013000 A1* | 1/2007 | Shiraishi | ............. | H01L 29/7813 257/E29.066 |
| 2007/0145474 A1* | 6/2007 | Annese | .............. | H01L 29/7834 257/E21.429 |
| 2008/0073731 A1* | 3/2008 | Hayashi | ............. | H01L 29/7834 257/E21.336 |
| 2008/0149963 A1* | 6/2008 | Adan | ................. | H01L 29/7827 257/190 |
| 2008/0164520 A1* | 7/2008 | Darwish | ............. | H01L 21/2658 257/334 |
| 2008/0230787 A1* | 9/2008 | Suzuki | ................ | H01L 29/7813 257/E29.066 |
| 2008/0237704 A1* | 10/2008 | Williams | .......... | H01L 21/76224 257/E21.546 |
| 2008/0265314 A1* | 10/2008 | Kobayashi | ........ | H01L 29/41766 257/E29.136 |
| 2009/0032821 A1* | 2/2009 | Onose | ............... | H01L 29/66068 257/77 |
| 2009/0072241 A1* | 3/2009 | Harris | ................ | H01L 29/7813 257/77 |
| 2012/0261714 A1* | 10/2012 | Taketani | ............ | H01L 29/7808 257/E29.198 |
| 2012/0326207 A1* | 12/2012 | Yoshimochi | ........ | H01L 29/0653 257/E29.198 |
| 2013/0240981 A1* | 9/2013 | Hutzler | .............. | H01L 29/7827 438/268 |
| 2014/0264564 A1* | 9/2014 | Cheng | .................. | H01L 21/049 438/270 |
| 2014/0353746 A1* | 12/2014 | Hamazawa | ....... | H01L 21/76232 438/156 |
| 2017/0179278 A1* | 6/2017 | Baldwin | ............. | H01L 21/2253 |
| 2017/0278957 A1* | 9/2017 | Hikasa | ................ | H01L 29/1095 |
| 2019/0067491 A1* | 2/2019 | Blanchard | .......... | H01L 29/6609 |
| 2019/0081170 A1* | 3/2019 | Kumagai | ............. | H01L 27/088 |
| 2019/0305083 A1* | 10/2019 | Dainese | ............... | H01L 21/765 |
| 2020/0066579 A1* | 2/2020 | Beninger-Bina | ...... | H01L 29/083 |
| 2021/0320170 A1* | 10/2021 | De-Michielis | ...... | H01L 29/7397 |
| 2022/0173215 A1* | 6/2022 | Zeng | ................. | H01L 29/66727 |
| 2023/0411446 A1* | 12/2023 | Sampath | ............... | H01L 21/047 |

FOREIGN PATENT DOCUMENTS

| | | | | | |
|---|---|---|---|---|---|
| CN | 105702739 | A | * | 6/2016 | ....... H01L 21/28008 |
| CN | 105957892 | A | * | 9/2016 | ......... H01L 29/0611 |
| CN | 104733519 | B | * | 1/2018 | ......... H01L 27/0635 |
| CN | 105702739 | B | * | 4/2019 | ....... H01L 21/28008 |
| CN | 109686791 | A | * | 4/2019 | ......... H01L 21/0465 |
| CN | 111048587 | A | * | 4/2020 | ......... H01L 29/0603 |
| DE | 102005008495 | A1 | * | 6/2007 | ......... H01L 29/0878 |
| DE | 102007017002 | A1 | * | 10/2007 | ......... H01L 29/0843 |
| DE | 10261600 | B4 | * | 8/2014 | ..... H01L 21/823885 |
| DE | 102015113493 | A1 | * | 2/2017 | ......... H01L 29/4236 |
| DE | 112015004374 | T5 | * | 6/2017 | ............ H01L 23/482 |
| DE | 102015017270 | B3 | * | 12/2022 | ......... H01L 29/0607 |
| DE | 112016004718 | B4 | * | 12/2022 | ......... H01L 29/0623 |
| DE | 112017000441 | B4 | * | 3/2023 | ......... H01L 29/1608 |
| EP | 3002777 | A2 | * | 4/2016 | ........... H01L 21/047 |
| EP | 3327791 | A1 | * | 5/2018 | ......... H01L 29/0696 |
| JP | S5093779 | | | 7/1975 | |
| JP | S5831579 | | | 2/1983 | |
| JP | H03160761 | | | 7/1991 | |
| JP | H04259258 | | | 9/1992 | |
| JP | 2001352057 | | | 12/2001 | |
| JP | 2002124669 | | | 4/2002 | |
| JP | 2003298048 | | | 10/2003 | |
| JP | 2007129097 | A | * | 5/2007 | ......... H01L 29/0696 |
| JP | 4028482 | B2 | * | 12/2007 | ......... H01L 21/2253 |
| JP | 2008084996 | | | 4/2008 | |
| JP | 4839548 | B2 | * | 12/2011 | ......... H01L 29/0696 |
| JP | 2012248623 | A | * | 12/2012 | ......... H01L 29/0696 |
| JP | 2014236159 | | | 12/2014 | |
| JP | 2016122858 | A | * | 7/2016 | ......... H01L 29/0696 |
| JP | 2017123498 | A | * | 7/2017 | ......... H01L 29/0619 |
| JP | 2018129378 | A | * | 8/2018 | ....... H01L 21/26586 |
| JP | 2018133579 | A | * | 8/2018 | ......... H01L 29/0696 |
| JP | 6937326 | B2 | * | 9/2021 | ......... H01L 29/1095 |
| JP | 7355526 | B2 | * | 10/2023 | ......... H01L 23/5223 |
| TW | 200937639 | A | * | 9/2009 | ............ H01L 21/046 |
| WO | WO-0106568 | A1 | * | 1/2001 | ............ H01L 29/781 |
| WO | WO-2004032243 | A1 | * | 4/2004 | ............ H01L 29/407 |
| WO | WO-2014171048 | A1 | * | 10/2014 | ....... H01L 21/02164 |
| WO | WO-2018237355 | A1 | * | 12/2018 | ....... H01L 21/26513 |
| WO | WO-2021246060 | A1 | * | 12/2021 | ......... H01L 29/0696 |
| WO | WO-2022209357 | A1 | * | 10/2022 | ......... H01L 29/0696 |
| WO | WO-2023189161 | A1 | * | 10/2023 | ......... H01L 29/0696 |

OTHER PUBLICATIONS

International Search Report and Written Opinion issued for International Patent Application No. PCT/JP2020/004938, Date of mailing: Mar. 17, 2020, 11 pages including English translation of Search Report.
First Office Action issued for Chinese Patent Application No. 202080012924.7, dated May 8, 2023, 10 pages Including partial English machine translation.
Notice of Reasons for Refusal issued for Japanese Patent Application No. 2020-571309, Dispatch Date: Jul. 20, 2023, 8 pages including English machine translation.

\* cited by examiner

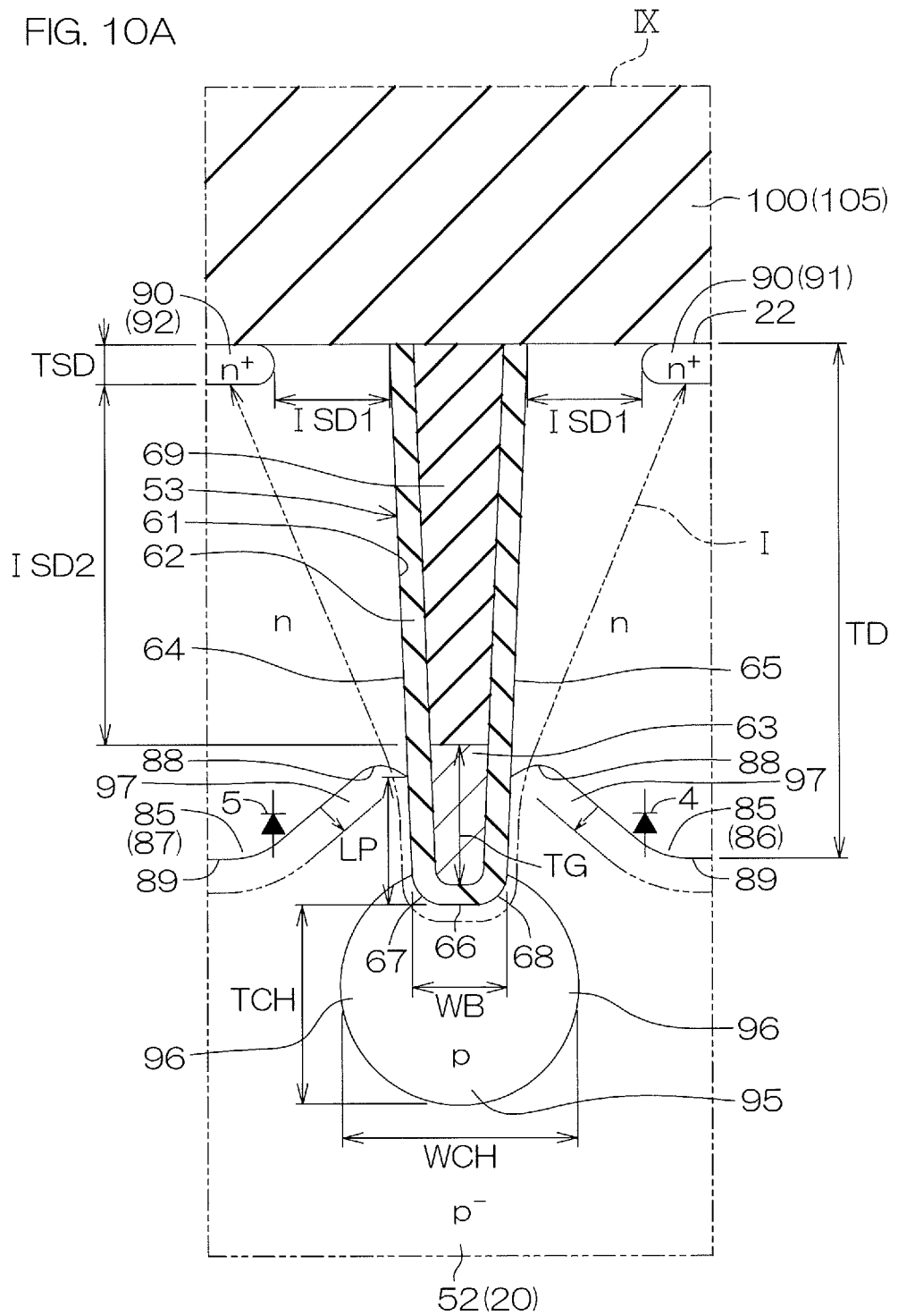

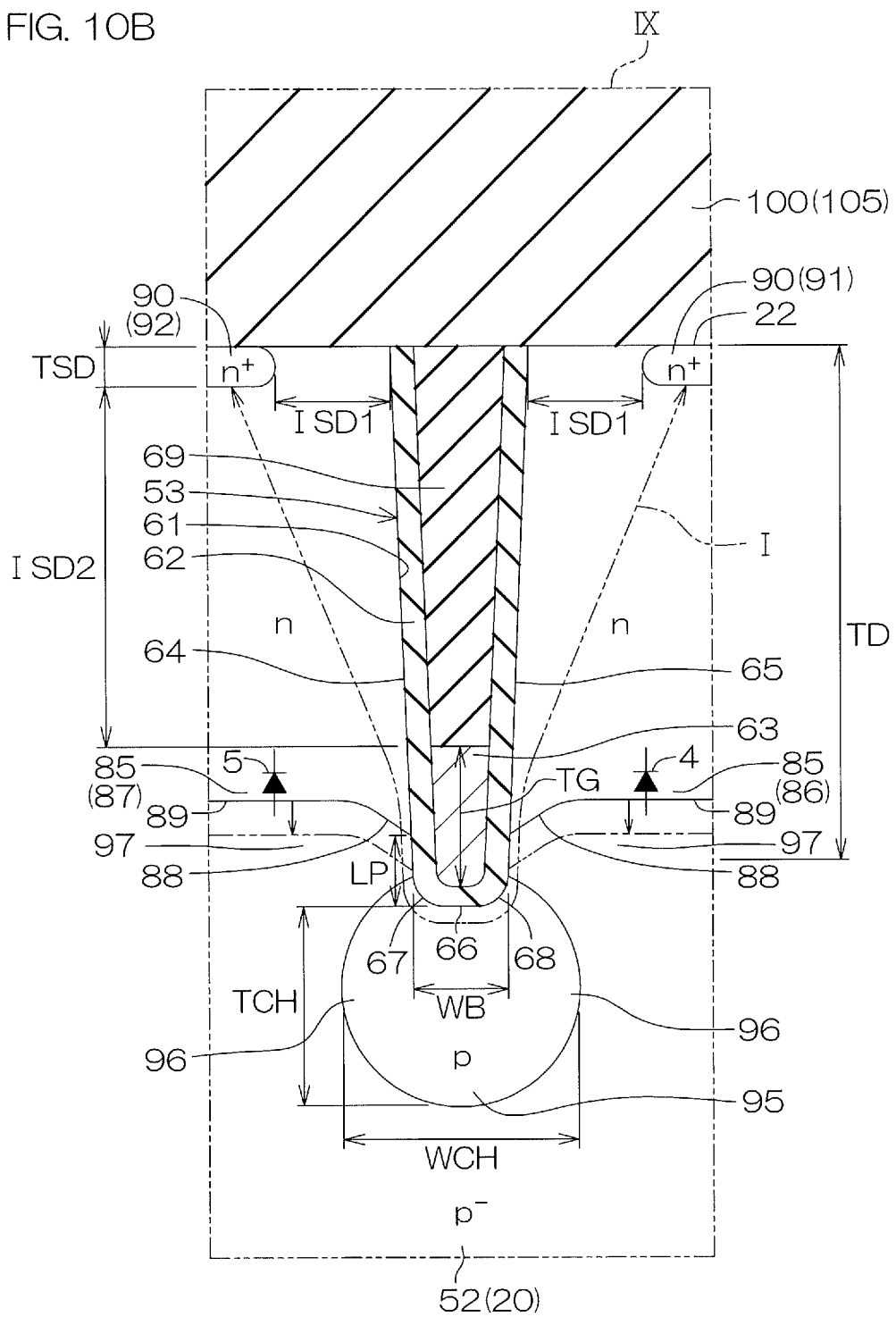

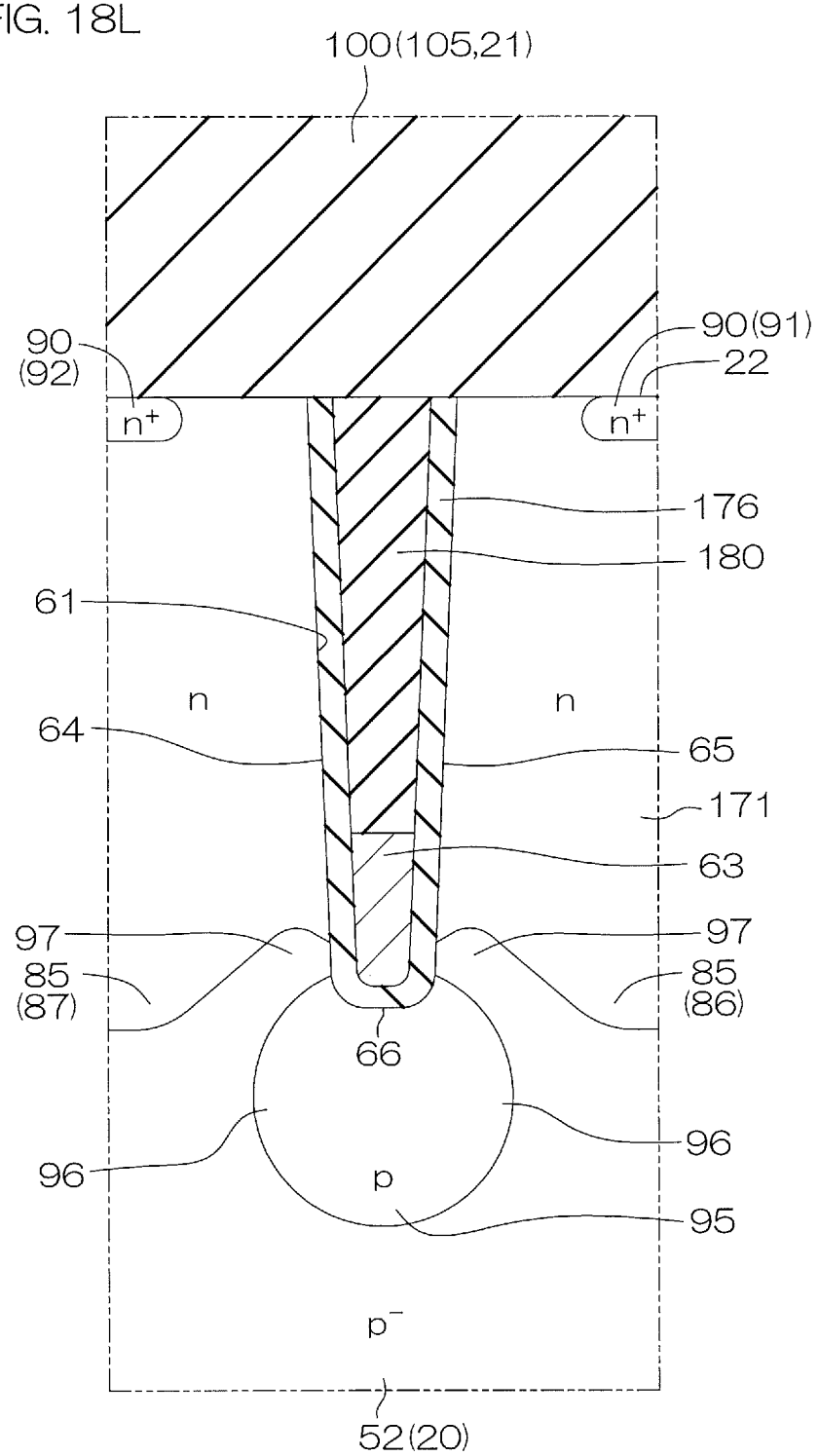

SEMICONDUCTOR DEVICE

TECHNICAL FIELD

The present invention relates to a semiconductor device that includes a common source/drain type MISFET (Metal Insulator Semiconductor Field Effect Transistor) in which a source and a drain are formed integrally with each other.

BACKGROUND ART

Patent Literature 1 discloses a semiconductor device having a longitudinal gate type MOS (Metal Oxide Semiconductor) transistor as an example of the common source/drain type MISFET. This semiconductor device includes a p-type semiconductor chip (semiconductor layer), a trench gate structure, a plurality of n-type drift regions, and a plurality of $n^+$-type source/drain regions.

The trench gate structure includes a trench, an insulation layer, and a gate electrode. The trench is formed in a main surface of the semiconductor chip. The trench has a first sidewall, a second sidewall, and a bottom wall in a cross-sectional view. The insulation layer is formed on an inner wall of the trench. The gate electrode is embedded in the trench with the insulation layer between the gate electrode and the trench. The plurality of drift regions are formed in a region at the first-sidewall side of the trench and in a region at the second-sidewall side of the trench, respectively, in a surface layer portion of the main surface of the semiconductor chip. The plurality of drift regions are formed in a region at the main surface side of the semiconductor chip with respect to the bottom wall of the trench.

The plurality of source/drain regions are formed at the surface layer portions of the plurality of drift regions, respectively. One of the source/drain regions is electrically connected to a high-voltage side, whereas the other one of the source/drain regions is electrically connected to a low-voltage side. When a gate voltage is applied to the gate electrode, a channel is formed in a region along the bottom wall of the trench. Hence, an electric current flows from the source/drain region at the high-voltage side to the source/drain region at the low-voltage side through the channel.

CITATION LIST

Patent Literature

Patent Literature 1: United States Patent Application Publication No. 2007/0145474

SUMMARY OF INVENTION

Technical Problem

One preferred embodiment of the present invention provides a semiconductor device that includes a common source/drain type MISFET and that is capable of improving a withstand voltage.

Solution to Problem

One preferred embodiment of the present invention provides a semiconductor device including a semiconductor layer that has a main surface, a trench gate structure that includes a trench formed in the main surface and having a first sidewall at one side, a second sidewall at the other side and a bottom wall in a cross-sectional view, an insulation layer formed on an inner wall of the trench, and a gate electrode embedded in the trench with the insulation layer between the trench and the gate electrode and having an upper end portion positioned at a bottom-wall side with respect to the main surface, a plurality of first-conductivity-type drift regions that are respectively formed in a region at the first sidewall side of the trench and in a region at the second sidewall side of the trench such as to face each other with the trench interposed therebetween in a surface layer portion of the main surface and that are positioned in a region at the main surface side with respect to the bottom wall, and a plurality of first-conductivity-type source/drain regions that are formed in surface layer portions of the plurality of drift regions, respectively.

With this semiconductor device, it is possible to reduce an electric field strength generated between the gate electrode and each of the source/drain regions. This makes it possible to suppress an electric-field concentration to the trench gate structure. As a result, it is possible to provide a semiconductor device capable of improving a withstand voltage.

One preferred embodiment of the present invention provides a semiconductor device including a semiconductor layer that has a main surface, a trench gate structure that includes a trench formed in the main surface and having a first sidewall, a second sidewall and a bottom wall in a cross-sectional view, an insulation layer formed on an inner wall of the trench, and a gate electrode that is embedded in the trench with the insulation layer between the trench and the gate electrode, a plurality of first-conductivity-type drift regions that are respectively formed in a region at the first sidewall side of the trench and in a region at the second sidewall side of the trench such as to face each other with the trench interposed therebetween in a surface layer portion of the main surface and that are positioned in a region at the main surface side with respect to the bottom wall, a plurality of first-conductivity-type source/drain regions that are formed in surface layer portions of the plurality of drift regions, respectively, a second-conductivity-type base region that is formed in a region below the plurality of drift regions in the semiconductor layer, and a second-conductivity-type high concentration channel region that is formed in a region along the bottom wall of the trench such as to face the gate electrode with the insulation layer interposed therebetween and that has a second-conductivity-type impurity concentration exceeding a second-conductivity-type impurity concentration of the base region.

With this semiconductor device, the high concentration channel region is capable of preventing depletion layers spreading from the plurality of drift regions from overlapping each other at the bottom wall of the trench. This makes it possible to suppress punch-through. As a result, it is possible to provide a semiconductor device capable of improving a withstand voltage.

The aforementioned or yet other objects, features, and advantages of the present invention will become more apparent from the following description of preferred embodiments given below with reference to the attached drawings.

BRIEF DESCRIPTION OF DRAWINGS

FIG. 10A is an enlarged view of a region corresponding to FIG. 9, showing a form including a drift region according to a second configuration example.

FIG. 10B is an enlarged view of a region corresponding to FIG. 9, showing a form including a drift region according to a third configuration example.

DESCRIPTION OF EMBODIMENTS

Figure 1:
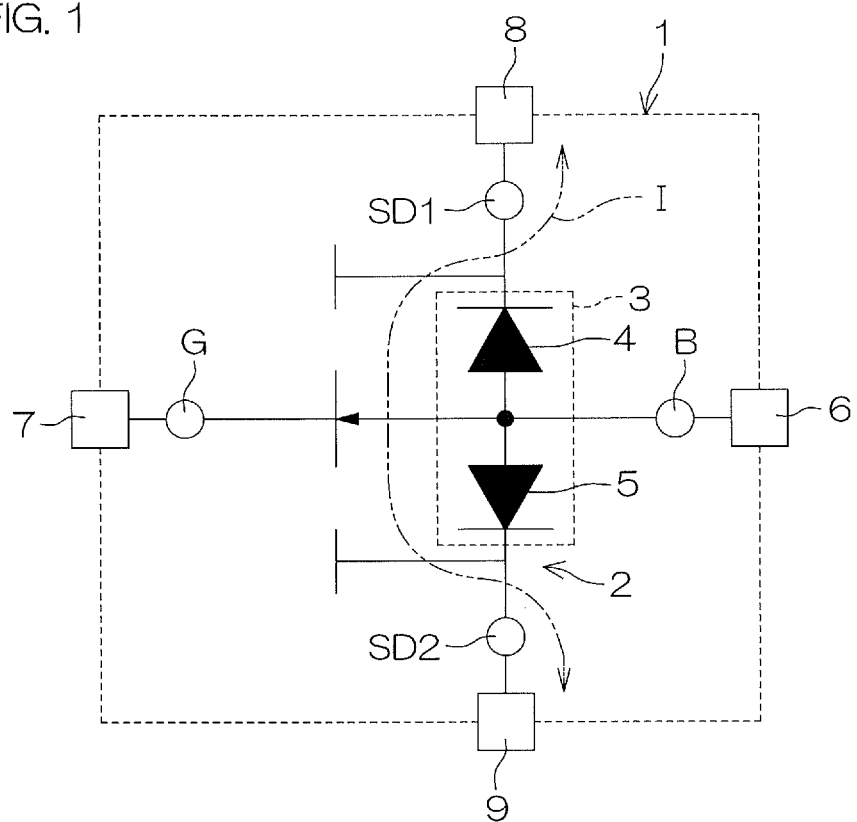
FIG. 1 is a circuit diagram showing a semiconductor device according to a first preferred embodiment of the present invention.

FIG. 1 is a circuit diagram showing a semiconductor device 1 according to a first preferred embodiment of the present invention. The semiconductor device 1 includes a common source/drain type MISFET (Metal Insulator Semiconductor Field Effect Transistor) 2. The MISFET 2 includes a base B, a gate G, a first source drain SD1, and a second source drain SD2. The first source drain SD1 and the second source drain SD2 each include a source and a drain that are formed integrally with each other.

A reference voltage (for example, ground voltage) is to be applied to the base B. A gate voltage VG based on the base B is to be applied to the gate G. The passage and the interruption of an electric current I flowing between the first source drain SD1 and the second source drain SD2 are to be controlled by the gate G.

The semiconductor device 1 further includes a series circuit 3 that has a diode pair making a reverse bias connection. The series circuit 3 is connected to the first source drain SD1 and to the second source drain SD2. The series circuit 3 regulates (interrupts) the electric current I flowing between the first source drain SD1 and the second source drain SD2 in an OFF state of the MISFET 2.

In detail, the diode pair includes a first body diode 4 and a second body diode 5. The first body diode 4 and the second body diode 5 each include an anode and a cathode. The anode of the first body diode 4 is connected to the base B. The cathode of the first body diode 4 is connected to the first source drain SD1. The anode of the second body diode 5 is connected to the base B. The cathode of the second body diode 5 is connected to the second source drain SD2.

The semiconductor device 1 is a four-terminal device, and includes a base terminal 6, a gate terminal 7, a first source/drain terminal 8, and a second source/drain terminal 9. The base terminal 6 is connected to the base B. The gate terminal 7 is connected to the gate G. The first source/drain terminal 8 is connected to the first source drain SD1. The second source/drain terminal 9 is connected to the second source drain SD2.

The MISFET 2 is a bidirectional device that enables the electric current I to flow in both directions of the first source/drain terminal 8 and the second source/drain terminal 9. If the first source/drain terminal 8 is connected to a high-voltage side (input side), the second source/drain terminal 9 is connected to a low-voltage side (output side). On the other hand, if the first source/drain terminal 8 is connected to the low-voltage side (output side), the second source/drain terminal 9 is connected to the high-voltage side (input side).

When a gate voltage VG not less than a gate threshold voltage Vth (Vth VG) is applied to the gate terminal 7, the electric current I flows between the first source/drain terminal 8 and the second source/drain terminal 9. Hence, the MISFET 2 becomes an ON state. On the other hand, when a gate voltage VG less than the gate threshold voltage Vth (VG<Vth) is applied to the gate terminal 7, the electric current I does not flow between the first source/drain terminal 8 and the second source/drain terminal 9. Hence, the MISFET 2 becomes an OFF state.

The semiconductor device 1 enables the single MISFET 2 to fulfill a function of a circuit in which drains of two MISFETs each of which is not a common source/drain type are connected to each other. Therefore, with the semiconductor device 1, it is possible to achieve low on-resistance by shortening a current path. A detailed structure of the semiconductor device 1 will be hereinafter described.

Figure 2:
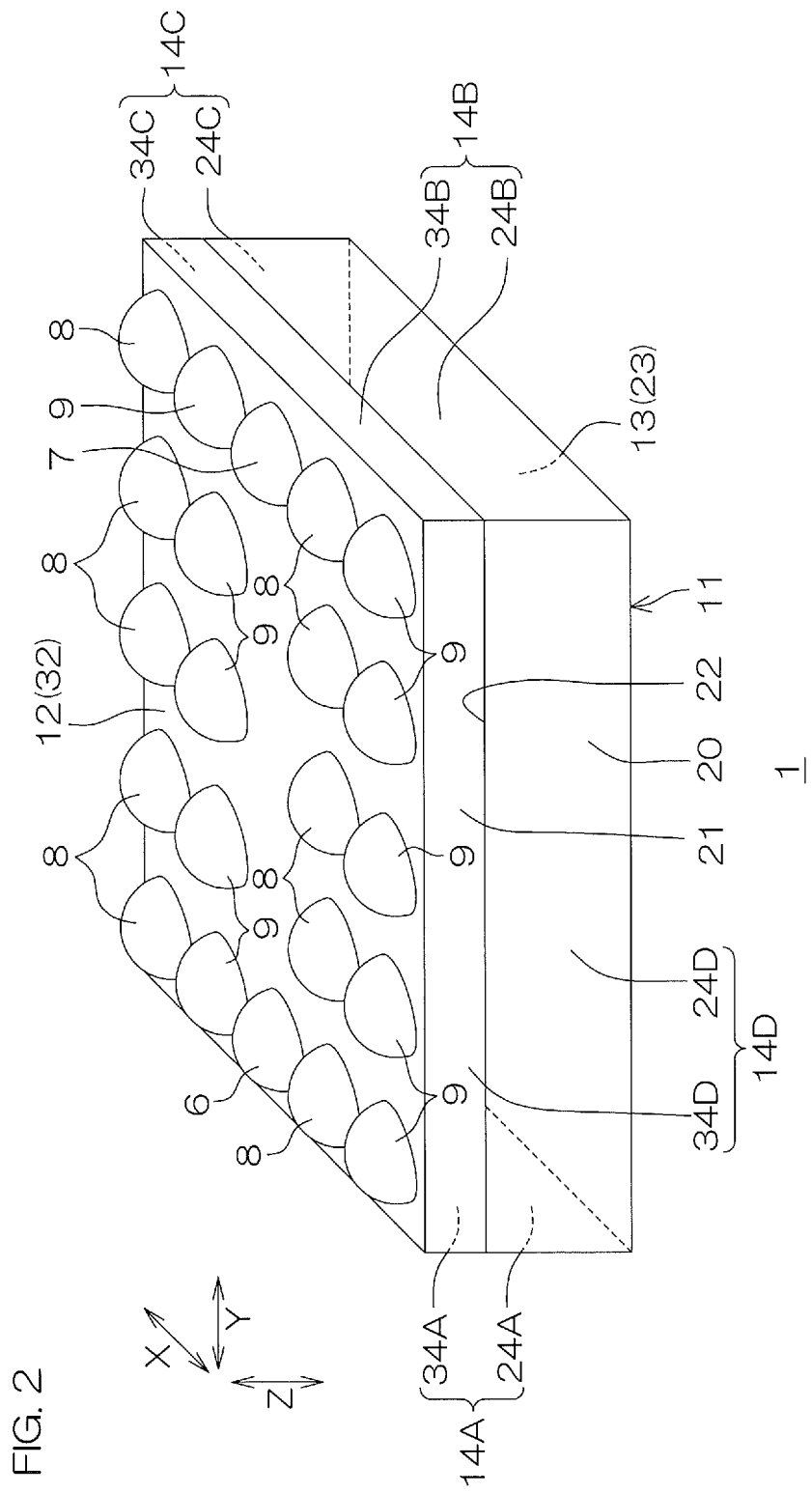
FIG. 2 is a perspective view of the semiconductor device shown in FIG. 1.
Figure 3:
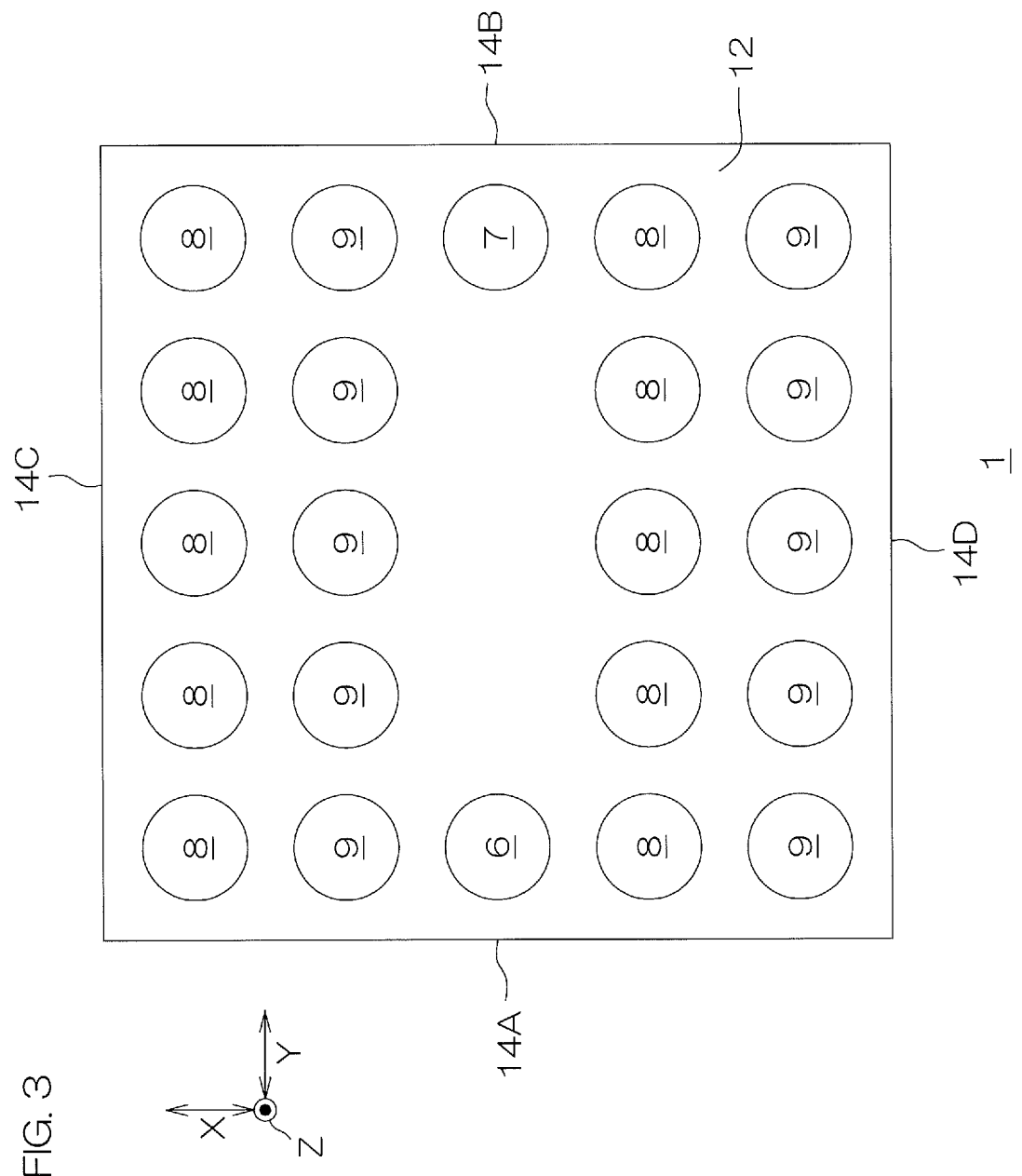
FIG. 3 is a plan view of the semiconductor device shown in FIG. 2.

FIG. 2 is a perspective view of the semiconductor device 1 shown in FIG. 1. FIG. 3 is a plan view of the semiconductor device 1 shown in FIG. 2. A description will be hereinafter given of an example in which the semiconductor device 1 is formed of a wafer level chip size package that has the size of a chip cut out from a wafer as a package size.

Referring to FIG. 2 and FIG. 3, the semiconductor device 1 includes a rectangular-parallelepiped-shaped device main body 11. The device main body 11 includes a first surface 12 at one side, a second surface 13 at the other side, and side surfaces 14A, 14B, 14C and 14D that connect the first surface 12 and the second surface 13. In detail, the side surfaces 14A to 14D include the first side surface 14A, the second side surface 14B, the third side surface 14C and the fourth side surface 14D.

The first surface 12 and the second surface 13 are each formed in a quadrangular shape in plan view as viewed from their normal directions Z (hereinafter, referred to simply as "in plan view"). The first surface 12 is a connection surface (mounting surface) that faces a connection object when connected to the connection object. The second surface 13 is a non-connection surface (a non-mounting surface) positioned at an opposite side to the connection surface. A mount board (for example, PCB), an electronic component, a lead frame of a semiconductor package, or the like may be included in the connection object.

The first side surface 14A and the second side surface 14B extend in a first direction X in plan view, and face a second direction Y intersecting the first direction X. In detail, the second direction Y perpendicularly intersects the first direction X. The third side surface 14C and the fourth side surface 14D extend in the second direction Y in plan view, and face the first direction X. Each of the side surfaces 14A to 14D planarly extends along the normal direction Z. Each of the side surfaces 14A to 14D may be a ground surface that has a grinding mark.

The width in the first direction X of the device main body 11 may be not less than 1 mm and 5 mm. In this embodiment, the width in the first direction X of the device main body 11 is about 2 mm. The width in the second direction Y of the device main body 11 may be not less than 1 mm and 5 mm. In this embodiment, the width in the second direction Y of the device main body 11 is about 2 mm.

In detail, the device main body 11 has a laminated structure including a semiconductor layer 20 (semiconductor chip) and a wiring structure 21. The semiconductor layer 20 forms the second surface 13 and parts of the side surfaces 14A to 14D of the device main body 11. The wiring structure 21 forms the first surface 12 and parts of the side surfaces 14A to 14D of the device main body 11.

In this embodiment, the semiconductor layer 20 is made of silicon. The semiconductor layer 20 is formed in a rectangular parallelepiped shape. The semiconductor layer 20 includes a first main surface 22 at one side, a second main surface 23 at the other side, and side surfaces 24A, 24B, 24C and 24D that connect the first main surface 22 and the second main surface 23. In detail, the side surfaces 24A to 24D include the first side surface 24A, the second side surface 24B, the third side surface 24C and the fourth side surface 24D.

The first main surface 22 and the second main surface 23 are each formed in a quadrangular shape in plan view. The first main surface 22 may be a ground surface. The second main surface 23 forms the second surface 13 of the device main body 11. The side surfaces 24A to 24D form parts of the side surfaces 14A to 14D of the device main body 11, respectively.

The wiring structure 21 is formed on the first main surface 22. The wiring structure 21 includes a main surface 32 and side surfaces 34A, 34B, 34C and 34D. In detail, the side surfaces 34A to 34D include the first side surface 34A, the second side surface 34B, the third side surface 34C and the fourth side surface 34D.

The main surface 32 is formed in a quadrangular shape in plan view. The main surface 32 forms the first surface 12 of the device main body 11. The side surfaces 34A to 34D form parts of the side surfaces 14A to 14D of the device main body 11. The side surfaces 34A to 34D extend from a circumferential edge of the main surface 32 toward the semiconductor layer 20, and are continuous with the side surfaces 24A to 24D of the semiconductor layer 20. In detail, the side surfaces 34A to 34D are formed such as to be flush with the side surfaces 24A to 24D of the semiconductor layer 20.

The semiconductor device 1 has a plurality of external terminals formed at the main surface 32 of the wiring structure 21. The plurality of external terminals are terminal electrodes that are externally connected to the connection object, respectively. The plurality of external terminals include the base terminal 6, the gate terminal 7, the first source/drain terminal 8, and the second source/drain terminal 9. In this embodiment, the plurality of external terminals include the single base terminal 6, the single gate terminal 7, the plurality of first source/drain terminals 8 and the plurality of second source/drain terminals 9. The base terminal 6, the gate terminal 7, the first source/drain terminal 8, and the second source/drain terminal 9 are electrically independent of each other.

In this embodiment, the plurality of external terminals are arranged in a matrix pattern of 5 rows×5 columns with intervals between the external terminals in the first and second directions X and Y. In detail, the base terminal 6 is arranged at the first column of the third row. The gate terminal 7 is arranged at the fifth column of the third row. The gate terminal 7 faces the base terminal 6 in the second direction Y. The plurality of first source/drain terminals 8 are arranged at the first to fifth columns of the first row and at the first to fifth columns of the fourth row. The plurality of second source/drain terminals 9 are arranged at the first to fifth columns of the second row and at the first to fifth columns of the fifth row.

The plurality of second source/drain terminals 9 arranged at the second row face the plurality of first source/drain terminals 8 arranged at the first row in the first direction X in one-to-one correspondence. The plurality of second source/drain terminals 9 arranged at the fifth row face the plurality of first source/drain terminals 8 arranged at the fourth row in the first direction X in one-to-one correspondence.

In this embodiment, spaces are provided at the second column, the third column, and the fourth column of the third row, respectively. Any one among the base terminal 6, the gate terminal 7, the first source/drain terminal 8, and the second source/drain terminal 9 may be arranged in each of the spaces. A terminal electrically opened may be arranged in each of the spaces.

The number of and the arrangement of the base terminal 6, the gate terminal 7, the first source/drain terminal 8 and the second source/drain terminal 9 are arbitrary, and are not limited to the number and the arrangement shown in FIG. 2 and FIG. 3.

Figure 4:
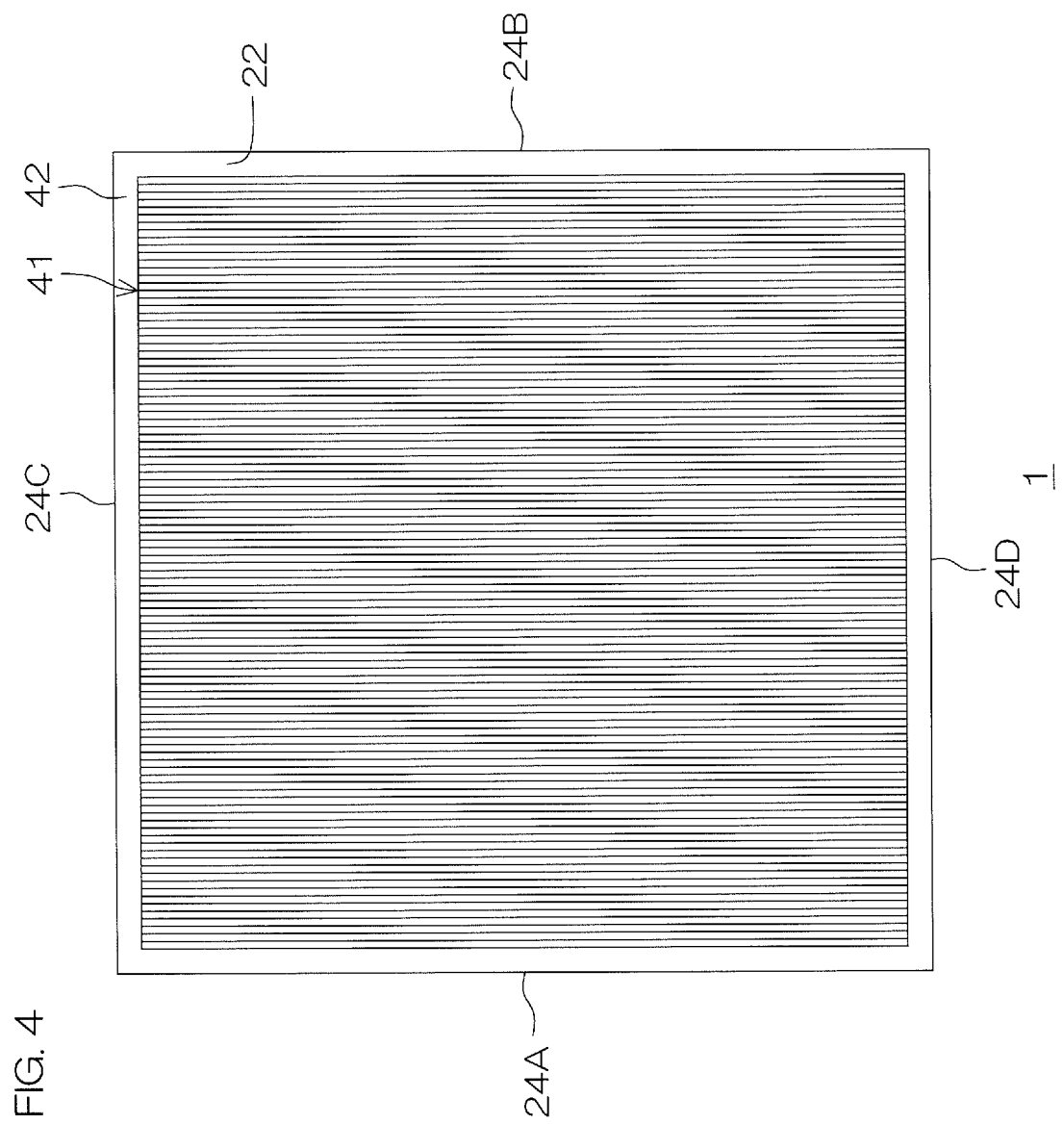
FIG. 4 is a plan view showing a structure of a first main surface of the semiconductor layer.
Figure 5:
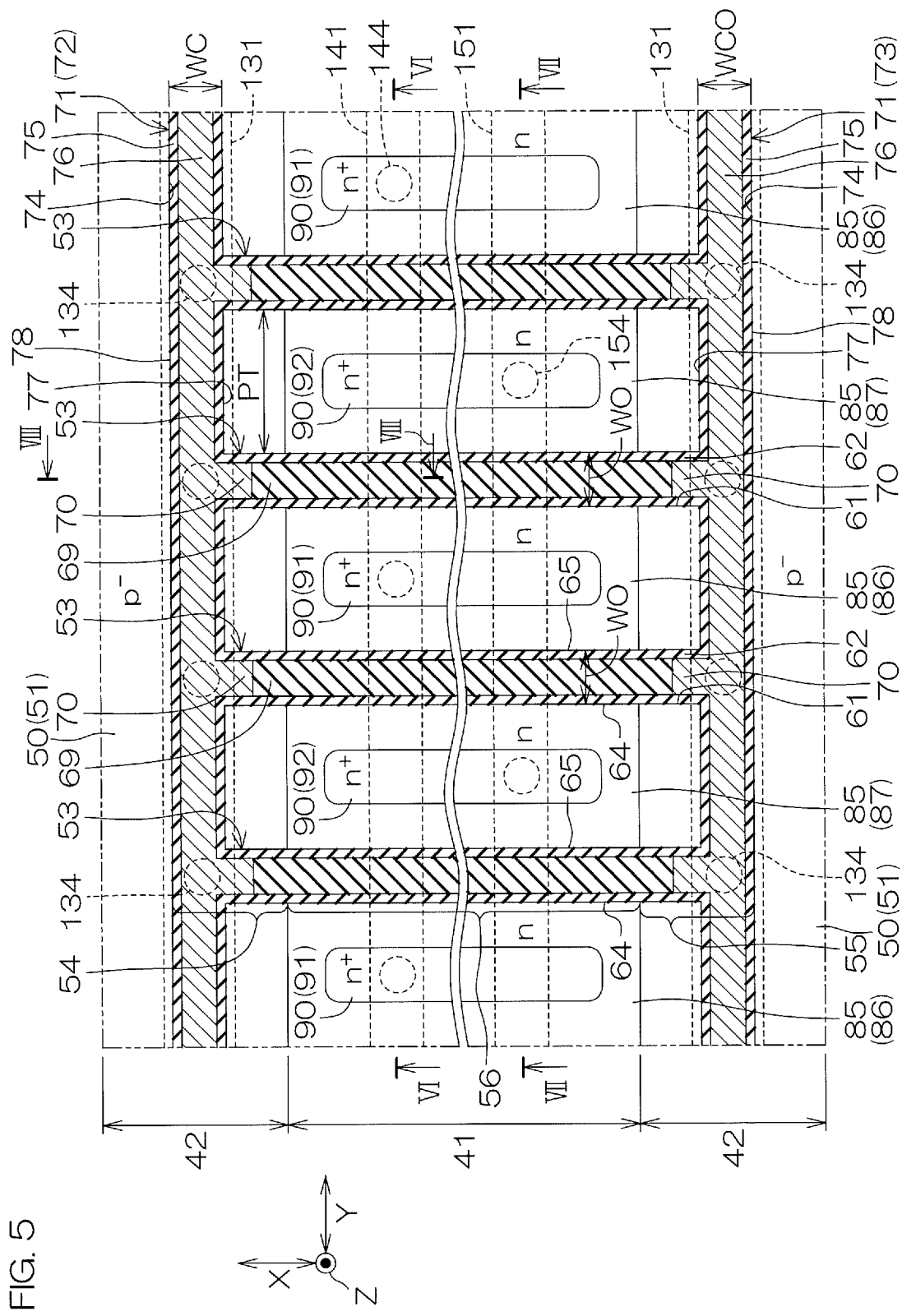
FIG. 5 is a partially enlarged plan view of a device region shown in FIG. 4.
Figure 6:
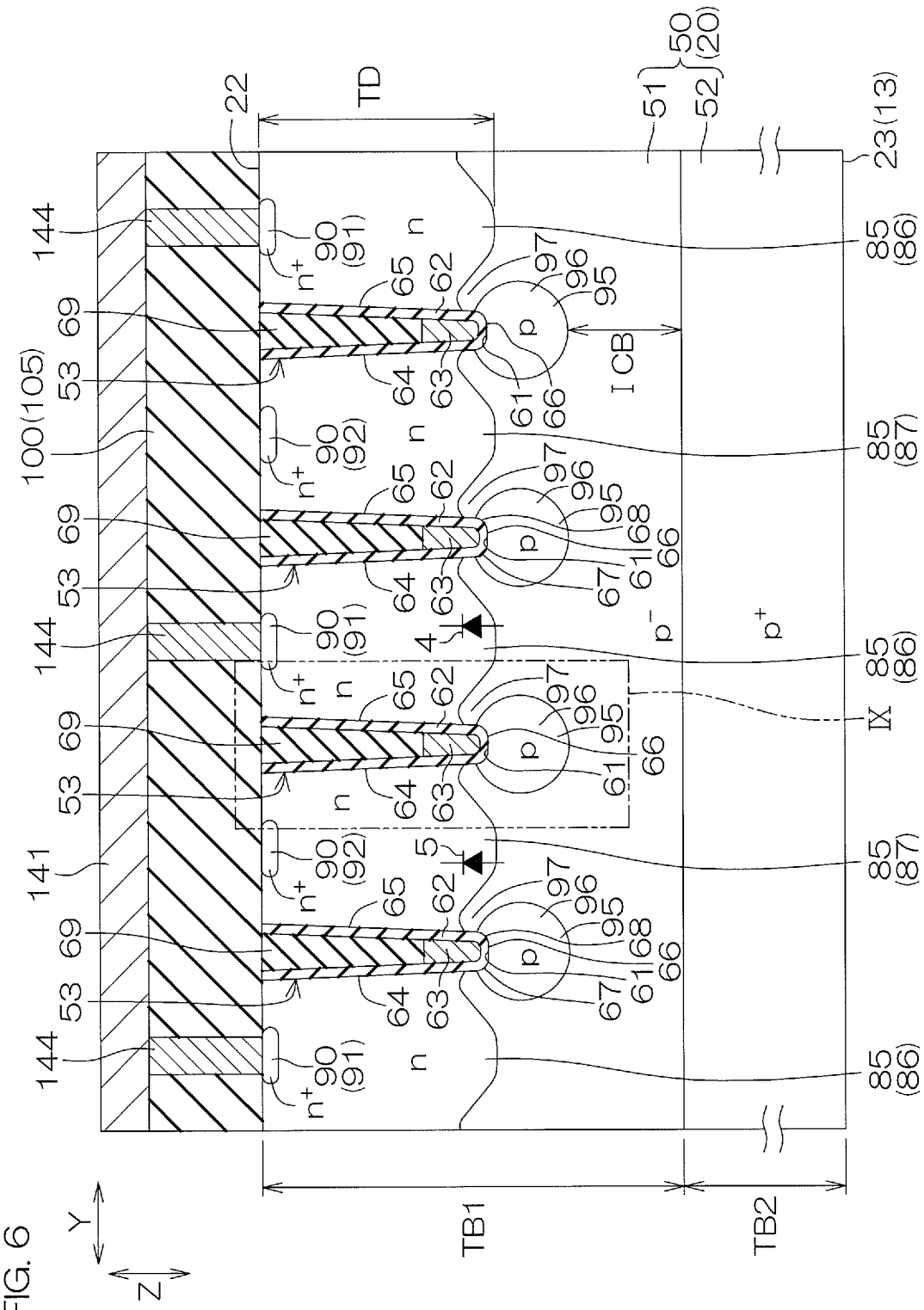
FIG. 6 is a cross-sectional view along line VI-VI shown in FIG. 5, showing a form including a drift region according to a first configuration example.
Figure 7:
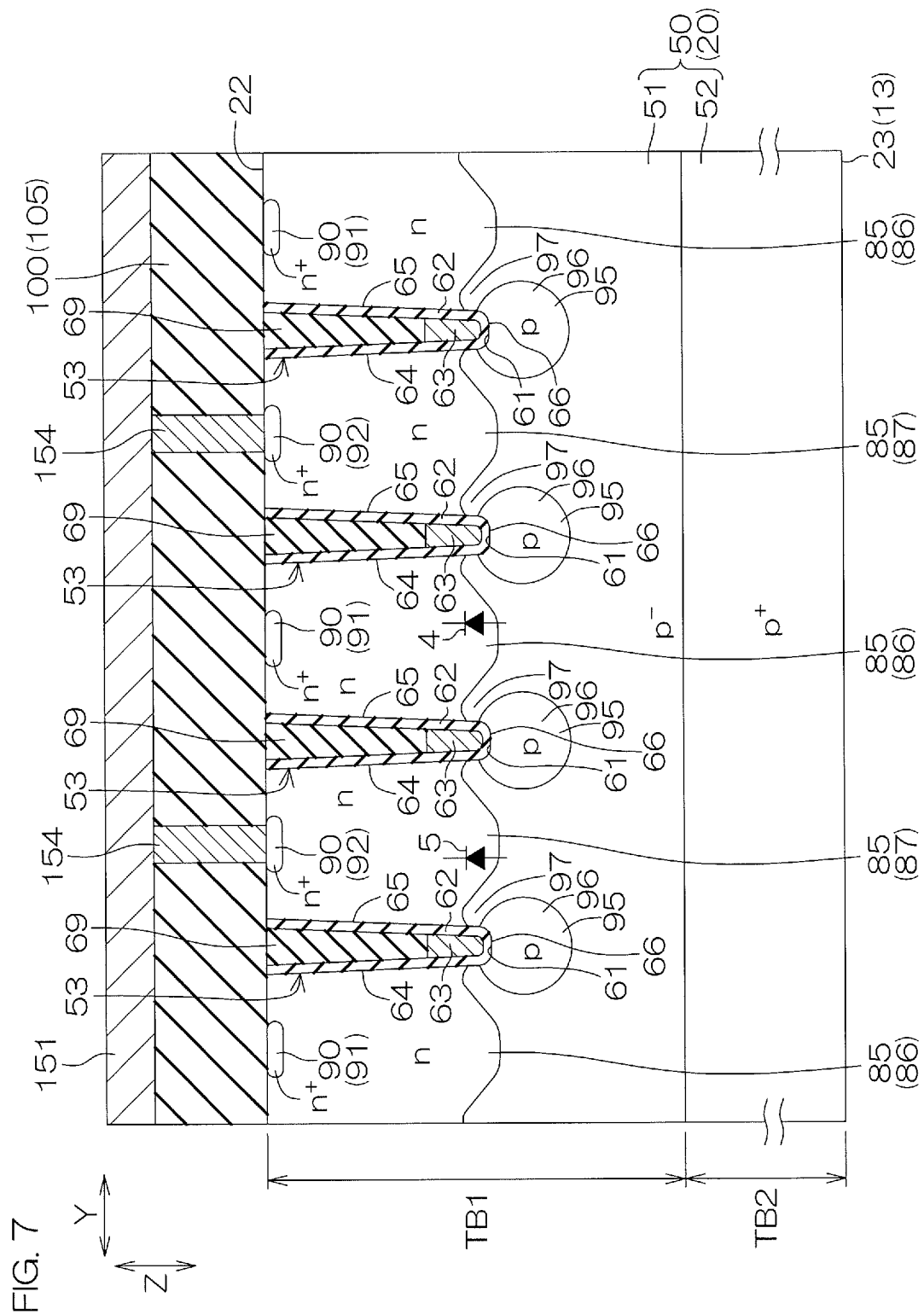
FIG. 7 is a cross-sectional view along line VII-VII shown in FIG. 5.
Figure 8:
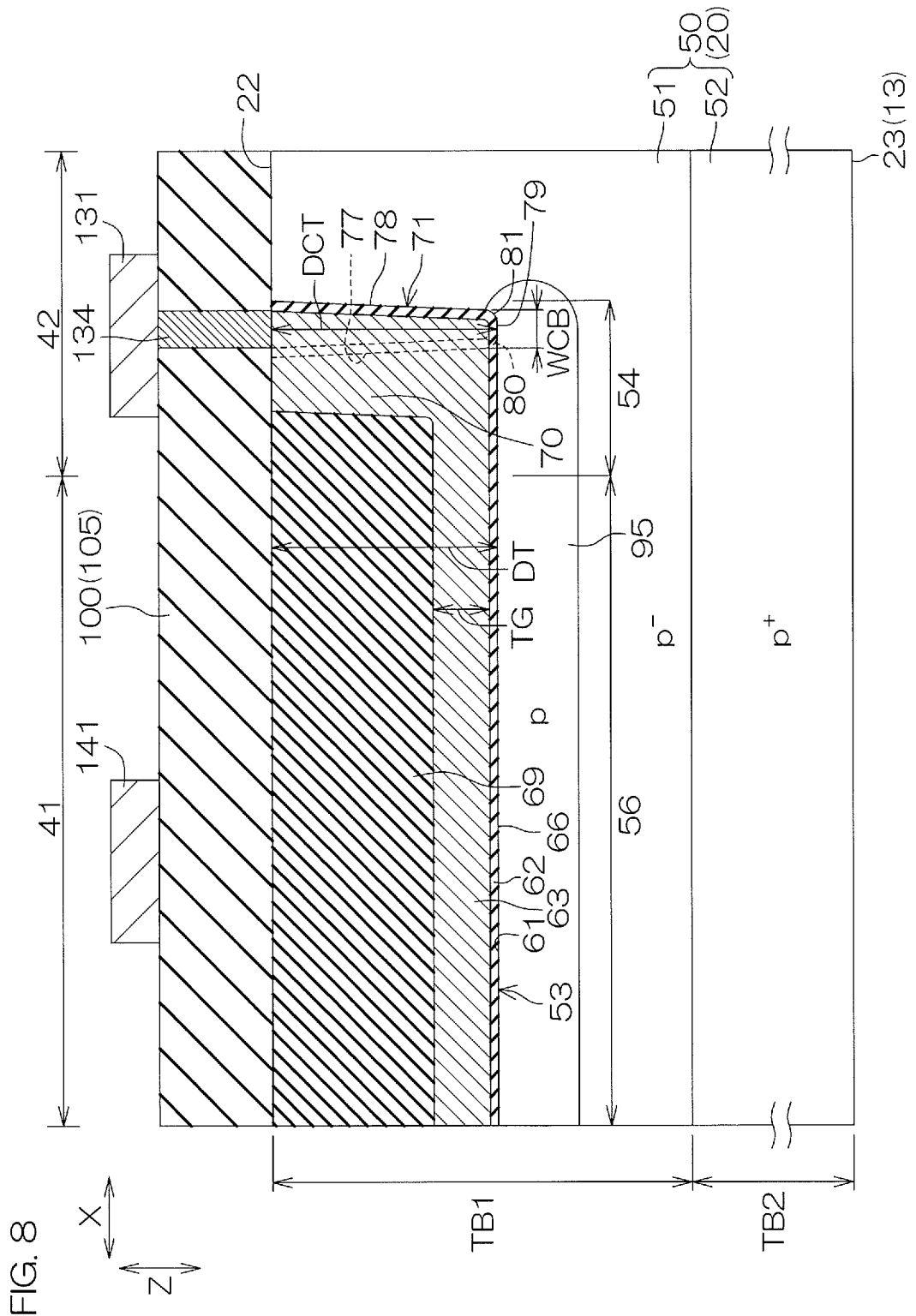
FIG. 8 is a cross-sectional view along line VIII-VIII shown in FIG. 5.
Figure 9:
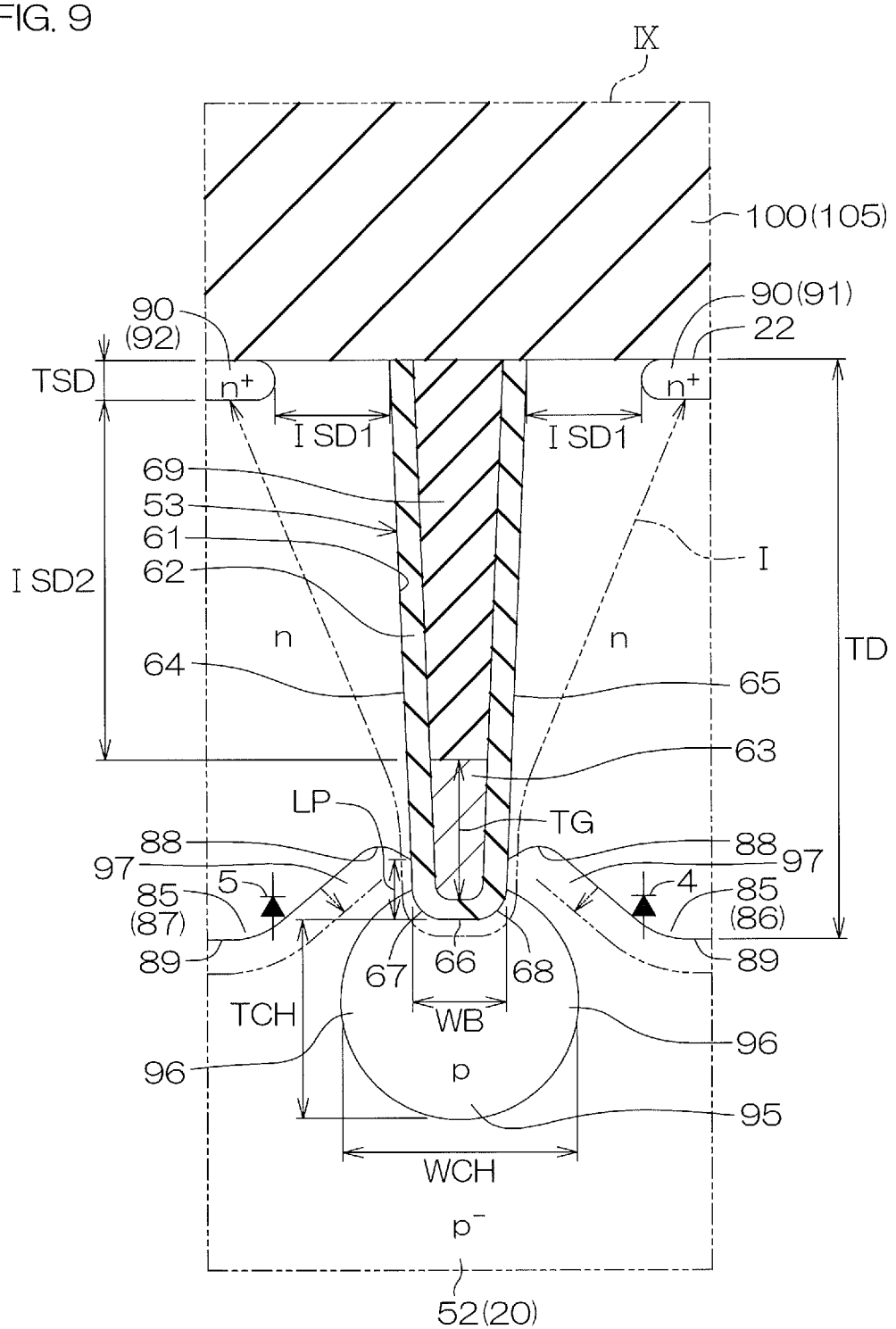
FIG. 9 is an enlarged view of a region IX shown in FIG. 6.

FIG. 4 is a plan view showing a structure of the first main surface 22 of the semiconductor layer 20. FIG. 5 is a partially enlarged plan view of a device region 41 shown in FIG. 4. FIG. 6 is a cross-sectional view along line VI-VI shown in FIG. 5, showing a form including a drift region 85 according to a first configuration example. FIG. 7 is a cross-sectional view along line VII-VII shown in FIG. 5. FIG. 8 is a cross-sectional view along line VIII-VIII shown in FIG. 5. FIG. 9 is an enlarged view of a region IX shown in FIG. 6.

Referring to FIG. 4, the semiconductor layer 20 includes a device region 41 and an outer region 42. The device region 41 may be referred to as an active region. The device region 41 is a region in which the MISFET 2 is formed. The device region 41 is formed inwardly with intervals from the side surfaces 24A to 24D of the semiconductor layer 20 in plan view.

In this embodiment, the device region 41 is formed in a quadrangular shape that has four sides parallel to the side surfaces 24A to 24D in plan view. The planar shape of the device region 41 is arbitrary, and is not limited to the quadrangular shape. The outer region 42 is a region outside the device region 41. The outer region 42 extends in a band shape along a circumferential edge of the device region 41 in plan view. In detail, the outer region is formed in an endless shape (in this embodiment, quadrangular ring shape) that surrounds the device region 41 in plan view.

Referring to FIG. 5 to FIG. 9, the semiconductor device 1 includes a p-type base region 50 formed at the semiconductor layer 20. The base region 50 forms the base B of the MISFET 2 (see FIG. 1). In this embodiment, the base region 50 is formed in the whole area of the semiconductor layer 20. The base region 50 has a concentration gradient in which a p-type impurity concentration at the first main surface 22 side becomes less than a p-type impurity concentration at the second main surface 23 side.

In detail, the base region 50 includes a p⁻-type low concentration base region 51 and a p⁺-type high concentration base region 52. The low concentration base region 51 is formed in a region at the first main surface 22 side, and is exposed from the first main surface 22 and from the side surfaces 24A to 24D. The p-type impurity concentration of the low concentration base region 51 may be not less than $5 \times 10^{14}$ cm⁻³ and not more than $5 \times 10^{16}$ cm⁻³. In this embodiment, the p-type impurity concentration of the low concentration base region 51 is about $8 \times 10^{15}$ cm⁻³. The low concentration base region 51 may include boron that is an example of the p-type impurity.

The low concentration base region 51 may have a thickness TB1 of not less than 2 μm and not more than 10 μm. The thickness TB1 may be not less than 2 μm and not more than 4 μm, not less than 4 μm and not more than 6 μm, not less than 6 μm and not more than 8 μm, or not less than 8 μm and not more than 10 μm. Preferably, the thickness TB1 is not less than 2 μm and not more than 5 μm.

The high concentration base region 52 has a p-type impurity concentration that exceeds the p-type impurity concentration of the low concentration base region 51. The high concentration base region 52 is formed in a region at the second main surface 23 side with respect to the low concentration base region 51, and is exposed from the second main surface 23 and from the side surfaces 24A to 24D. A boundary between the low concentration base region 51 and the high concentration base region 52 extends in parallel with the first main surface 22.

The p-type impurity concentration of the high concentration base region 52 may be not less than $5 \times 10^{18}$ cm⁻³ and not more than $5 \times 10^{20}$ cm⁻³. In this embodiment, the p-type impurity concentration of the high concentration base region 52 is about $2 \times 10^{19}$ cm⁻³. The high concentration base region 52 may include boron that is an example of the p-type impurity.

The high concentration base region 52 has a thickness TB2 (TB1<TB2) that exceeds the thickness TB1 of the low concentration base region 51. The thickness TB2 may be not less than 50 μm and not more than 500 μm. The thickness TB2 may be not less than 50 μm and not more than 100 μm, not less than 100 μm and not more than 150 μm, not less than 150 μm and not more than 200 μm, not less than 200 μm and not more than 250 μm, not less than 250 μm and not more than 300 μm, not less than 300 μm and not more than 350 μm, not less than 350 μm and not more than 400 μm, not less than 400 μm and not more than 450 μm, or not less than 450 μm and not more than 500 μm.

In this embodiment, the low concentration base region 51 is formed by a p⁻-type epitaxial layer. The base region 50 (low concentration base region 51) is exposed from the outer region 42. In this embodiment, the high concentration base region 52 is formed by a p⁺-type semiconductor substrate.

Referring to FIG. 5 to FIG. 9, the semiconductor device 1 includes a trench gate structure 53 formed in the device region 41. In FIG. 5, the trench gate structure 53 is shown by hatching. In this embodiment, a plurality of trench gate structures 53 are formed in the device region 41. The plurality of trench gate structures 53 are each formed in a band shape that extends in the first direction X in plan view, and are formed such as to have intervals between the trench gate structures 53 in the second direction Y. The plurality of trench gate structures 53 are formed in a stripe shape, as a whole, that extends in the first direction X in plan view.

The plurality of trench gate structures 53 may be formed with a pitch PT of not less than 0.01 μm and not more than 5 μm. The pitch PT is defined by a distance between two adjacent trench gate structures 53. The pitch PT may be not less than 0.01 μm and not more than 0.1 μm, not less than 0.1 μm and not more than 0.5 μm, not less than 0.5 μm and not more than 1 μm, not less than 1 μm and not more than 1.5 μm, not less than 1.5 μm and not more than 2 μm, not less than 2 μm and not more than 2.5 μm, not less than 2.5 μm and not more than 3 μm, not less than 3 μm and not more than 3.5 μm, not less than 3.5 μm and not more than 4 μm, not less than 4 µm and not more than 4.5 µm, or not less than 4.5 µm and not more than 5 µm.

The plurality of trench gate structures 53 each include a first contact portion 54, a second contact portion 55 and a device portion 56. The first contact portion 54 is positioned in the outer region 42 in plan view, and is formed by an end portion at one side in a longitudinal direction of a gate trench 61. The second contact portion 55 is positioned in the outer region 42 in plan view, and is formed by an end portion on an opposite side in the longitudinal direction of the gate trench 61. The device portion 56 is positioned in the device region 41, and extends in a band shape through a region between the first contact portion 54 and the second contact portion 55 in plan view.

The plurality of trench gate structures 53 each include a gate trench 61, a gate insulation layer 62, and a gate electrode 63. The gate trench 61 is formed in the first main surface 22. The gate trench 61 has a first sidewall 64 at one side, a second sidewall 65 at the other side and a bottom wall 66 that connects the first sidewall 64 and the second sidewall 65 together in a cross-sectional view.

The first sidewall 64, the second sidewall 65, and the bottom wall 66 are hereinafter collectively referred to as an "inner wall" if necessary. Also, the first contact portion 54, the second contact portion 55 and the device portion 56 of the trench gate structure 53 are, concurrently, the first contact portion 54, the second contact portion 55, and the device portion 56 of the gate trench 61.

The first sidewall 64, the second sidewall 65, and the bottom wall 66 are positioned in the low concentration base region 51. The first sidewall 64 and the second sidewall 65 extend in the normal direction Z. The bottom wall 66 extends in parallel with the first main surface 22. A first corner portion 67 that connects the first sidewall 64 and the bottom wall 66 is formed in a curved shape. A second corner portion 68 that connects the second sidewall 65 and the bottom wall 66 is formed in a curved shape. The bottom wall 66 may be formed in a curved shape toward the second main surface 23 as a whole.

The depth DT of the gate trench 61 may be not less than 0.5 µm and not more than 2 µm. The depth DT may be not less than 0.5 µm and not more than 1 µm, not less than 1 µm and not more than 1.5 µm, or not less than 1.5 µm and not more than 2 µm.

The opening width WO of the gate trench 61 may be not less than 0.1 µm and not more than 0.5 µm. The opening width WO is a width in a direction (second direction Y) perpendicular to a direction (first direction X) in which the gate trench 61 extends. The opening width WO may be not less than 0.1 µm and not more than 0.2 µm, not less than 0.2 µm and not more than 0.3 µm, not less than 0.3 µm and not more than 0.4 µm, or not less than 0.4 µm and not more than 0.5 µm. Preferably, the opening width WO is not less than 0.2 µm and not more than 0.3 µm.

Preferably, the opening width WO of the gate trench 61 is equal to or less than the depth DT of the gate trench 61. The aspect ratio DT/WO may be not less than 1 and not more than 20. The aspect ratio DT/WO is a ratio of the depth DT to the opening width WO. The aspect ratio DT/WO may be not less than 1 and not more than 2, not less than 2 and not more than 3, not less than 3 and not more than 4, not less than 4 and not more than 5, not less than 5 and not more than 6, not less than 6 and not more than 7, not less than 7 and not more than 8, not less than 8 and not more than 10, not less than 10 and not more than 12, not less than 12 and not more than 14, not less than 14 and not more than 16, not less than 16 and not more than 18, or not less than 18 and not more than 20. Preferably, the aspect ratio DT/WO is not less than 2 and not more than 5.

The width WB of the bottom wall 66 of the gate trench 61 may be not less than 0.1 µm and not more than 0.5 µm. The width WB of the bottom wall 66 may be not less than 0.1 µm and not more than 0.2 µm, not less than 0.2 µm and not more than 0.3 µm, not less than 0.3 µm and not more than 0.4 µm, or not less than 0.4 µm and not more than 0.5 µm. Preferably, the width WB is not less than 0.1 µm and not more than 0.3 µm.

The absolute value of an angle between the first sidewall 64 and the first main surface 22 in the semiconductor layer 20 may be not less than 90° and not more than 95° (for example, about 91°). The absolute value of an angle between the second sidewall 65 and the first main surfaces 22 in the semiconductor layer 20 may be not less than 90° and not more than 95° (for example about 91°). The gate trench 61 may be formed in a tapered shape in which the opening width becomes narrower from the first main surface 22 side toward the bottom wall 66 side in a cross-sectional view. Of course, the first sidewall 64 and the second sidewall 65 may be formed perpendicularly to the first main surface 22.

The gate insulation layer 62 is formed in a film shape on the inner wall of the gate trench 61. The gate insulation layer 62 is formed in the whole area of the inner wall of the gate trench 61. The gate insulation layer 62 defines a recessed space in the gate trench 61. The gate insulation layer 62 includes an exposed portion that is exposed from the first main surface 22. The exposed portion of the gate insulation layer 62 may be formed such as to be flush with the first main surface 22. The exposed portion of the gate insulation layer 62 may be a ground surface.

With respect to a normal direction of the inner wall of the gate trench 61, a thickness of the gate insulation layer 62 may be not less than 100 nm and not more than 1000 nm. The thickness of the gate insulation layer 62 may be not less than 100 nm and not more than 250 nm, not less than 250 nm and not more than 500 nm, not less than 500 nm and not more than 750 nm, or not less than 750 nm and not more than 1000 nm.

The gate insulation layer 62 includes at least one among silicon oxide ($SiO_2$), silicon nitride (SiN), aluminum oxide ($Al_2O_3$), zirconium oxide ($ZrO_2$), and tantalum oxide ($Ta_2O_3$). Preferably, the gate insulation layer 62 is made of silicon oxide.

The gate electrode 63 is embedded in the gate trench 61 with the gate insulation layer 62 between the gate electrode 63 and the gate trench 61. In detail, the gate electrode 63 is embedded in the recessed space defined by the gate insulation layer 62 in the gate trench 61. The gate electrode 63 is embedded in the device portion 56 of the gate trench 61.

The gate electrode 63 includes an upper end portion at the opening side and a lower end portion at the bottom wall 66 side. The upper end portion of the gate electrode 63 is positioned at the bottom wall 66 side with respect to the first main surface 22. In this embodiment, the upper end portion of the gate electrode 63 is positioned at the bottom wall 66 side with respect to an intermediate portion in a depth direction of the gate trench 61. Hence, in the gate trench 61, a recessed space is defined by the upper end portion of the gate electrode 63, the first sidewall 64 and the second sidewall 65. In this embodiment, the gate electrode 63 includes a portion led out to the first contact portion 54 from the device portion 56 and a portion led out to the second contact portion 55 from the device portion 56.

With respect to the depth direction of the gate trench 61, the thickness TG of the gate electrode 63 may be not less than 0.1 μm and not more than 0.5 μm. The thickness TG of the gate electrode 63 may be not less than 0.1 μm and not more than 0.2 μm, not less than 0.2 μm and not more than 0.3 μm, not less than 0.3 μm and not more than 0.4 μm, or not less than 0.4 μm and not more than 0.5 μm.

The gate electrode 63 may include at least one among conductive polysilicon, tungsten, aluminum, copper, an aluminum alloy, and a copper alloy. Preferably, the gate electrode 63 includes conductive polysilicon. The conductive polysilicon may be p-type polysilicon or n-type polysilicon. Preferably, the conductive polysilicon is n-type polysilicon.

The trench gate structure 53 further includes an embedded insulator 69 that is embedded in a region on the upper end portion of the gate electrode 63 in the gate trench 61. In detail, the embedded insulator 69 is embedded in the recessed space defined by the upper end portion of the gate electrode 63, the first sidewall 64 and the second sidewall 65 in the gate trench 61. The embedded insulator 69 is embedded in the gate trench 61 with the gate insulation layer 62 between the embedded insulator 69 and the gate trench 61.

The embedded insulator 69 is embedded in the device portion 56 of the gate trench 61. The embedded insulator 69 covers the whole area of the upper end portion of the gate electrode 63. In this embodiment, the embedded insulator 69 includes portions led out to the first contact portion 54 and to the second contact portion 55 from the device portion 56. The embedded insulator 69 includes an upper end portion at the opening side and a lower end portion at the bottom wall 66 side. The upper end portion of the embedded insulator 69 is formed such as to be flush with the first main surface 22. The upper end portion of the embedded insulator 69 may be a ground surface. The lower end portion of the embedded insulator 69 is contiguous to the upper end portion of the gate electrode 63.

The trench gate structure 53 further includes a gate contact electrode 70 embedded in the gate trench 61 with the gate insulation layer 62 between the gate contact electrode 70 and the gate trench 61. In this embodiment, a plurality of gate contact electrodes 70 are formed. The plurality of gate contact electrodes 70 are embedded in the first contact portion 54 and the second contact portion 55 of the gate trench 61, respectively. In detail, the plurality of gate contact electrodes 70 are embedded in the recessed spaces defined by the gate insulation layer 62 in the first contact portion 54 and the second contact portion 55, respectively.

Each of the gate contact electrodes 70 includes an upper end portion at the opening side and a lower end portion at the bottom wall 66 side. The upper end portion of each of the gate contact electrodes 70 is positioned at the first main surface 22 side with respect to the upper end portion of the gate electrode 63. The upper end portion of each of the gate contact electrodes 70 is formed such as to be flush with the upper end portion of the embedded insulator 69. The upper end portion of each of the gate contact electrodes 70 is formed such as to be flush with the first main surface 22. The upper end portion of each of the gate contact electrodes 70 may be a ground surface. The lower end portion of each of the gate contact electrodes 70 is electrically connected to the gate electrode 63 in the gate trench 61 (the first contact portion 54 and the second contact portion 55).

The gate contact electrode 70 may include at least one among conductive polysilicon, tungsten, aluminum, copper, an aluminum alloy, and a copper alloy. Preferably, the gate electrode 63 includes conductive polysilicon. The conductive polysilicon may be p-type polysilicon or n-type polysilicon. Preferably, the conductive polysilicon is n-type polysilicon. It is particularly preferable for the gate contact electrode 70 to include the same material as that of the gate electrode 63.

In this embodiment, the plurality of gate contact electrodes 70 include the same material as that of the gate electrode 63, and are formed integrally with the gate electrode 63. In other words, the plurality of gate contact electrodes 70 are each formed as a lead-out portion of the gate electrode 63, and are led out to the first contact portion 54 and the second contact portion 55 from the device portion 56, respectively.

Referring to FIG. 5 and FIG. 8, the semiconductor device 1 further includes a trench contact structure 71 formed in the outer region 42. The trench contact structure 71 is shown by hatching in FIG. 5. In this embodiment, a plurality of (in this embodiment, two) trench contact structures 71 are formed in the outer region 42. The plurality of trench contact structures 71 include a first trench contact 72 at one side and a second trench contact structure 73 at the other side.

The first trench contact 72 is formed in a region at one end portions (first contact portions 54) side of the plurality of trench gate structures 53 in the outer region 42. The first trench contact 72 extends in a band shape in a direction (second direction Y) intersecting a direction (first direction X) in which the plurality of trench gate structures 53 extend. The first trench contact 72 is connected to the one end portions of the plurality of trench gate structures 53.

The second trench contact structure 73 is formed in a region at the other end portions (second contact portions 55) side of the plurality of trench gate structures in the outer region 42. The second trench contact structure 73 extends in a band shape in a direction (second direction Y) intersecting a direction (first direction X) in which the plurality of trench gate structures 53 extend. The second trench contact structure 73 is connected to the other end portions of the plurality of trench gate structures 53.

The second trench contact structure 73 is identical in structure with the first trench contact 72. The first trench contact 72 will be hereinafter described as an example. In the second trench contact structure 73, the same reference sign is given to a constituent equivalent to each constituent of the first trench contact 72, and a description of the constituent is omitted.

The first trench contact 72 includes a contact trench 74, a contact insulation layer 75, and a contact electrode 76. The contact trench 74 is formed in the first main surface 22. The contact trench 74 includes a first sidewall 77 at one side, a second sidewall 78 at the other side and a bottom wall 79 that connects the first sidewall 77 and the second sidewall 78 in a cross-sectional view. The first sidewall 77 is a connection wall that is connected to the trench gate structure 53. The first sidewall 77, the second sidewall 78 and the bottom wall 79 are hereinafter collectively referred to as an "inner wall" if necessary.

The first sidewall 77, the second sidewall 78, and the bottom wall 79 are positioned in the low concentration base region 51. The first sidewall 77 and the second sidewall 78 extend in the normal direction Z. The bottom wall 66 extends in parallel with the first main surface 22. A first corner portion 80 (see a broken-line portion of FIG. 8) that connects the first sidewall 77 and the bottom wall 79 is formed in a curved shape. A second corner portion 81 that connects the second sidewall 78 and the bottom wall 79 is formed in a curved shape. The bottom wall 79 may be formed in a curved shape toward the second main surface 23 as a whole.

The depth DCT of the contact trench 74 may be not less than 0.5 µm and not more than 2 µm. The depth DCT may be not less than 0.5 µm and not more than 1 µm, not less than 1 µm and not more than 1.5 µm, or not less than 1.5 µm and not more than 2 µm. Preferably, the depth DCT is equal to the depth DT of the gate trench 61.

The opening width WCO of the contact trench 74 may be not less than 0.1 µm and not more than 0.5 µm. The opening width WCO is a width in a direction (first direction X) perpendicular to a direction (second direction Y) in which the contact trench 74 extends. The opening width WCO may be not less than 0.1 µm and not more than 0.2 µm, not less than 0.2 µm and not more than 0.3 µm, not less than 0.3 µm and not more than 0.4 µm, or not less than 0.4 µm and not more than 0.5 µm. Preferably, the opening width WCO is not less than 0.2 µm and not more than 0.3 µm. Preferably, the opening width WCO is equal to the opening width WO of the gate trench 61.

Preferably, the opening width WCO of the contact trench 74 is equal to or less than the depth DCT of the contact trench 74. The aspect ratio DCT/WCO may be not less than 1 and not more than 20. The aspect ratio DCT/WCO is a ratio of the depth DCT to the opening width WCO. The aspect ratio DCT/WCO may be not less than 1 and not more than 2, not less than 2 and not more than 3, not less than 3 and not more than 4, not less than 4 and not more than 5, not less than 5 and not more than 6, not less than 6 and not more than 7, not less than 7 and not more than 8, not less than 8 and not more than 10, not less than 10 and not more than 12, not less than 12 and not more than 14, not less than 14 and not more than 16, not less than 16 and not more than 18, or not less than 18 and not more than 20. Preferably, the aspect ratio DCT/WCO is not less than 2 and not more than 5.

The width WCB of the bottom wall 79 may be not less than 0.1 µm and not more than 0.5 µm. The width WCB may be not less than 0.1 µm and not more than 0.2 µm, not less than 0.2 µm and not more than 0.3 µm, not less than 0.3 µm and not more than 0.4 µm, or not less than 0.4 µm and not more than 0.5 µm. Preferably, the width WCB is not less than 0.1 µm and not more than 0.3 µm. Preferably, the width WCB is equal to the width WB of the bottom wall 66 of the gate trench 61.

In the semiconductor layer 20, the absolute value of an angle between the first sidewall 77 and the first main surface 22 may be not less than 90° and not more than 95° (for example, about 91°). In the semiconductor layer 20, the absolute value of an angle between the second sidewall 78 and the first main surface 22 may be not less than 90° and not more than 95° (for example about 91°). The contact trench 74 may be formed in a tapered shape in which the opening width becomes narrower from the first main surface 22 side toward the bottom-wall-79 side in a cross-sectional view. Of course, the first sidewall 77 and the second sidewall 78 may be formed perpendicularly to the first main surface 22.

The first sidewall 77 of the contact trench 74 leads to the first sidewall 64 and the second sidewall 65 of the gate trench 61. The contact trench 74 forms a single trench between the contact trench 74 and the gate trench 61. In this embodiment, the plurality of contact trenches 74 form a single ladder-shaped trench between the plurality of contact trenches 74 and the plurality of gate trenches 61 in plan view.

The contact insulation layer 75 is formed in a film shape along the inner wall of the contact trench 74. The contact insulation layer 75 defines a recessed space in the contact trench 74. The contact insulation layer 75 is connected to the gate insulation layer 62 in a leading portion between the gate trench 61 and the contact trench 74. The contact insulation layer 75 includes an exposed portion that is exposed from the first main surface 22. The exposed portion of the contact insulation layer 75 is formed such as to be flush with the first main surface 22. The exposed portion of the contact insulation layer 75 may be a ground surface.

With respect to a normal direction of the inner wall of the contact trench 74, a thickness of the contact insulation layer 75 may be not less than 100 nm and not more than 1000 nm. The thickness of the contact insulation layer 75 may be not less than 100 nm and not more than 250 nm, not less than 250 nm and not more than 500 nm, not less than 500 nm and not more than 750 nm, or not less than 750 nm and not more than 1000 nm. Preferably, the thickness of the contact insulation layer 75 is equal to the thickness of the gate insulation layer 62. The term that the thickness of the contact insulation layer 75 is equal to the thickness of the gate insulation layer 62 denotes that the contact insulation layer 75 and the gate insulation layer 62 are formed with a uniform thickness.

The contact insulation layer 75 includes at least one among silicon oxide ($SiO_2$), silicon nitride (SiN), aluminum oxide ($Al_2O_3$), zirconium oxide ($ZrO_2$), and tantalum oxide ($Ta_2O_3$). Preferably, the contact insulation layer 75 is made of silicon oxide. Preferably, the contact insulation layer 75 is made of the same material as that of the gate insulation layer 62.

The contact electrode 76 is embedded in the contact trench 74 with the contact insulation layer 75 between the contact electrode 76 and the contact trench 74. In detail, the contact electrode 76 is embedded in the recessed space defined by the contact insulation layer 75 in the contact trench 74. The contact electrode 76 is connected to the gate contact electrode 70 in the leading portion between the gate trench 61 and the contact trench 74. Hence, the contact electrode 76 is electrically connected to the gate electrode 63 through the gate contact electrode 70.

The contact electrode 76 includes an upper end portion at the opening side and a lower end portion at the bottom wall 66 side. The upper end portion of the contact electrode 76 is formed such as to be flush with the upper end portion of the gate contact electrode 70. The upper end portion of the contact electrode 76 is formed such as to be flush with the first main surface 22. The upper end portion of the contact electrode 76 may be a ground surface.

The contact electrode 76 may include at least one among conductive polysilicon, tungsten, aluminum, copper, an aluminum alloy, and a copper alloy. Preferably, the contact electrode 76 includes conductive polysilicon. The conductive polysilicon may be p-type polysilicon or n-type polysilicon. Preferably, the conductive polysilicon is n-type polysilicon. Preferably, the contact electrode 76 includes the same material as that of the gate electrode 63.

Referring to FIG. 5 to FIG. 9, the semiconductor device 1 includes a plurality of n-type drift regions 85 formed in a surface layer portion of the first main surface 22 of the semiconductor layer 20. The n-type impurity concentration of the plurality of drift regions 85 may be not less than $5 \times 10^{15}$ cm$^{-3}$ and not more than $5 \times 10^{16}$ cm$^{-3}$. In this embodiment, the n-type impurity concentration of the plurality of drift regions 85 is about $8 \times 10^{15}$ cm$^{-3}$. Preferably, the plurality of drift regions 85 include an n-type impurity whose diffusion coefficient is comparatively large. Preferably, the plurality of drift regions 85 include phosphorus that is an example of the n-type impurity whose diffusion coefficient is comparatively large.

The plurality of drift regions 85 are formed in the low concentration base region 51 in the surface layer portion of the first main surface 22. The plurality of drift regions 85 are formed in a region at the first sidewall 64 side and a region at the second sidewall 65 side of the plurality of gate trenches 61, respectively, and face each other with the gate trench 61 between the drift regions 85. The plurality of drift regions 85 are each formed in a band shape that extends in a direction (first direction X) in which the gate trench 61 extends in plan view.

The plurality of drift regions 85 cover the device portions 56 of the plurality of gate trenches 61, and expose the first contact portions 54 and the second contact portions 55 of the plurality of gate trenches 61. The device region 41 is defined by the plurality of drift regions 85 and by the device portion 56 of the gate trench 61.

The plurality of drift regions 85 are formed at the first main surface 22 side with respect to the bottom walls 66 of the plurality of gate trenches 61. In other words, the plurality of drift regions 85 expose the bottom walls 66 of the plurality of gate trenches 61.

In detail, the plurality of drift regions 85 are formed in a region at the first main surface 22 side with respect to the lower end portion of the gate electrode 63. The plurality of drift regions 85 expose part of the first sidewalls 64, part of the second sidewalls 65, and the bottom walls 66 of the plurality of gate trenches 61. The plurality of drift regions 85 face the gate electrode 63 and the embedded insulator 69 with the gate insulation layer 62 between the drift region 85 and both of the gate electrode 63 and the embedded insulator 69.

The plurality of drift regions 85 are electrically divided into a first drift region 86 for the first source drain SD1 and a second drift region 87 for the second source drain SD2 by the plurality of gate trenches 61. The first drift region 86 and the second drift region 87 are formed alternately in the second direction Y in a manner in which the single gate trench 61 is sandwiched between the first drift region 86 and the second drift region 87.

In this embodiment, the plurality of drift regions 85 are formed at a distance from the gate contact electrode 70. In other words, the plurality of drift regions 85 do not face the gate contact electrode 70 with the gate insulation layer 62 between the drift region 85 and the gate contact electrode 70. The gate contact electrode 70 faces the low concentration base region 51 with the gate insulation layer 62 between the gate contact electrode 70 and the low concentration base region 51. This makes it possible to suppress a leakage current in the outer region 42 (i.e., a leakage current caused by the gate contact electrode 70).

Referring to FIG. 9, the plurality of drift regions 85 each include a connection region 88 and an inward region 89. The connection region 88 is connected to the gate trench 61 in a region at the first main surface 22 side with respect to the bottom wall 66 of the gate trench 61. In detail, the connection region 88 is connected to the gate trench 61 in a region at the first main surface 22 side with respect to the lower end portion of the gate electrode 63. A bottom portion of the connection region 88 is positioned in a region between the upper end portion and the lower end portion of the gate electrode 63 with respect to a thickness direction of the semiconductor layer 20.

The inward region 89 is positioned beside the gate trench 61, and is positioned in a region at the bottom wall 66 side of the gate trench 61 with respect to the connection region 88. In this embodiment, a bottom portion of the inward region 89 is positioned in a region below the bottom wall 66 of the gate trench 61 (a region at the second main surface 23 side) with respect to the thickness direction of the semiconductor layer 20.

The thickness TD of each of the drift regions 85 may be not less than 0.4 μm and not more than 2 μm under the condition that the bottom wall 66 of the gate trench 61 is exposed. The thickness TD is defined by a distance between the first main surface 22 and a deepest portion of the drift region 85. The thickness TD may be not less than 0.4 μm and not more than 0.6 μm, not less than 0.6 μm and not more than 0.8 μm, not less than 0.8 μm and not more than 1 μm, not less than 1 μm and not more than 1.2 μm, not less than 1.2 μm and not more than 1.4 μm, not less than 1.4 μm and not more than 1.6 μm, not less than 1.6 μm and not more than 1.8 μm, or not less than 1.8 μm and not more than 2 μm.

The protrusion length LP of the gate trench 61 may be not less than 0.01 μm and not more than 0.1 μm. The protrusion length LP is the length of a part, which is exposed from the plurality of drift regions 85, of the gate trench 61 with respect to the thickness direction of the semiconductor layer 20. The protrusion length LP may be not less than 0.01 μm and not more than 0.02 μm, not less than 0.02 μm and not more than 0.04 μm, not less than 0.04 μm and not more than 0.06 μm, not less than 0.06 μm and not more than 0.08 μm, or not less than 0.08 μm and not more than 0.1 μm. Preferably, the protrusion length LP is not less than 0.02 μm and not more than 0.06 μm.

The plurality of drift regions 85 each form a pn-junction portion with the low concentration base region 51. A depletion layer (see the alternate long and two short dashed line of FIG. 9) spreads from the pn-junction portion. The first body diode 4 and the second body diode 5 of the MISFET 2 are formed by the pn-junction portion (see FIG. 1). The first body diode 4 and the second body diode 5 form the series circuit 3 of the MISFET 2 (see FIG. 1).

The first body diode 4 includes a pn-junction portion between the first drift region 86 and the low concentration base region 51. The first body diode 4 includes the low concentration base region 51 serving as the anode and the first drift region 86 serving as the cathode. The second body diode 5 includes a pn-junction portion between the second drift region 87 and the low concentration base region 51. The second body diode 5 includes the low concentration base region 51 serving as the anode and the second drift region 87 serving as the cathode. The second body diode 5 is reverse-biased and connected to the first body diode 4 through the low concentration base region 51.

Figure 10C:
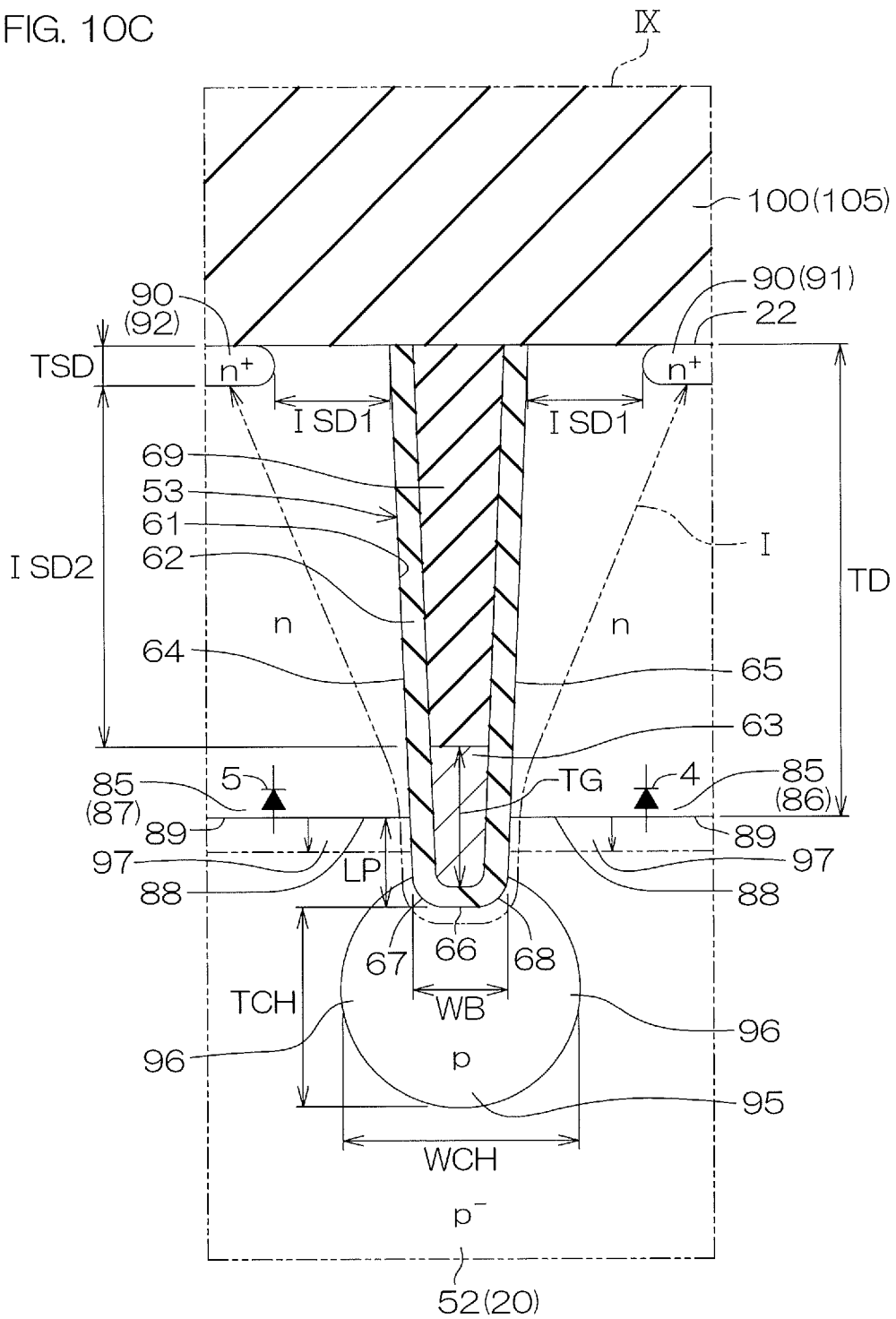
FIG. 10C is an enlarged view of a region corresponding to FIG. 9, showing a form including a drift region according to a fourth configuration example.

The plurality of drift regions 85 may have forms shown in FIG. 10A to FIG. 10C.

FIG. 10A is an enlarged view of a region corresponding to FIG. 9, showing a drift region 85 according to a second configuration example. The same reference sign is hereinafter given to a structure corresponding to each structure other than the plurality of drift regions 85, and a description of this structure is omitted.

Referring to FIG. 10A, the plurality of drift regions 85 each include the connection region 88 and the inward region 89. The connection region 88 is connected to the gate trench 61 in a region at the first main surface 22 side with respect to the bottom wall 66 of the gate trench 61 (lower end portion of the gate electrode 63). The bottom portion of the connection region 88 is positioned in a region between the upper end portion and the lower end portion of the gate electrode 63.

The inward region 89 is positioned beside the gate trench 61, and is positioned in a region at the bottom wall 66 side of the gate trench 61 with respect to the connection region 88. In this embodiment, the bottom portion of the inward region 89 is formed in a region at the first main surface 22 side with respect to the bottom wall 66 of the gate trench 61. The bottom portion of the inward region 89 may be positioned in a region between the bottom wall 66 of the gate trench 61 and the bottom portion of the connection region 88 with respect to the thickness direction of the semiconductor layer 20.

FIG. 10B is an enlarged view of a region corresponding to FIG. 9, showing a drift region 85 according to a third configuration example. The same reference sign is hereinafter given to a structure corresponding to each structure other than the plurality of drift regions 85, and a description of this structure is omitted.

Referring to FIG. 10B, the plurality of drift regions 85 each include the connection region 88 and the inward region 89. The connection region 88 is connected to the gate trench 61 in a region at the first main surface 22 side with respect to the bottom wall 66 of the gate trench 61 (lower end portion of the gate electrode 63). The bottom portion of the connection region 88 is positioned in a region between the upper end portion and the lower end portion of the gate electrode 63.

The inward region 89 is positioned beside the gate trench 61, and is formed in a region at the first main surface 22 side with respect to the bottom portion of the connection region 88. The bottom portion of the inward region 89 is positioned in a region between the first main surface 22 and the bottom portion of the connection region with respect to the thickness direction of the semiconductor layer 20. The bottom portion of the inward region 89 may be positioned in a region between the first main surface 22 and the upper end portion of the gate electrode 63 with respect to the thickness direction of the semiconductor layer 20. The bottom portion of the inward region 89 may be positioned in a region between the upper end portion of the gate electrode 63 and the bottom portion of the connection region 88 with respect to the thickness direction of the semiconductor layer 20.

FIG. 10C is an enlarged view of a region corresponding to FIG. 9, showing a drift region 85 according to a fourth configuration example. The same reference sign is hereinafter given to a structure corresponding to each structure other than the plurality of drift regions 85, and a description of this structure is omitted.

Referring to FIG. 10C, the plurality of drift regions 85 each include the connection region 88 and the inward region 89. In this embodiment, the connection region 88 and the inward region 89 are each formed with a uniform depth. In other words, the plurality of drift regions 85 are each formed with a uniform depth. The bottom portion of the plurality of drift regions 85 is positioned in a region between the upper end portion and the lower end portion of the gate electrode 63 with respect to the thickness direction of the semiconductor layer 20.

Referring again to FIG. 6 to FIG. 9, the semiconductor device 1 further includes a plurality of n$^+$-type source/drain regions 90 formed at the surface layer portions of the plurality of drift regions 85, respectively. Each of the plurality of source/drain regions 90 is a region in which a source region and a drain region are formed integrally with each other. The plurality of source/drain regions 90 have an n-type impurity concentration that exceeds the n-type impurity concentration of the plurality of drift regions 85. The n-type impurity concentration of the source/drain regions 90 may be not less than $5\times10^{18}$ cm$^{-3}$ and not more than $5\times10^{20}$ cm$^{-3}$. In this embodiment, the n-type impurity concentration of the plurality of source/drain regions 90 is about $5\times10^{19}$ cm$^{-3}$.

The plurality of source/drain regions 90 include an n-type impurity that differs from the n-type impurity of the drift region 85. In detail, preferably, the plurality of source/drain regions 90 include an n-type impurity that has a diffusion coefficient less than the diffusion coefficient of the n-type impurity of the drift region 85. Preferably, the plurality of source/drain regions 90 include arsenic that is an example of the n-type impurity whose diffusion coefficient is comparatively small.

The plurality of source/drain regions 90 include a first source/drain region 91 and a second source/drain region 92. The first source/drain region 91 is formed in the first drift region 86. The second source/drain region 92 is formed in the second drift region 87. The first source/drain region 91 and the second source/drain region 92 form the first source drain SD1 and the second source drain SD2 of the MISFET 2 (see FIG. 1).

The plurality of source/drain regions 90 are each formed in a band shape that extends in a direction (i.e., first direction X) in which the trench gate structure 53 extends in plan view, and are formed with intervals between the source/drain regions 90 in a direction (i.e., second direction Y) that intersects the trench gate structure 53. The plurality of source/drain regions 90 are formed in a stripe shape as a whole in plan view. Hence, the plurality of source/drain regions 90 are formed alternately with the trench gate structures 53 in a manner in which the single trench gate structure 53 is sandwiched between the plurality of source/drain regions 90 in plan view.

The plurality of source/drain regions 90 are formed at a distance ISD1 from the plurality of trench gate structures 53 in a direction along the first main surface 22. The distance ISD1 may be not less than 5 nm and not more than 1000 nm. The distance ISD1 may be not less than 5 nm and not more than 10 nm, not less than 10 nm and not more than 50 nm, not less than 50 nm and not more than 100 nm, not less than 100 nm and not more than 150 nm, not less than 150 nm and not more than 200 nm, not less than 200 nm and not more than 300 nm, not less than 300 nm and not more than 400 nm, not less than 400 nm and not more than 600 nm, not less than 600 nm and not more than 800 nm, or not less than 800 nm and not more than 1000 nm.

Preferably, the plurality of source/drain regions 90 are each formed at a central portion between two adjacent trench gate structures 53 in plan view. The plurality of source/drain regions 90 are formed in a region at the first main surface 22 side with respect to the upper end portion of the gate electrode 63. In detail, the bottom portion of the plurality of source/drain regions 90 is formed in a region at the first main surface 22 side with respect to the upper end portion of the gate electrode 63.

The plurality of source/drain regions 90 are formed at a distance from the gate electrode 63 with respect to the thickness direction of the semiconductor layer 20. The plurality of source/drain regions 90 face each other with the embedded insulator 69 between the source/drain regions 90 in a direction (in detail, second direction Y) along the first main surface 22. The plurality of source/drain regions 90 do not face the gate contact electrode 70 with respect to the direction (in detail, second direction Y) along the first main surface 22. The source/drain regions 90 face only the embedded insulator 69 with respect to the direction (in detail, second direction Y) along the first main surface 22.

The thickness TSD of each of the source/drain regions 90 may be not less than 10 nm and not more than 150 nm. The thickness TSD may be not less than 10 nm and not more than 25 nm, not less than 25 nm and not more than 50 nm, not less than 50 nm and not more than 75 nm, not less than 75 nm and not more than 100 nm, not less than 100 nm and not more than 125 nm, or not less than 125 nm and not more than 150 nm. Preferably, the thickness TSD is not less than 50 nm and not more than 100 nm.

The plurality of source/drain regions 90 are formed at a distance ISD2 from the upper end portion of the gate electrode 63 with respect to the thickness direction of the semiconductor layer 20. The distance ISD2 may be not less than 0.1 μm and not more than 1.5 μm. The distance ISD2 may be not less than 0.1 μm and not more than 0.25 μm, not less than 0.25 μm and not more than 0.5 μm, not less than 0.5 μm and not more than 0.75 μm, not less than 0.75 μm and not more than 1 μm, not less than 1 μm and not more than 1.25 μm, or not less than 1.25 μm and not more than 1.5 μm. Preferably, the distance ISD2 is equal to or more than 0.5 μm.

The plurality of source/drain regions 90 are away from the gate electrode 63 in the direction (in detail, second direction Y) along the first main surface 22. Also, the plurality of the source/drain regions 90 are away from the upper end portion of the gate electrode 63 in the thickness direction (normal direction Z) of the semiconductor layer 20. This makes it possible to reduce electric field strength between the gate electrode 63 and each of the source/drain regions 90, and makes it possible to suppress electric-field concentration to the trench gate structure 53 (in detail, gate electrode 63). As a result, it possible to suppress a reduction in a withstand voltage of the semiconductor device 1 resulting from such electric-field concentration.

Also, the plurality of source/drain regions 90 face the embedded insulator 69 in the direction along the first main surface 22. This makes it possible to appropriately reduce electric-field concentration to the trench gate structure 53. Also, this makes it possible to appropriately improve the dielectric withstand voltage of the trench gate structure 53.

Also, the plurality of source/drain regions 90 include the n-type impurity that has the comparatively small diffusion coefficient (in this embodiment, arsenic). This makes it possible to suppress undesirable diffusion of the n-type impurity, hence making it possible to appropriately form the plurality of source/drain regions 90 in desired regions. Therefore, it is possible to appropriately keep the plurality of source/drain regions 90 away from the gate electrode 63. As a result, it is possible to appropriately suppress undesirable electric-field concentration to the trench gate structure 53 (in detail, gate electrode 63).

Referring again to FIG. 6 to FIG. 9, the semiconductor device 1 further includes a p$^+$-type high concentration channel region 95 that is formed in a region along the bottom wall 66 of the gate trench 61 in the semiconductor layer 20. The high concentration channel region 95 has a p-type impurity concentration that exceeds the p-type impurity concentration of the low concentration base region 51. The p-type impurity concentration of the high concentration channel region 95 may be equal to or less than the p-type impurity concentration of the high concentration base region 52. The p-type impurity concentration of the high concentration channel region 95 may be less than the p-type impurity concentration of the high concentration base region 52.

The p-type impurity concentration of the high concentration channel region 95 may be not less than $5\times10^{16}$ cm$^{-3}$ and not more than $5\times10^{18}$ cm$^{-3}$. In this embodiment, the p-type impurity concentration of the high concentration channel region 95 is about $1\times10^{17}$ cm$^{-3}$. The high concentration channel region 95 may include boron that is a p-type impurity.

The high concentration channel region 95 faces the gate electrode 63 with the gate insulation layer 62 between the high concentration channel region 95 and the gate electrode 63. In detail, the high concentration channel region 95 is formed in a region at the second main surface 23 side with respect to the bottom portion of the plurality of drift regions 85, and faces the lower end portion of the gate electrode 63 with the gate insulation layer 62 between the high concentration channel region 95 and the lower end portion of the gate electrode 63. The high concentration channel region 95 forms a channel of the MISFET 2 in a region along the bottom wall 66 of the gate trench 61.

The high concentration channel region 95 is formed in a band shape that extends along the bottom wall 66 of the gate trench 61 in plan view. The high concentration channel region 95 may cover the first corner portion 67 and the second corner portion 68 of the gate trench 61. The high concentration channel region 95 may cover a part of the first sidewall 64 and a part of the second sidewall 65 through the first corner portion 67 and the second corner portion 68.

The bottom portion of the high concentration channel region 95 is positioned at the bottom wall 66 side of the gate trench 61 with respect to the bottom portion of the low concentration base region 51. A distance ICB between the bottom portion of the high concentration channel region 95 and the bottom portion of the low concentration base region 51 may be not less than 0.1 μm and not more than 2 μm. The distance ICB may be not less than 0.1 μm and not more than 0.5 μm, not less than 0.5 μm and not more than 1 μm, not less than 1 μm and not more than 1.5 μm, or not less than 1.5 μm and not more than 2 μm. Preferably, the distance ICB is not less than 1 μm and not more than 2 μm.

The thickness TCH of the high concentration channel region 95 may exceed 0 μm, and be equal to or less than 0.5 μm. The thickness TCH is defined by a distance between the bottom wall 66 of the gate trench 61 and the bottom portion of the high concentration channel region 95. The thickness TCH may be more than 0 μm and not more than 0.1 μm, not less than 0.1 μm and not more than 0.2 μm, not less than 0.2 μm and not more than 0.3 μm, not less than 0.3 μm and not more than 0.4 μm, or not less than 0.4 μm and not more than 0.5 μm. Preferably, the thickness TCH is not less than 0.1 μm and not more than 0.3 μm.

In this embodiment, the high concentration channel region 95 includes a bulging portion 96 that projects from the bottom wall 66 of the gate trench 61 in a direction along the first main surface 22. If the gate trench 61 is formed in a tapered shape, the bulging portion 96 of the high concentration channel region 95 faces the first sidewall 64 and the second sidewall 65 of the gate trench 61 in the thickness direction of the semiconductor layer 20.

The width WCH of the high concentration channel region 95 exceeds the width WB of the bottom wall 66 of the gate trench 61 (WB<WCH). The width WCH is defined by the width of a most bulged region in the direction along the first main surface 22 (in this embodiment, bulging portion 96) in the high concentration channel region 95 with respect to the second direction Y. The width WCH may exceed the opening width WO of the gate trench 61 (WO<WCH). The width WCH may be not less than 0.1 μm and not more than 0.5 μm. The width WCH may be not less than 0.1 μm and not more than 0.2 μm, not less than 0.2 μm and not more than 0.3 μm, not less than 0.3 μm and not more than 0.4 μm, or not less than 0.4 μm and not more than 0.5 μm.

With this embodiment, an example where the high concentration channel region 95 includes the bulging portion 96. However, the high concentration channel region 95 may be formed only in a region along the bottom wall 66 of the gate trench 61 without having the bulging portion 96 was described. In this case, the high concentration channel region 95 may be formed in a film shape in the region along the bottom wall 66 of the gate trench 61. Also, in this case, the width WCH of the high concentration channel region 95 may be equal to the width WB of the bottom wall 66 of the gate trench 61 (WCH=WB).

In this embodiment, the high concentration channel region 95 is formed in a part along the bottom wall 66 of the gate trench 61 at a distance from the plurality of drift regions 85. A region of a part of the high concentration channel region 95 (in this embodiment, bulging portion 96) faces the plurality of drift regions 85 with respect to the thickness direction of the semiconductor layer 20. In detail, the region of the part of the high concentration channel region 95 (in this embodiment, bulging portion 96) faces at least the connection region 88 of the plurality of drift regions 85 with respect to the thickness direction of the semiconductor layer 20.

The high concentration channel region 95 forms the channel of the MISFET 2, and, concurrently, functions as a channel stopper. The high concentration channel region 95 prevents depletion layers that spread from the plurality of drift regions 85 from overlapping each other in the region along the bottom wall 66 of the gate trench 61 in the semiconductor layer 20. This makes it possible to suppress the punch-through of the plurality of drift regions 85. Therefore, it is possible to suppress a reduction in the withstand voltage of the semiconductor device 1 resulting from the punch-through.

Referring to FIG. 6 to FIG. 9, the semiconductor device 1 further includes a p⁻-type low concentration channel region 97 interposed in a region between the plurality of drift regions 85 and the high concentration channel region 95 in the semiconductor layer 20. The low concentration channel region 97 is formed in a region between the drift region 85 and the high concentration channel region 95 in a region along the gate trench 61. The low concentration channel region 97 forms the channel of the MISFET 2 with the high concentration channel region 95 in the region along the gate trench 61. In this embodiment, the low concentration channel region 97 forms a channel in a region along the first and second sidewalls 64 and 65.

The low concentration channel region 97 has a p-type impurity concentration less than the p-type impurity concentration of the high concentration channel region 95. The p-type impurity concentration of the low concentration channel region 97 may be not less than $5\times10^{14}$ cm$^{-3}$ and not more than $5\times10^{16}$ cm$^{-3}$. In this embodiment, the p-type impurity concentration of the low concentration channel region 97 is about $8\times10^{15}$ cm$^{-3}$. In this embodiment, the low concentration channel region 97 is formed by a region of a part of the low concentration base region 51. The low concentration channel region 97 may have a p-type impurity concentration equal to or more than the p-type impurity concentration of the low concentration base region 51 by including a p-type impurity that has diffused from the high concentration channel region 95.

The low concentration channel region 97 allows a depletion layer to spread from the plurality of drift regions 85. This makes it possible to obtain the withstand voltage retention effect brought about by the depletion layer. In other words, the high concentration channel region 95 restricts the depletion layer spreading from the plurality of drift regions 85, whereas the low concentration channel region 97 allows the depletion layer spreading from the plurality of drift regions 85. A structure formed by combining these characteristics together makes it possible to simultaneously realize both a suppression effect of a reduction in the withstand voltage caused by punch-through and the withstand voltage retention effect brought about by the depletion layer.

Figure 11:
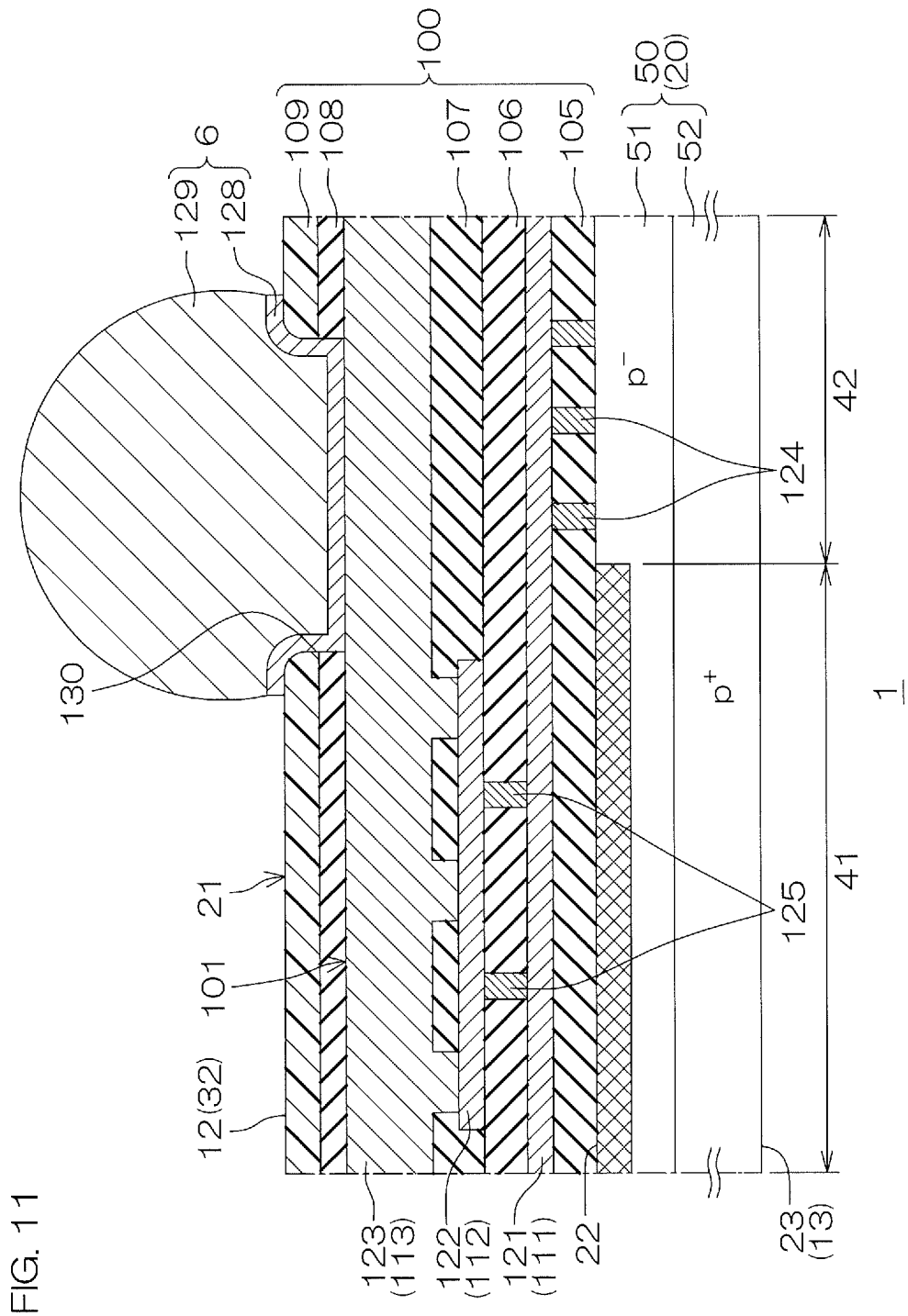
FIG. 11 is a schematic cross-sectional view that schematically shows a structure of a base wiring.
Figure 12:
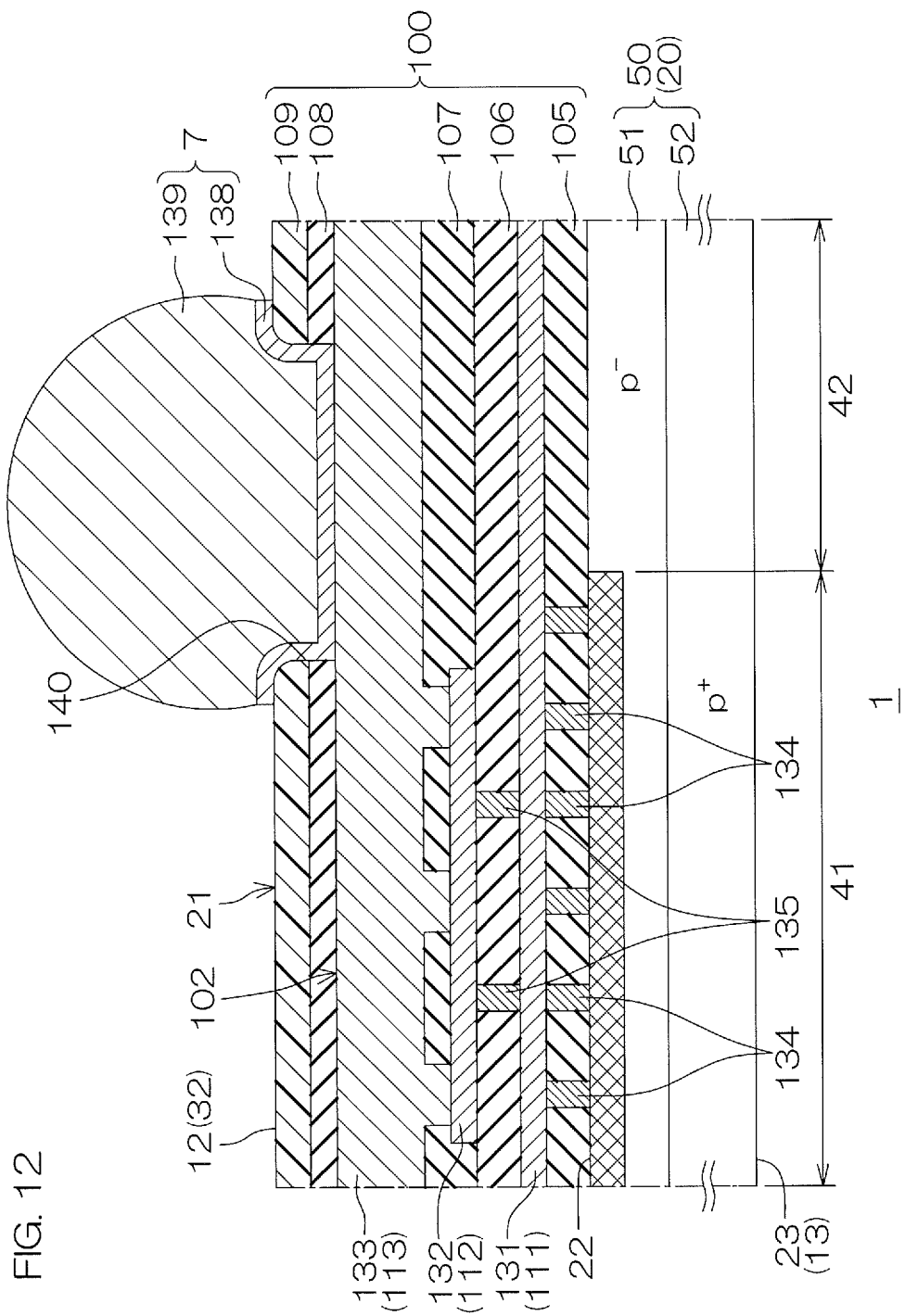
FIG. 12 is a schematic cross-sectional view that schematically shows a structure of a gate wiring.
Figure 13:
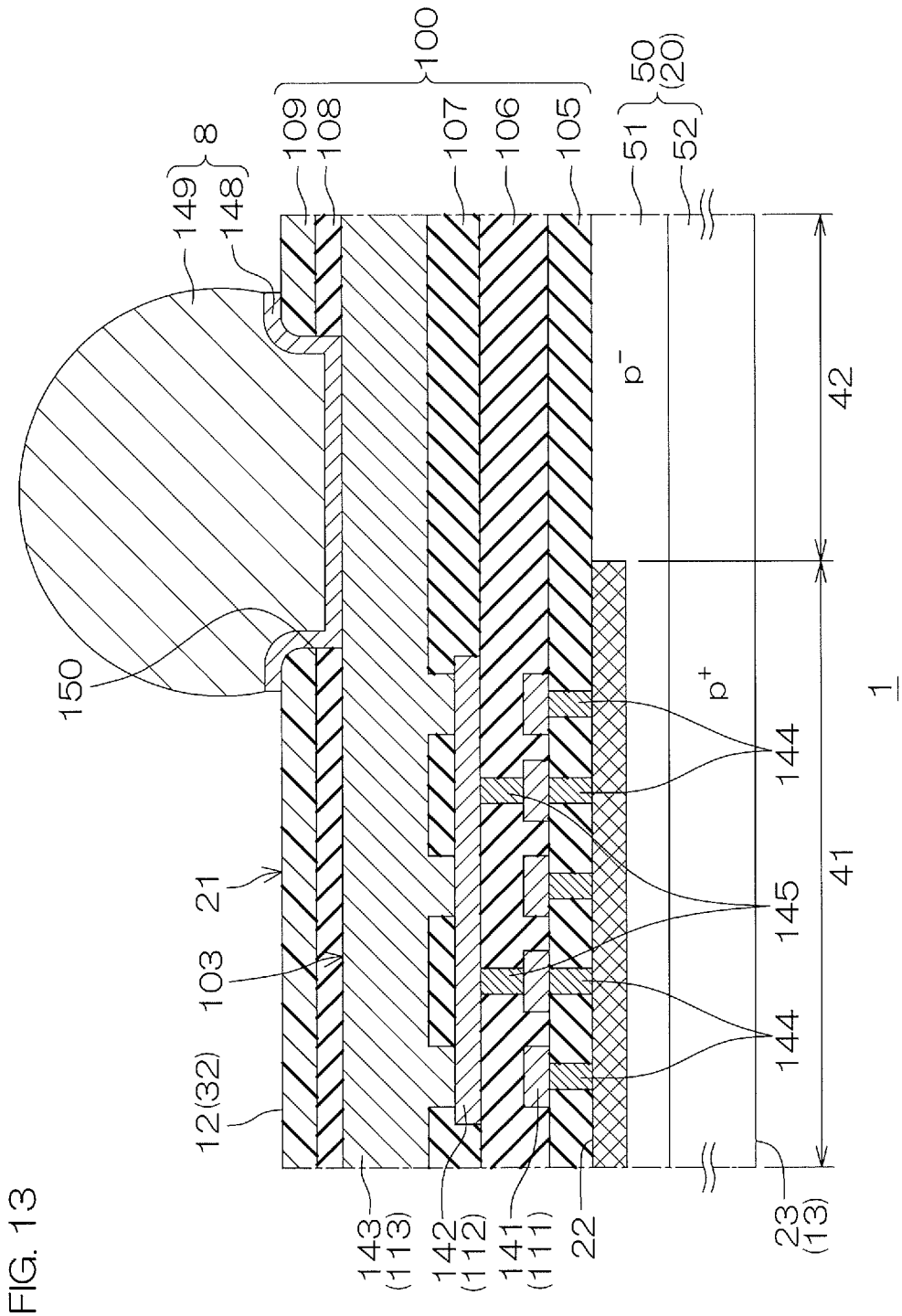
FIG. 13 is a schematic cross-sectional view that schematically shows a structure of a first source/drain wiring.
Figure 14:
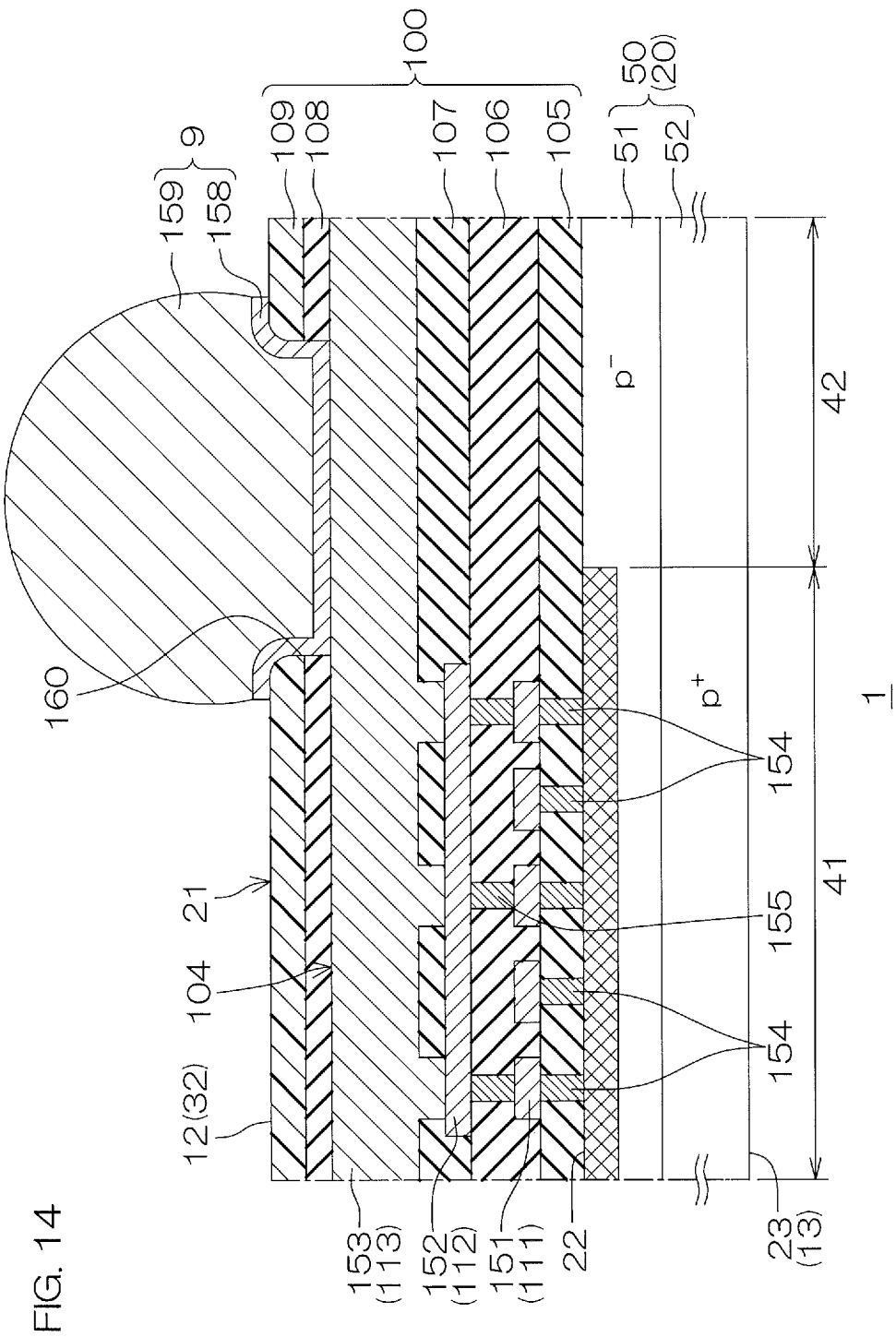
FIG. 14 is a schematic cross-sectional view that schematically shows a structure of a second source/drain wiring.
Figure 15:
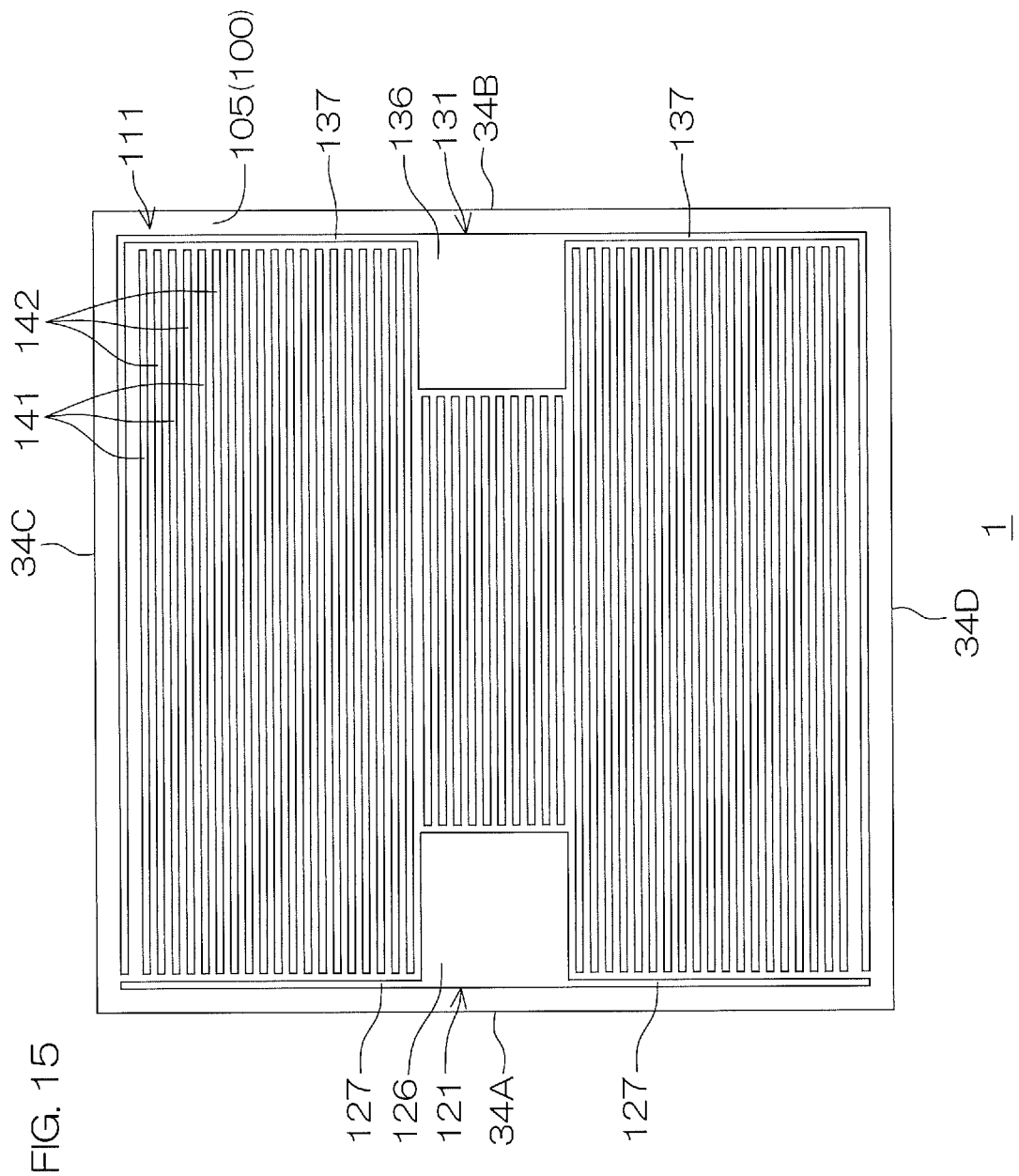
FIG. 15 is a plan view showing a structure of a first wiring layer.
Figure 16:
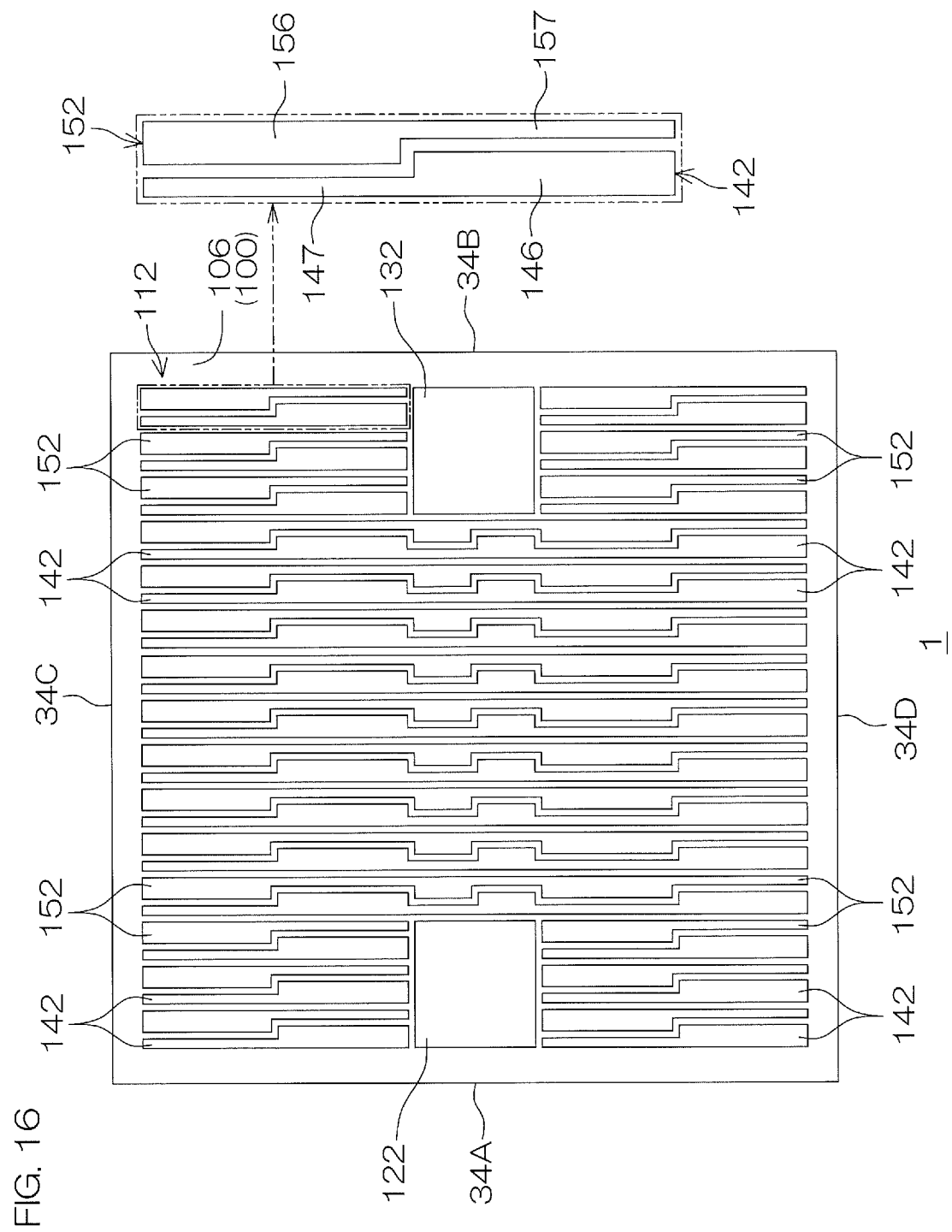
FIG. 16 is a plan view showing a structure of a second wiring layer.
Figure 17:
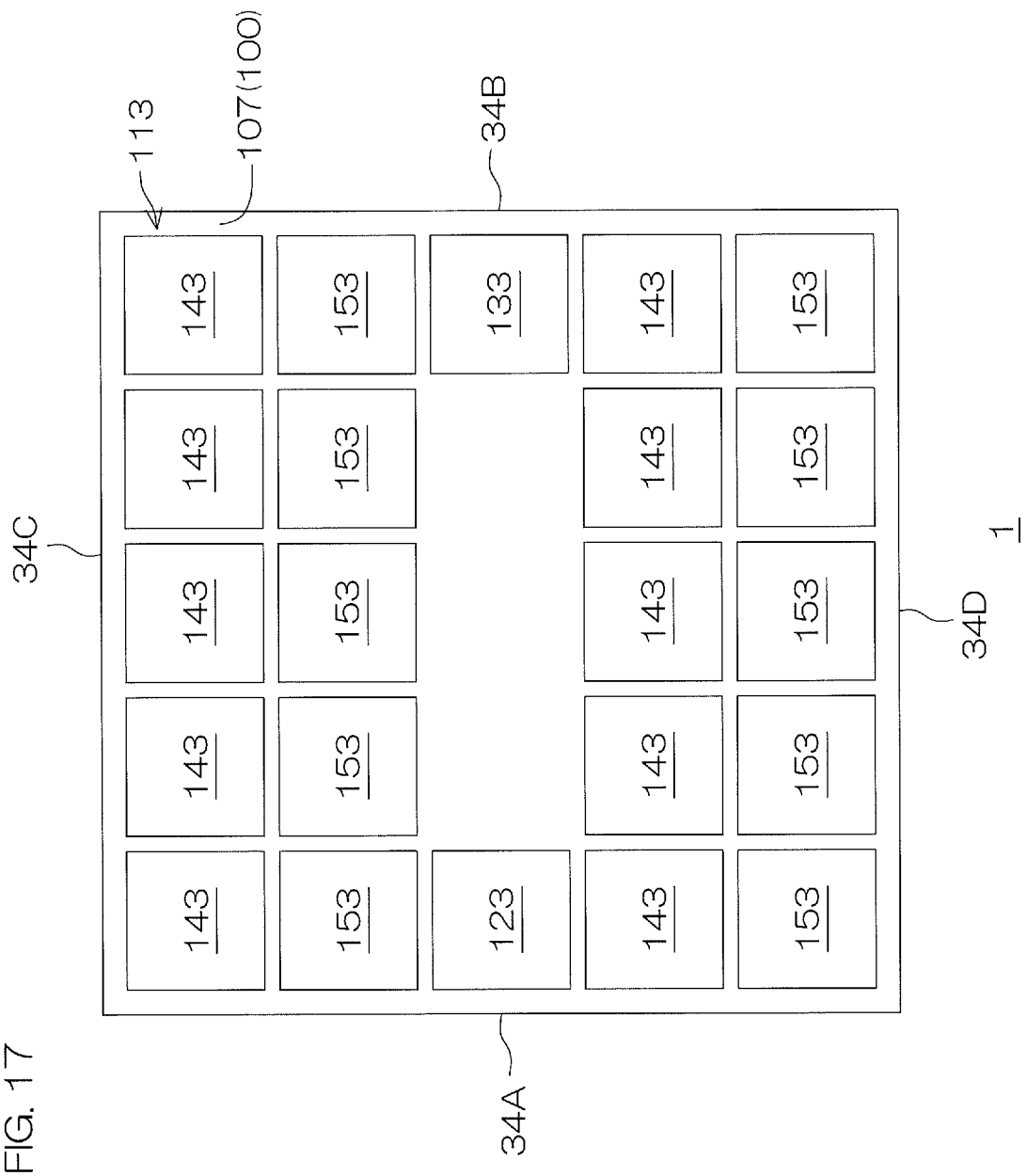
FIG. 17 is a plan view showing a structure of a third wiring layer.

FIG. 11 is a schematic cross-sectional view that schematically shows a structure of a base wiring 101. FIG. 12 is a schematic cross-sectional view that schematically shows a structure of a gate wiring 102. FIG. 13 is a schematic cross-sectional view that schematically shows a structure of a first source/drain wiring 103. FIG. 14 is a schematic cross-sectional view that schematically shows a structure of a second source/drain wiring 104. FIG. 15 is a plan view showing a structure of a first wiring layer 111. FIG. 16 is a plan view showing a structure of a second wiring layer 112. FIG. 17 is a plan view showing a structure of a third wiring layer 113. FIG. 11 to FIG. 14 each schematically show a structure necessary for description, and do not show a cross section of a specific portion of the semiconductor device 1. Also, in FIG. 11 to FIG. 14, the device region 41 is simply shown by hatching.

Referring to FIG. 11 to FIG. 17, the wiring structure 21 includes an insulation layer 100, a base wiring 101, a gate wiring 102, a first source/drain wiring 103, and a second source/drain wiring 104. The base wiring 101, the gate wiring 102, the first source/drain wiring 103, and the second source/drain wiring 104 are each selectively routed around into the insulation layer 100.

In this embodiment, the insulation layer 100 has a laminated structure in which a plurality of insulation layers 100 are laminated. A number of laminated layers of the insulation layers 100 is arbitrary, and is not limited to a specific laminated number. In this embodiment, the plurality of insulation layers 100 include a first insulation layer 105, a second insulation layer 106, a third insulation layer 107, a fourth insulation layer 108 and a fifth insulation layer 109 that are laminated in this order from the first main surface 22 side of the semiconductor layer 20.

The first insulation layer 105 is a lowermost insulation layer. The fifth insulation layer 109 is an uppermost insulation layer. The first insulation layer 105, the second insulation layer 106, the third insulation layer 107 and the fourth insulation layer 108 are each formed as an interlayer insulating layer. In this embodiment, the fourth insulation layer 108 is formed as a passivation layer. In this embodiment, the fifth insulation layer 109 is formed as a protective layer.

Preferably, the first insulation layer 105, the second insulation layer 106, the third insulation layer 107 and the fourth insulation layer 108 include an inorganic insulator. The first insulation layer 105, the second insulation layer 106, the third insulation layer 107 and the fourth insulation layer 108 may include silicon oxide or silicon nitride that is an example of the inorganic insulator.

In this embodiment, the first insulation layer 105, the second insulation layer 106 and the third insulation layer 107 each include silicon oxide. In this embodiment, the fourth insulation layer 108 includes silicon nitride. Preferably, the fifth insulation layer 109 includes an organic insulator. The fifth insulation layer 109 may include resin that is an example of the organic insulator. The fifth insulation layer 109 may include polyimide, polyamide, or polybenzoxazole that is an example of the resin.

The first wiring layer 111 is formed on the first insulation layer 105. The second wiring layer 112 is formed on the second insulation layer 106. The third wiring layer 113 is formed on the third insulation layer 107. A part of the base wiring 101, a part of the gate wiring 102, a part of the first source/drain wiring 103 and a part of the second source/drain wiring 104 are each formed at the first wiring layer 111, the second wiring layer 112 and the third wiring layer 113.

Referring to FIG. 11, the base wiring 101 has a first end portion at one side and a second end portion at the other side. The first end portion is electrically connected to the base region 50 (low concentration base region 51) in the outer region 42. The second end portion is electrically connected to the base terminal 6. The base wiring 101 transmits the reference voltage (for example, ground voltage) applied to the base terminal 6 to the base region 50 (low concentration base region 51).

In detail, the base wiring 101 includes one or more (in this embodiment, one) base lowermost wiring layers 121, one or more (in this embodiment, one) base intermediate wiring layers 122, one or more (in this embodiment, one) base uppermost wiring layers 123, one or more (in this embodiment, two or more) base lowermost connection electrodes 124, and one or more (in this embodiment, two or more) base intermediate connection electrodes 125.

Referring to FIG. 15, the base lowermost wiring layer 121 is formed on the first insulation layer 105 as one of the first wiring layers 111. In this embodiment, the base lowermost wiring layer 121 is formed in a region at the first side surface 34A side of the wiring structure 21 in plan view. The base lowermost wiring layer 121 may include at least one among an aluminum layer, a copper layer, an aluminum-alloy layer, and a copper-alloy layer.

In this embodiment, the base lowermost wiring layer 121 includes a base main body portion 126 and a base arm portion 127. The base main body portion 126 is formed in a region along a central portion of the first side surface 34A of the wiring structure 21 in plan view. In this embodiment, the base main body portion 126 is formed in the device region 41 in plan view. The base main body portion 126 is formed in a quadrangular shape in plan view. The planar shape of the base main body portion 126 is arbitrary.

The base arm portion 127 is led out from the base main body portion 126 to the outer region 42. The base arm portion 127 extends in a band shape toward the first side surface 34A. The base arm portion 127 faces the base region 50 (low concentration base region 51) in plan view.

Referring to FIG. 16, the base intermediate wiring layer 122 is formed on the second insulation layer 106 as one of the second wiring layers 112. The base intermediate wiring layer 122 is formed at a position at which the base intermediate wiring layer 122 overlaps the base main body portion 126 of the base lowermost wiring layer 121 in plan view. The base intermediate wiring layer 122 is formed in a quadrangular shape in plan view. The planar shape of the base intermediate wiring layer 122 is arbitrary. The base intermediate wiring layer 122 may include at least one among an aluminum layer, a copper layer, an aluminum-alloy layer, and a copper-alloy layer.

Referring to FIG. 17, the base uppermost wiring layer 123 is formed on the third insulation layer 107 as one of the third wiring layers 113. The base uppermost wiring layer 123 is formed at a position at which the base uppermost wiring layer 123 overlaps both the base intermediate wiring layer 122 and the base terminal 6 in plan view.

The base uppermost wiring layer 123 is formed in a quadrangular shape in plan view. The planar shape of the base uppermost wiring layer 123 is arbitrary. The base uppermost wiring layer 123 has a thickness that exceeds the thickness of the base lowermost wiring layer 121 and the thickness of the base intermediate wiring layer 122. The base uppermost wiring layer 123 may include at least one among an aluminum layer, a copper layer, an aluminum-alloy layer, and a copper-alloy layer.

Referring to FIG. 11, the plurality of base lowermost connection electrodes 124 are interposed in a region between the base lowermost wiring layer 121 (in detail, base arm portion 127) and the outer region 42 in the first insulation layer 105. The plurality of base lowermost connection electrodes 124 electrically connect the base lowermost wiring layer 121 to the base region 50 (low concentration base region 51). The plurality of base lowermost connection electrodes 124 form the first end portion of the base wiring 101. The base lowermost connection electrode 124 may include at least one among a tungsten layer, a copper layer, a titanium layer, and a titanium nitride layer.

The plurality of base intermediate connection electrodes 125 are interposed in a region between the base intermediate wiring layer 122 and the base uppermost wiring layer 123 in the second insulation layer 106. The plurality of base intermediate connection electrodes 125 electrically connect the base uppermost wiring layer 123 to the base intermediate wiring layer 122. The base intermediate connection electrode 125 may include at least one among a tungsten layer, a copper layer, a titanium layer, and a titanium nitride layer.

The base terminal 6 is formed on the fifth insulation layer 109. The base terminal 6 is formed at a position at which the base terminal 6 overlaps the base uppermost wiring layer 123 in plan view. The base terminal 6 passes through a part of the insulation layer 100 (in this embodiment, the fourth insulation layer 108 and the fifth insulation layer 109), and is electrically connected to the base uppermost wiring layer 123. A part, which is connected to the base terminal 6, of the base uppermost wiring layer 123 forms the second end portion of the base wiring 101.

In this embodiment, the base terminal 6 includes a base underlying electrode layer 128 and a base low-melting-point metal layer 129. The base underlying electrode layer 128 is formed in a base opening 130. The base opening 130 passes through a part of the insulation layer 100 (in this embodiment, the fourth insulation layer 108 and the fifth insulation layer 109), and exposes the base uppermost wiring layer 123.

The base underlying electrode layer 128 is electrically connected to the base uppermost wiring layer 123 in the base opening 130. The base underlying electrode layer 128 has an overlap portion that covers the main surface 32 of the wiring structure 21. The base underlying electrode layer 128 may include at least one among a titanium layer, a titanium nitride layer, a copper layer, a gold layer, a nickel layer, and an aluminum layer.

The base low-melting-point metal layer 129 is formed on the base underlying electrode layer 128. The base low-melting-point metal layer 129 is electrically connected to the base uppermost wiring layer 123 through the base underlying electrode layer 128. The base low-melting-point metal layer 129 covers the overlap portion of the base underlying electrode layer 128. The base low-melting-point metal layer 129 hemispherically protrudes from the main surface 32 of the wiring structure 21. The base low-melting-point metal layer 129 may include solder.

Referring to FIG. 12, the gate wiring 102 has a first end portion at one side and a second end portion at the other side. The first end portion is electrically connected to the gate electrode 63. The second end portion is electrically connected to the gate terminal 7. The gate wiring 102 transmits the gate voltage VG applied to the gate terminal 7 to the gate electrode 63.

In detail, the gate wiring 102 includes one or more (in this embodiment, one) gate lowermost wiring layers 131, one or more (in this embodiment, one) gate intermediate wiring layers 132, one or more (in this embodiment, one) gate uppermost wiring layers 133, one or more (in this embodiment, two or more) gate lowermost connection electrodes 134, and one or more (in this embodiment, two or more) gate intermediate connection electrodes 135.

Referring to FIG. 15, the gate lowermost wiring layer 131 is formed on the first insulation layer 105 as one of the first wiring layers 111. In this embodiment, the gate lowermost wiring layer 131 is formed in a region at the second side surface 34B side of the wiring structure 21 in plan view. The gate lowermost wiring layer 131 may include at least one among an aluminum layer, a copper layer, an aluminum-alloy layer, and a copper-alloy layer. Preferably, the gate lowermost wiring layer 131 is made of the same material as that of the base lowermost wiring layer 121.

In this embodiment, the gate lowermost wiring layer 131 includes a gate main body portion 136 and a gate arm portion 137. The gate main body portion 136 is formed in a region along a central portion of the second side surface 34B of the wiring structure 21 in plan view. In this embodiment, the base main body portion 126 is formed in the device region 41 in plan view. In this embodiment, the gate main body portion 136 faces the base main body portion 126 in the second direction Y in plan view. The gate main body portion 136 is formed in a quadrangular shape in plan view. The planar shape of the gate main body portion 136 is arbitrary.

The gate arm portion 137 is led out from the gate main body portion 136 to the outer region 42. The gate arm portion 137 extends in a band shape along the second side surface 34B, the third side surface 34C and the fourth side surface 34D. The gate arm portion 137 partitions the device region 41 from three directions in plan view. The gate arm portion 137 faces the trench contact structure 71 (contact electrode 76) in plan view. The gate arm portion 137 may face the trench gate structure 53 (gate contact electrode 70) in plan view.

Referring to FIG. 16, the gate intermediate wiring layer 132 is formed on the second insulation layer 106 as one of the second wiring layers 112. The gate intermediate wiring layer 132 is formed at a position at which the gate intermediate wiring layer 132 overlaps the gate main body portion 136 of the gate lowermost wiring layer 131 in plan view.

The gate intermediate wiring layer 132 is formed in a quadrangular shape in plan view. The planar shape of the gate intermediate wiring layer 132 is arbitrary. The gate intermediate wiring layer 132 may include at least one among an aluminum layer, a copper layer, an aluminum-alloy layer, and a copper-alloy layer. Preferably, the gate intermediate wiring layer 132 is made of the same material as that of the base intermediate wiring layer 122.

Referring to FIG. 17, the gate uppermost wiring layer 133 is formed on the third insulation layer 107 as one of the third wiring layers 113. The gate uppermost wiring layer 133 is formed at a position at which the gate uppermost wiring layer 133 overlaps the gate intermediate wiring layer 132 and the gate terminal 7 in plan view. The gate uppermost wiring layer 133 is formed in a quadrangular shape in plan view. The planar shape of the gate uppermost wiring layer 133 is arbitrary.

The gate uppermost wiring layer 133 has a thickness that exceeds the thickness of the gate lowermost wiring layer 131 and the thickness of the gate intermediate wiring layer 132. The gate uppermost wiring layer 133 may include at least one among an aluminum layer, a copper layer, an aluminum-alloy layer, and a copper-alloy layer. Preferably, the gate uppermost wiring layer 133 is made of the same material as that of the base uppermost wiring layer 123.

Referring to FIG. 12, the plurality of gate lowermost connection electrodes 134 are interposed in a region between the gate lowermost wiring layer 131 (in detail, gate arm portion 137) and the outer region 42 in the first insulation layer 105. The plurality of gate lowermost connection electrodes 134 electrically connect the gate lowermost wiring layer 131 to the gate contact electrode 70 and to the contact electrode 76.

Hence, the gate lowermost wiring layer 131 is electrically connected to the gate electrode 63 through the plurality of gate lowermost connection electrodes 134. The plurality of gate lowermost connection electrodes 134 form the first end portion of the gate wiring 102. The gate lowermost connection electrode 134 may include at least one among a tungsten layer, a copper layer, a titanium layer, and a titanium nitride layer. Preferably, the gate lowermost connection electrode 134 is made of the same material as that of the base lowermost connection electrode 124.

The plurality of gate intermediate connection electrodes 135 are interposed in a region between the gate intermediate wiring layer 132 and the gate uppermost wiring layer 133 in the second insulation layer 106. The gate intermediate connection electrodes 135 electrically connect the gate uppermost wiring layer 133 to the gate intermediate wiring layer 132. The plurality of gate intermediate connection electrode 135 may include at least one among a tungsten layer, a copper layer, a titanium layer, and a titanium nitride layer. Preferably, the gate intermediate connection electrode 135 is made of the same material as that of the base intermediate connection electrode 125.

The gate terminal 7 is formed on the fifth insulation layer 109. The gate terminal 7 is formed at a position at which the gate terminal 7 overlaps the gate uppermost wiring layer 133 in plan view. The gate terminal 7 passes through a part of the insulation layer 100 (in this embodiment, the fourth insulation layer 108 and the fifth insulation layer 109), and is electrically connected to the gate uppermost wiring layer 133. A part, which is connected to the gate terminal 7, of the gate uppermost wiring layer 133 forms the second end portion of the gate wiring 102.

In this embodiment, the gate terminal 7 includes a gate underlying electrode layer 138 and a gate low-melting-point metal layer 139. The gate underlying electrode layer 138 is formed in a gate opening 140. The gate opening 140 passes through a part of the insulation layer 100 (in this embodiment, the fourth insulation layer 108 and the fifth insulation layer 109), and exposes the gate uppermost wiring layer 133.

The gate underlying electrode layer 138 is electrically connected to the gate uppermost wiring layer 133 in the gate opening 140. The gate underlying electrode layer 138 has an overlap portion that covers the main surface 32 of the wiring structure 21. The gate underlying electrode layer 138 may include at least one among a titanium layer, a titanium nitride layer, a copper layer, a gold layer, a nickel layer, and an aluminum layer.

The gate low-melting-point metal layer 139 is formed on the gate underlying electrode layer 138. The gate low-melting-point metal layer 139 is electrically connected to the gate uppermost wiring layer 133 through the gate underlying electrode layer 138. The gate low-melting-point metal layer 139 covers the overlap portion of the gate underlying electrode layer 138. The gate low-melting-point metal layer 139 hemispherically protrudes from the main surface 32 of the wiring structure 21. The gate low-melting-point metal layer 139 may include solder.

Referring to FIG. 13, the first source/drain wiring 103 has a first end portion at one side and a second end portion at the other side. The first end portion is electrically connected to the first source/drain region 91 in the device region 41. The second end portion is electrically connected to the first source/drain terminal 8. The first source/drain wiring 103 transmits the electric current I from the first source/drain region 91 to the first source/drain terminal 8, or transmits the electric current I from the first source/drain terminal 8 to the first source/drain region 91.

In detail, the first source/drain wiring 103 includes a plurality of first source/drain lowermost wiring layers 141, a plurality of first source/drain intermediate wiring layers 142, a plurality of first source/drain uppermost wiring layers 143, a plurality of first source/drain lowermost connection electrodes 144, and a plurality of first source/drain intermediate connection electrodes 145.

Referring to FIG. 15, the plurality of first source/drain lowermost wiring layers 141 are formed on the first insulation layer 105 as one of the first wiring layers 111. The plurality of first source/drain lowermost wiring layers 141 are formed in regions in which the first source/drain lowermost wiring layers 141 overlap the device region 41 in plan view.

In this embodiment, the plurality of first source/drain lowermost wiring layers 141 are each formed in a band shape extending in the second direction Y, and are formed with intervals between the first source/drain lowermost wiring layers 141 in the first direction X. The plurality of first source/drain lowermost wiring layers 141 are formed in a stripe shape extending in the second direction Y as a whole. Hence, the plurality of first source/drain lowermost wiring layers 141 intersect the plurality of source/drain regions 90 in plan view.

With respect to the first direction X, the width of each of the first source/drain lowermost wiring layers 141 may be not less than 0.1 µm and not more than 5 µm. The width of each of the first source/drain lowermost wiring layers 141 may be not less than 0.1 µm and not more than 1 µm, not less than 1 µm and not more than 2 µm, not less than 2 µm and not more than 3 µm, not less than 3 µm and not more than 4 µm, or not less than 4 µm and not more than 5 µm. Preferably, the width of each of the first source/drain lowermost wiring layers 141 is not less than 0.1 µm and not more than 2 µm.

The first source/drain lowermost wiring layer 141 may include at least one among an aluminum layer, a copper layer, an aluminum-alloy layer, and a copper-alloy layer. Preferably, the first source/drain lowermost wiring layer 141 is made of the same material as that of the base lowermost wiring layer 121.

Referring to FIG. 16, the plurality of first source/drain intermediate wiring layers 142 are formed on the second insulation layer 106 as one of the second wiring layers 112. The plurality of first source/drain intermediate wiring layers 142 are formed in a region in which the first source/drain intermediate wiring layers 142 overlap the device region 41 in plan view.

In this embodiment, the plurality of first source/drain intermediate wiring layers 142 are each formed in a band shape extending in the first direction X, and are formed with intervals between the first source/drain intermediate wiring layers 142 in the second direction Y. The plurality of first source/drain intermediate wiring layers 142 are formed in a stripe shape extending in the first direction X as a whole. Hence, the plurality of first source/drain intermediate wiring layers 142 intersect the plurality of first source/drain lowermost wiring layers 141 in plan view.

With respect to the second direction Y, the width of each of the first source/drain intermediate wiring layers 142 exceeds the width in the first direction X of each of the first source/drain lowermost wiring layers 141. Each of the first source/drain intermediate wiring layers 142 may be formed with a uniform width or may be formed with a non-uniform width.

In this embodiment, each of the first source/drain intermediate wiring layers 142 includes one or more first wide portions 146 and one or more first narrow portions 147. The first wide portion 146 is a portion in which the width in the second direction Y of the first source/drain intermediate wiring layer 142 is comparatively large. The first narrow portion 147 is a portion in which the width in the second direction Y of the first source/drain intermediate wiring layer 142 is smaller than the first wide portion 146. The width of the first wide portion 146 and the width of the first narrow portion 147 exceed the width in the first direction X of each of the first source/drain lowermost wiring layers 141.

The width of the first wide portion 146 may be not less than 5 µm and not more than 15 µm. The width of the first wide portion 146 may be not less than 5 µm and not more than 7.5 µm, not less than 7.5 µm and not more than 10 µm, not less than 10 µm and not more than 12.5 µm, or not less than 12.5 µm and not more than 15 µm. Preferably, the width of the first wide portion 146 is not less than 6 µm and not more than 10 µm.

The width of the first narrow portion 147 may be not less than 1 µm and not more than 10 µm. The width of the first narrow portion 147 may be not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. Preferably, the width of the first narrow portion 147 is not less than 2 µm and not more than 8 µm.

Referring to FIG. 17, the plurality of first source/drain uppermost wiring layers 143 are formed on the third insulation layer 107 as one of the third wiring layers 113. The plurality of first source/drain uppermost wiring layers 143 are each formed at a position at which the first source/drain uppermost wiring layers 143 overlap the plurality of first source/drain intermediate wiring layers 142 and the plurality of first source/drain terminals 8 in plan view. The arrangement of the plurality of first source/drain uppermost wiring layers 143 coincides with the arrangement of the plurality of first source/drain terminals 8.

The plurality of first source/drain uppermost wiring layers 143 are formed in a quadrangular shape in plan view. The planar shape of the plurality of first source/drain uppermost wiring layers 143 is arbitrary. The plurality of first source/drain uppermost wiring layers 143 have a thickness that exceeds the thickness of the first source/drain lowermost wiring layer 141 and the thickness of the first source/drain intermediate wiring layer 142.

The first source/drain uppermost wiring layer 143 may include at least one among an aluminum layer, a copper layer, an aluminum-alloy layer, and a copper-alloy layer. Preferably, the first source/drain uppermost wiring layer 143 is made of the same material as that of the base uppermost wiring layer 123.

Referring to FIG. 13, the plurality of first source/drain lowermost connection electrodes 144 are interposed in a region between the plurality of first source/drain lowermost wiring layers 141 and the plurality of first source/drain regions 91 in the first insulation layer 105. The first source/drain lowermost connection electrodes 144 electrically connect the first source/drain lowermost wiring layer 141 corresponding thereto to the first source/drain region 91 corresponding thereto.

The plurality of first source/drain lowermost connection electrodes 144 may be connected to either one or both of the first wide portion 146 and the first narrow portion 147 of the first source/drain intermediate wiring layer 142 corresponding thereto. The plurality of first source/drain lowermost connection electrodes 144 form the first end portion of the first source/drain wiring 103.

The plurality of first source/drain lowermost connection electrodes 144 may include at least one among a tungsten layer, a copper layer, a titanium layer, and a titanium nitride layer. Preferably, the first source/drain lowermost connection electrode 144 is made of the same material as that of the base lowermost connection electrode 124.

The plurality of first source/drain intermediate connection electrodes 145 are interposed between the plurality of first source/drain intermediate wiring layers 142 and the plurality of first source/drain uppermost wiring layers 143 in the second insulation layer 106. The first source/drain intermediate connection electrodes 145 electrically connect the first source/drain uppermost wiring layer 143 corresponding thereto to the first source/drain intermediate wiring layer 142 corresponding thereto.

The plurality of first source/drain intermediate connection electrodes 145 may be connected to either one or both of the first wide portion 146 and the first narrow portion 147 of the first source/drain intermediate wiring layer 142 corresponding thereto. The plurality of first source/drain intermediate connection electrodes 145 may include at least one among a tungsten layer, a copper layer, a titanium layer, and a titanium nitride layer. Preferably, the first source/drain intermediate connection electrode 145 is made of the same material as that of the base intermediate connection electrode 125.

The plurality of first source/drain terminals 8 are formed on the fifth insulation layer 109. The plurality of first source/drain terminals 8 are each formed at a position at which the first source/drain terminal 8 overlaps the first source/drain uppermost wiring layer 143 corresponding thereto in plan view. The first source/drain terminals 8 pass through a part of the insulation layer 100 (in this embodiment, the fourth insulation layer 108 and the fifth insulation layer 109), and are electrically connected to the first source/drain uppermost wiring layer 143 corresponding thereto. A part, which is connected to the first source/drain terminal 8, of the plurality of first source/drain uppermost wiring layers 143 forms the second end portion of the first source/drain wiring 103.

In this embodiment, each of the first source/drain terminals 8 includes a first source/drain underlying electrode layer 148 and a first source/drain low-melting-point metal layer 149. The first source/drain underlying electrode layer 148 is formed in a first source/drain opening 150. The first source/drain opening 150 passes through a part of the insulation layer 100 (in this embodiment, the fourth insulation layer 108 and the fifth insulation layer 109), and exposes the first source/drain uppermost wiring layer 143.

The first source/drain underlying electrode layer 148 is electrically connected to the first source/drain uppermost wiring layer 143 in the first source/drain opening 150. The first source/drain underlying electrode layer 148 has an overlap portion that covers the main surface 32 of the wiring structure 21. The first source/drain underlying electrode layer 148 may include at least one among a titanium layer, a titanium nitride layer, a copper layer, a gold layer, a nickel layer, and an aluminum layer.

The first source/drain low-melting-point metal layer 149 is formed on the first source/drain underlying electrode layer 148. The first source/drain low-melting-point metal layer 149 is electrically connected to the first source/drain uppermost wiring layer 143 through the first source/drain underlying electrode layer 148. The first source/drain low-melting-point metal layer 149 covers the overlap portion of the first source/drain underlying electrode layer 148. The first source/drain low-melting-point metal layer 149 hemispherically protrudes from the main surface 32 of the wiring structure 21. The first source/drain low-melting-point metal layer 149 may include solder.

Referring to FIG. 14, the second source/drain wiring 104 has a first end portion at one side and a second end portion at the other side. The first end portion is connected to the second source/drain region 92 in the device region 41. The second end portion is connected to the second source/drain terminal 9. The second source/drain wiring 104 transmits the electric current I from the second source/drain region 92 to the second source/drain terminal 9, or transmits the electric current I from the second source/drain terminal 9 to the second source/drain region 92.

In detail, the second source/drain wiring 104 includes a plurality of second source/drain lowermost wiring layers 151, a plurality of second source/drain intermediate wiring layers 152, a plurality of second source/drain uppermost wiring layers 153, a plurality of second source/drain lowermost connection electrodes 154, and a plurality of second source/drain intermediate connection electrodes 155.

Referring to FIG. 15, the plurality of second source/drain lowermost wiring layers 151 are formed on the first insulation layer 105 as one of the first wiring layers 111. The plurality of second source/drain lowermost wiring layers 151 are formed in regions in which the second source/drain lowermost wiring layers 151 overlap the device region 41 in plan view.

In this embodiment, the plurality of second source/drain lowermost wiring layers 151 are each formed in a band shape extending in the second direction Y, and are formed with intervals between the second source/drain lowermost wiring layers 151 in the first direction X. The plurality of second source/drain lowermost wiring layers 151 are formed in a stripe shape extending in the second direction Y as a whole. Hence, the plurality of second source/drain lowermost wiring layers 151 intersect the plurality of source/drain regions 90 in plan view.

In this embodiment, the plurality of second source/drain lowermost wiring layers 151 are arranged alternately with the plurality of first source/drain lowermost wiring layers 141 in a manner in which the single first source/drain lowermost wiring layer 141 is sandwiched between the second source/drain lowermost wiring layers 151. The plurality of second source/drain lowermost wiring layers 151 may be arranged alternately with the plurality of first source/drain lowermost wiring layers 141 in a manner in which two or more first source/drain lowermost wiring layers 141 are sandwiched between the second source/drain lowermost wiring layers 151.

With respect to the first direction X, the width of each of the second source/drain lowermost wiring layers 151 may be not less than 0.1 μm and not more than 5 μm. The width of each of the second source/drain lowermost wiring layers 151 may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. Preferably, the width of each of the second source/drain lowermost wiring layers 151 is not less than 0.1 μm and not more than 2 μm.

A wiring pitch between the first source/drain lowermost wiring layer 141 and the second source/drain lowermost wiring layer 151 that adjoin each other may be not less than 0.1 μm and not more than 5 μm. The wiring pitch may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. Preferably, the wiring pitch is not less than 0.1 μm and not more than 2 μm.

The second source/drain lowermost wiring layer 151 may include at least one among an aluminum layer, a copper layer, an aluminum-alloy layer, and a copper-alloy layer. Preferably, the second source/drain lowermost wiring layer 151 is made of the same material as that of the base lowermost wiring layer 121.

Referring to FIG. 16, the plurality of second source/drain intermediate wiring layers 152 are formed on the second insulation layer 106 as one of the second wiring layers 112. The plurality of second source/drain intermediate wiring layers 152 are formed in a region in which the second source/drain intermediate wiring layers 152 overlap the device region 41 in plan view.

In this embodiment, the plurality of second source/drain intermediate wiring layers 152 are each formed in a band shape extending in the first direction X, and are formed with intervals between the second source/drain intermediate wiring layers 152 in the second direction Y. The plurality of second source/drain intermediate wiring layers 152 are formed in a stripe shape extending in the first direction X as a whole. Hence, the plurality of second source/drain intermediate wiring layers 152 intersect the plurality of second source/drain lowermost wiring layers 151 in plan view.

In this embodiment, the plurality of second source/drain intermediate wiring layers 152 are arranged alternately with the plurality of first source/drain intermediate wiring layers 142 in a manner in which the single first source/drain intermediate wiring layer 142 is sandwiched between the second source/drain intermediate wiring layers 152. The plurality of second source/drain intermediate wiring layers 152 may be arranged alternately with the plurality of first source/drain intermediate wiring layers 142 in a manner in which two or more first source/drain intermediate wiring layers 142 are sandwiched between the second source/drain intermediate wiring layers 152.

A wiring pitch between the second source/drain intermediate wiring layer 152 and the first source/drain intermediate wiring layer 142 that adjoin each other may be not less than 0.1 μm and not more than 5 μm. The wiring pitch may be not less than 0.1 μm and not more than 1 μm, not less than 1 μm and not more than 2 μm, not less than 2 μm and not more than 3 μm, not less than 3 μm and not more than 4 μm, or not less than 4 μm and not more than 5 μm. Preferably, the wiring pitch is not less than 0.1 μm and not more than 2 μm.

With respect to the second direction Y, the width of each of the second source/drain intermediate wiring layers 152 exceeds the width in the first direction X of each of the second source/drain lowermost wiring layers 151. Each of the second source/drain intermediate wiring layers 152 may be formed with a uniform width, or may be formed with a non-uniform width.

In this embodiment, each of the second source/drain intermediate wiring layers 152 includes one or more second wide portions 156 and one or more second narrow portions 157. The second wide portion 156 is a portion in which the width in the second direction Y of the second source/drain intermediate wiring layer 152 is comparatively large. The second narrow portion 157 is a portion in which the width in the second direction Y of the second source/drain intermediate wiring layer 152 is smaller than that of the second wide portion 156. The width of the second wide portion 156 and the width of the second narrow portion 157 exceed the width in the first direction X of each of the second source/drain lowermost wiring layers 151.

The second wide portion 156 of each of the second source/drain intermediate wiring layers 152 faces the first narrow portion 147 of the first source/drain intermediate wiring layer 142 corresponding thereto in the second direction Y. The second narrow portion 157 of each of the second source/drain intermediate wiring layers 152 faces the first wide portion 146 of the first source/drain intermediate wiring layer 142 corresponding thereto in the second direction Y.

The width of the second wide portion 156 may be not less than 5 μm and not more than 15 μm. The width of the second wide portion 156 may be not less than 5 μm and not more than 7.5 μm, not less than 7.5 μm and not more than 10 μm, not less than 10 μm and not more than 12.5 μm, or not less than 12.5 μm and not more than 15 μm. Preferably, the width of the second wide portion 156 is not less than 6 μm and not more than 10 μm.

The width of the second narrow portion 157 may be not less than 1 μm and not more than 10 μm. The width of the second narrow portion 157 may be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. Preferably, the width of the second narrow portion 157 is not less than 2 μm and not more than 8 μm.

Referring to FIG. 17, the plurality of second source/drain uppermost wiring layers 153 are formed on the third insulation layer 107 as one of the third wiring layers 113. The plurality of second source/drain uppermost wiring layers 153 are each formed at a position at which the second source/drain uppermost wiring layers 153 overlap the plurality of second source/drain intermediate wiring layers 152 and the plurality of second source/drain terminals 9 in plan view. The arrangement of the plurality of second source/drain uppermost wiring layers 153 coincides with the arrangement of the plurality of second source/drain terminals 9.

The plurality of second source/drain uppermost wiring layers 153 are formed in a quadrangular shape in plan view. The planar shape of the plurality of second source/drain uppermost wiring layers 153 is arbitrary. The plurality of second source/drain uppermost wiring layers 153 have a thickness that exceeds the thickness of the second source/ drain lowermost wiring layer 151 and the thickness of the second source/drain intermediate wiring layer 152.

The second source/drain uppermost wiring layer 153 may include at least one among an aluminum layer, a copper layer, an aluminum-alloy layer, and a copper-alloy layer. Preferably, the second source/drain uppermost wiring layer 153 is made of the same material as that of the base uppermost wiring layer 123.

Referring to FIG. 14, the plurality of second source/drain lowermost connection electrodes 154 are interposed in a region between the plurality of second source/drain lowermost wiring layers 151 and the plurality of second source/drain regions 92 in the first insulation layer 105. The plurality of second source/drain lowermost connection electrodes 154 electrically connect the second source/drain lowermost wiring layer 151 corresponding thereto to the second source/drain region 92 corresponding thereto.

The plurality of second source/drain lowermost connection electrodes 154 may be connected to either one or both of the second wide portion 156 and the second narrow portion 157 of the second source/drain intermediate wiring layer 152 corresponding thereto. The plurality of second source/drain lowermost connection electrodes 154 form the second end portion of the second source/drain wiring 104.

The plurality of second source/drain lowermost connection electrodes 154 may include at least one among a tungsten layer, a copper layer, a titanium layer, and a titanium nitride layer. Preferably, the second source/drain lowermost connection electrode 154 is made of the same material as that of the base lowermost connection electrode 124.

The plurality of second source/drain intermediate connection electrodes 155 are interposed between the plurality of second source/drain intermediate wiring layers 152 and the plurality of second source/drain uppermost wiring layers 153 in the second insulation layer 106. The plurality of second source/drain intermediate connection electrodes 155 electrically connect the second source/drain uppermost wiring layer 153 corresponding thereto to the second source/drain intermediate wiring layer 152 corresponding thereto.

The plurality of second source/drain intermediate connection electrodes 155 may be connected to either one or both of the second wide portion 156 and the second narrow portion 157 of the second source/drain intermediate wiring layer 152 corresponding thereto. The plurality of second source/drain intermediate connection electrodes 155 may include at least one among a tungsten layer, a copper layer, a titanium layer, and a titanium nitride layer. Preferably, the second source/drain intermediate connection electrode 155 is made of the same material as that of the base intermediate connection electrode 125.

The plurality of second source/drain terminals 9 are formed on the fifth insulation layer 109. The plurality of second source/drain terminals 9 are formed at a position at which the second source/drain terminals 9 overlap the second source/drain uppermost wiring layer 153 corresponding thereto in plan view. The plurality of second source/drain terminals 9 pass through a part of the insulation layer 100 (in this embodiment, the fourth insulation layer 108 and the fifth insulation layer 109), and are electrically connected to the second source/drain uppermost wiring layer 153 corresponding thereto. A part, which is connected to the second source/drain terminal 9, of the plurality of second source/drain uppermost wiring layers 153 forms the second end portion of the second source/drain wiring 104.

In this embodiment, each of the second source/drain terminals 9 includes the second source/drain underlying electrode layer 158 and the second source/drain low-melting-point metal layer 159. The second source/drain underlying electrode layer 158 is formed in a second source/drain opening 160. The second source/drain opening 160 passes through a part of the insulation layer 100 (in this embodiment, the fourth insulation layer 108 and the fifth insulation layer 109), and exposes the second source/drain uppermost wiring layer 153.

The second source/drain underlying electrode layer 158 is electrically connected to the second source/drain uppermost wiring layer 153 in the second source/drain opening 160. The second source/drain underlying electrode layer 158 has an overlap portion that covers the main surface 32 of the wiring structure 21. The second source/drain underlying electrode layer 158 may include at least one among a titanium layer, a titanium nitride layer, a copper layer, a gold layer, a nickel layer, and an aluminum layer.

The second source/drain low-melting-point metal layer 159 is formed on the second source/drain underlying electrode layer 158. The second source/drain low-melting-point metal layer 159 is electrically connected to the second source/drain uppermost wiring layer 153 through the second source/drain underlying electrode layer 158. The second source/drain low-melting-point metal layer 159 covers the overlap portion of the second source/drain underlying electrode layer 158. The second source/drain low-melting-point metal layer 159 hemispherically protrudes from the main surface 32 of the wiring structure 21. The second source/drain low-melting-point metal layer 159 may include solder.

As described above, with the semiconductor device 1, each of the source/drain regions 90 is formed in the region at the first main surface 22 side of the semiconductor layer 20 with respect to the upper end portion of the gate electrode 63. This makes it possible to reduce the electric field strength generated between the gate electrode 63 and each of the source/drain regions 90. As a result, it is possible to suppress the electric-field concentration to the trench gate structure 53, and therefore it is possible to improve the withstand voltage.

It is possible to appropriately keep each of the source/drain regions 90 away from the gate electrode 63 particularly by positioning the upper end portion of the gate electrode 63 at the bottom wall 66 side of the gate trench 61 with respect to the intermediate portion of the gate trench 61. Therefore, it is possible to appropriately improve the withstand voltage.

Also, with the semiconductor device 1, the embedded insulator 69 is embedded in the region on the upper end portion of the gate electrode 63 in the gate trench 61. In the thus formed structure, each of the source/drain regions 90 faces the embedded insulator 69 in the direction along the first main surface 22 of the semiconductor layer (in detail, the second direction Y). This makes it possible to appropriately reduce the electric-field concentration to the trench gate structure 53, hence making it possible to appropriately improve the dielectric withstand voltage of the trench gate structure 53. Therefore, it is possible to improve the withstand voltage.

Also, with the semiconductor device 1, the high concentration channel region 95 is formed in the region along the bottom wall 66 of the gate trench 61 in the semiconductor layer 20. The high concentration channel region 95 has the p-type impurity concentration that exceeds the p-type impurity concentration of the low concentration base region 51. The high concentration channel region 95 faces the gate electrode 63 with the gate insulation layer 62 between the high concentration channel region 95 and the gate electrode 63 in the region below the plurality of drift regions 85. This makes it possible to prevent the depletion layers spreading from the plurality of drift regions 85 from overlapping each other in the region along the bottom wall 66 of the gate trench 61 in the semiconductor layer 20. As a result, it is possible to suppress the punch-through, and therefore it is possible to improve the withstand voltage.

Also, with the semiconductor device 1, the low concentration channel region 97 is formed in the region between the plurality of drift regions 85 and the high concentration channel region 95 in the semiconductor layer 20. The low concentration channel region 97 has the p-type impurity concentration less than the p-type impurity concentration of the high concentration channel region 95. The low concentration channel region 97 allows the depletion layer to spread from the plurality of drift regions 85. This makes it possible to obtain the withstand voltage retention effect brought about by the depletion layer.

According to the structure in which the high concentration channel region 95 and the low concentration channel region 97 coexist with each other, the high concentration channel region 95 restricts the depletion layer spreading from the plurality of drift regions 85, whereas the low concentration channel region 97 allows the depletion layer spreading from the plurality of drift regions 85. This structure makes it possible to simultaneously realize both the suppression effect of the reduction in the withstand voltage resulting from the punch-through and the withstand voltage retention effect brought about by the depletion layer.

FIG. 18A to FIG. 18L are each an enlarged view of the region corresponding to FIG. 9, which are shown to describe an example of a manufacturing method of the semiconductor device 1 shown in FIG. 2.

Figure 18A:
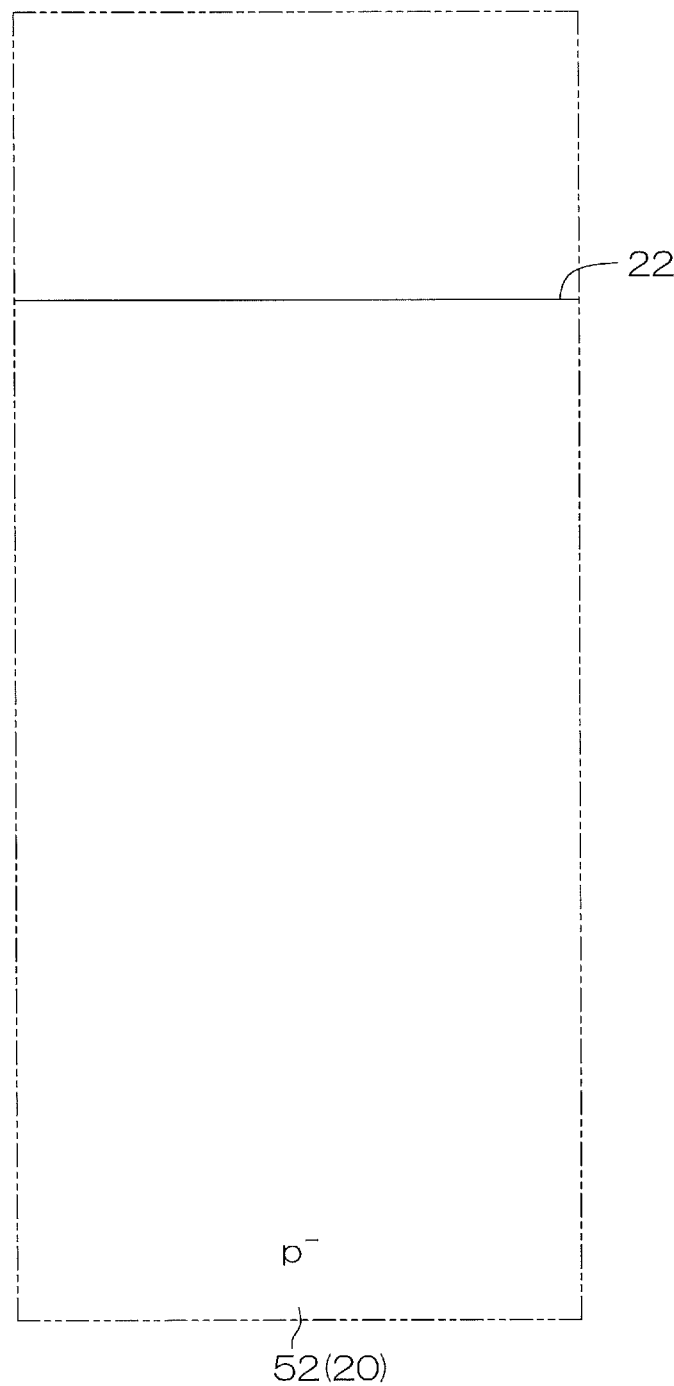
FIG. 18A is an enlarged view of the region corresponding to FIG. 9, which is shown to describe an example of a manufacturing method of the semiconductor device shown in FIG. 2.

Referring to FIG. 18A, the semiconductor layer 20 is prepared. The semiconductor layer 20 includes the low concentration base region 51 and the high concentration base region 52. In this embodiment, the high concentration base region 52 is formed by a p$^+$-type semiconductor substrate. In this embodiment, the low concentration base region 51 is formed by a p$^-$-type epitaxial layer. The low concentration base region 51 is formed by epitaxially growing silicon from the main surface of a semiconductor substrate.

Figure 18B:
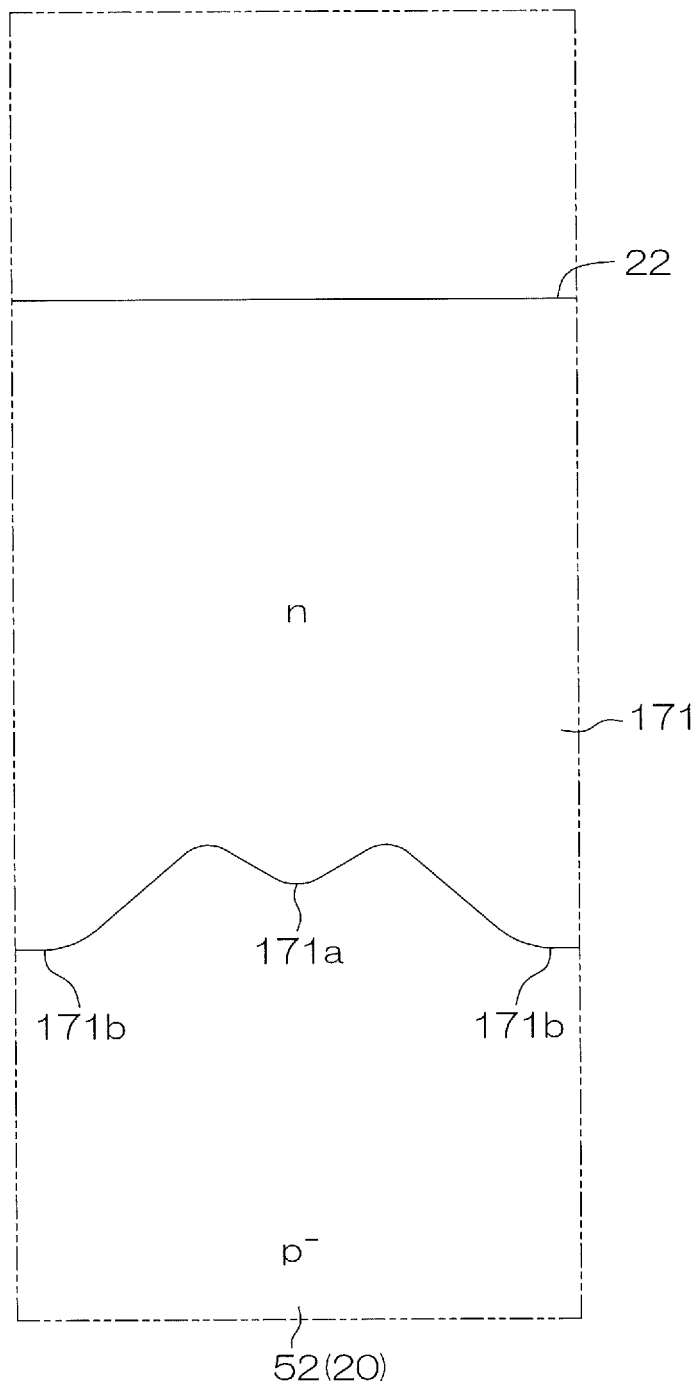
FIG. 18B is an enlarged view showing a step after FIG. 18A.

Next, referring to FIG. 18B, a base drift region 171 that serves as a base of the plurality of drift regions is formed at the surface layer portion of the semiconductor layer 20. The base drift region 171 is formed by introducing an n-type impurity into the surface layer portion of the semiconductor layer 20. The n-type impurity may be introduced by an ion implantation method through an ion implantation mask (not shown).

The base drift region 171 integrally includes a first region 171a formed in a comparative shallow region and a second region 171b formed in a region that is deeper than the first region 171a. The bottom portion of the second region 171b is positioned in a region at the second main surface 23 side with respect to the bottom portion of the first region 171a. The first region 171a corresponds to the connection region 88 of the drift region 85, and the second region 171b corresponds to the inward region 89 of the drift region 85. The first region 171a and the second region 171b are formed by adjusting the ion implantation energy of the n-type impurity with respect to the semiconductor layer 20.

Figure 18C:
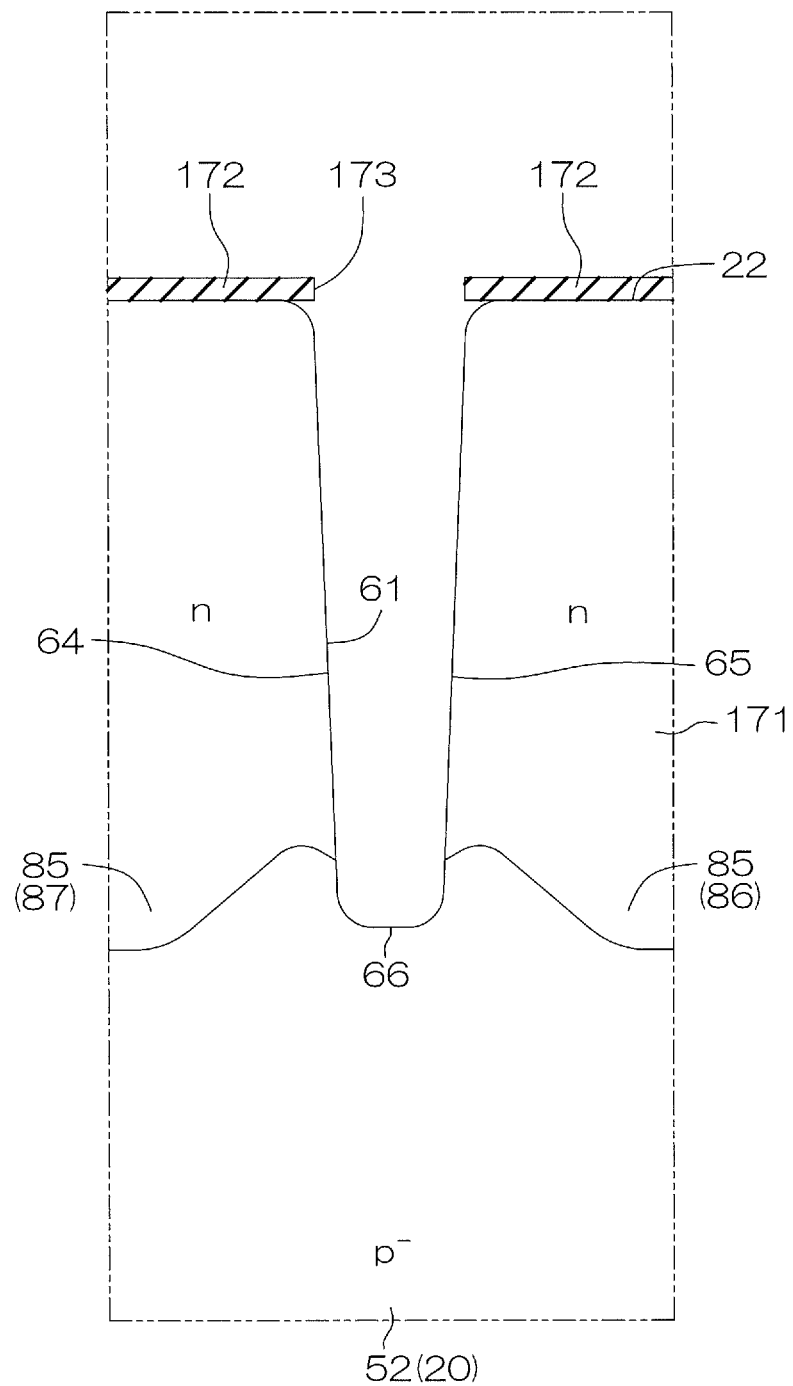
FIG. 18C is an enlarged view showing a step after FIG. 18B.

Next, referring to FIG. 18C, a hard mask 172 having a predetermined pattern is formed on the first main surface 22. The hard mask 172 has an opening 173 (in this embodiment, one opening 173) that exposes a region in which the plurality of gate trenches 61 and the plurality of contact trenches 74 are to be formed in the first main surface 22.

The hard mask 172 may be formed by an oxidation treatment method or by a CVD (Chemical Vapor Deposition) method. The opening 173 of the hard mask 172 may be formed by removing unnecessary portions of the hard mask 172 according to an etching method (for example, dry etching method) through a mask (not shown).

Next, unnecessary portions of the semiconductor layer 20 are removed. The unnecessary portions of the semiconductor layer 20 may be removed by the etching method through the hard mask 172. The etching method may be a wet etching method or a dry etching method.

Hence, the plurality of gate trenches 61 and the plurality of contact trenches 74 are formed in the first main surface 22. Also, the base drift region 171 is divided into the plurality of drift regions 85 by the plurality of gate trenches 61. Also, the first region 171a of the base drift region 171 is formed as the connection region 88, and the second region 171b of the base drift region 171 is formed as the inward region 89. The hard mask 172 is removed thereafter.

Figure 18D:
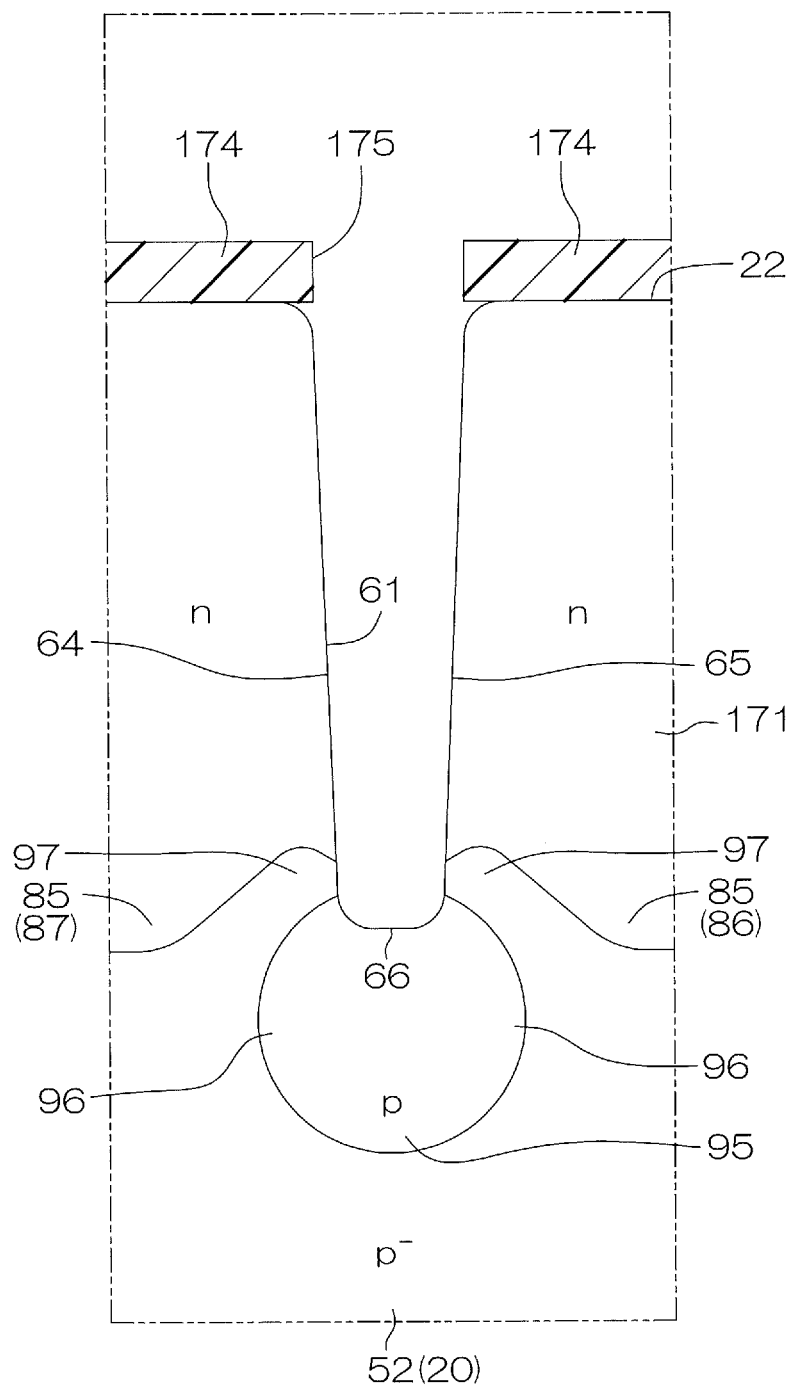
FIG. 18D is an enlarged view showing a step after FIG. 18C.

Next, referring to FIG. 18D, the plurality of high concentration channel regions 95 are formed in regions along the bottom walls 66 of the plurality of gate trenches 61 in the semiconductor layer 20. In this step, an ion implantation mask 174 having a predetermined pattern is first formed on the first main surface 22. The ion implantation mask 174 has a plurality of openings 175 that expose each of the plurality of gate trenches 61.

Next, a p-type impurity is introduced into the bottom walls 66 of the plurality of gate trenches 61 by an ion implantation method through the ion implantation mask 174. Hence, the plurality of high concentration channel regions 95 are formed. Also, the plurality of low concentration channel regions 97 are formed in regions between the plurality of high concentration channel regions 95 and the plurality of drift regions 85.

Figure 18E:
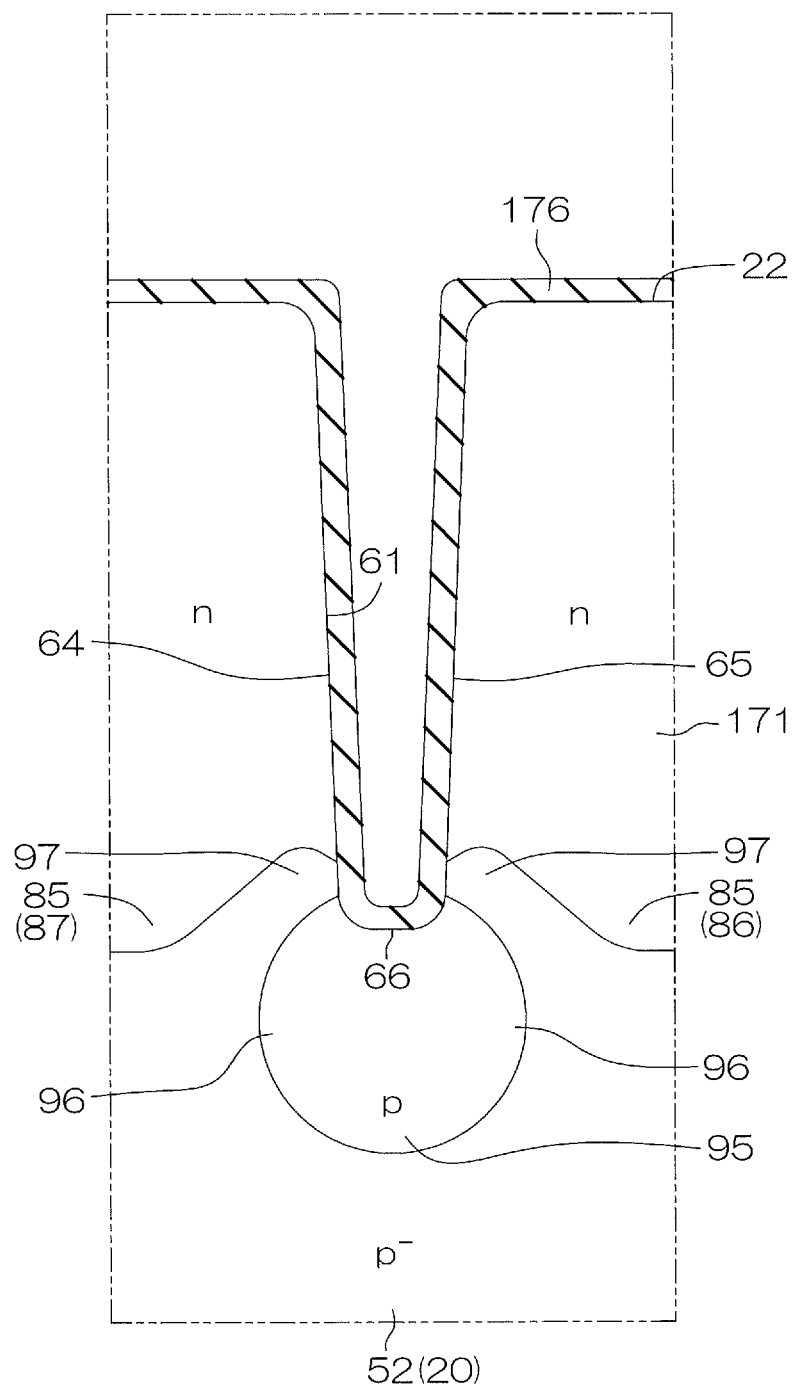
FIG. 18E is an enlarged view showing a step after FIG. 18D.

Next, referring to FIG. 18E, a first base insulation layer 176 that serves as a base of both the gate insulation layer 62 and the contact insulation layer 75 is formed on the first main surface 22. The first base insulation layer 176 is formed in a film shape on the first main surface 22, the inner walls of the plurality of gate trenches 61, and the inner walls of the plurality of contact trenches 74. The first base insulation layer 176 may be formed by an oxidation treatment method or a CVD method.

Figure 18F:
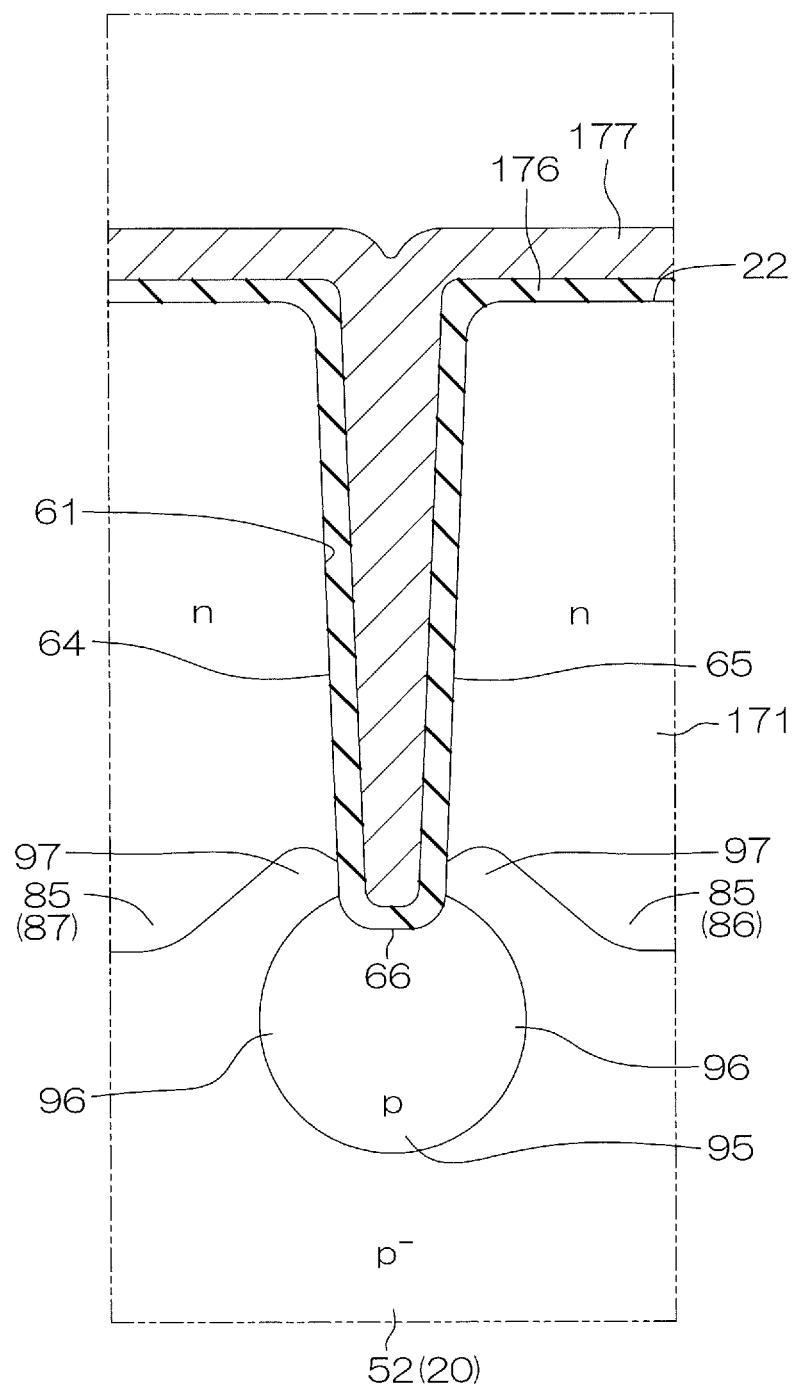
FIG. 18F is an enlarged view showing a step after FIG. 18E.

Next, referring to FIG. 18F, a base conductor layer 177 that serves as a base of the plurality of gate electrodes 63, as a base of the plurality of gate contact electrodes 70, and as a base of the plurality of contact electrodes 76 is formed on the first main surface 22. The base conductor layer 177 is formed in a film shape such as to cover the first main surface 22 by filling the plurality of gate trenches 61 and the plurality of contact trenches 74 therewith. In this embodiment, the base conductor layer 177 includes conductive polysilicon. The base conductor layer 177 may be formed by a CVD method.

Figure 18G:
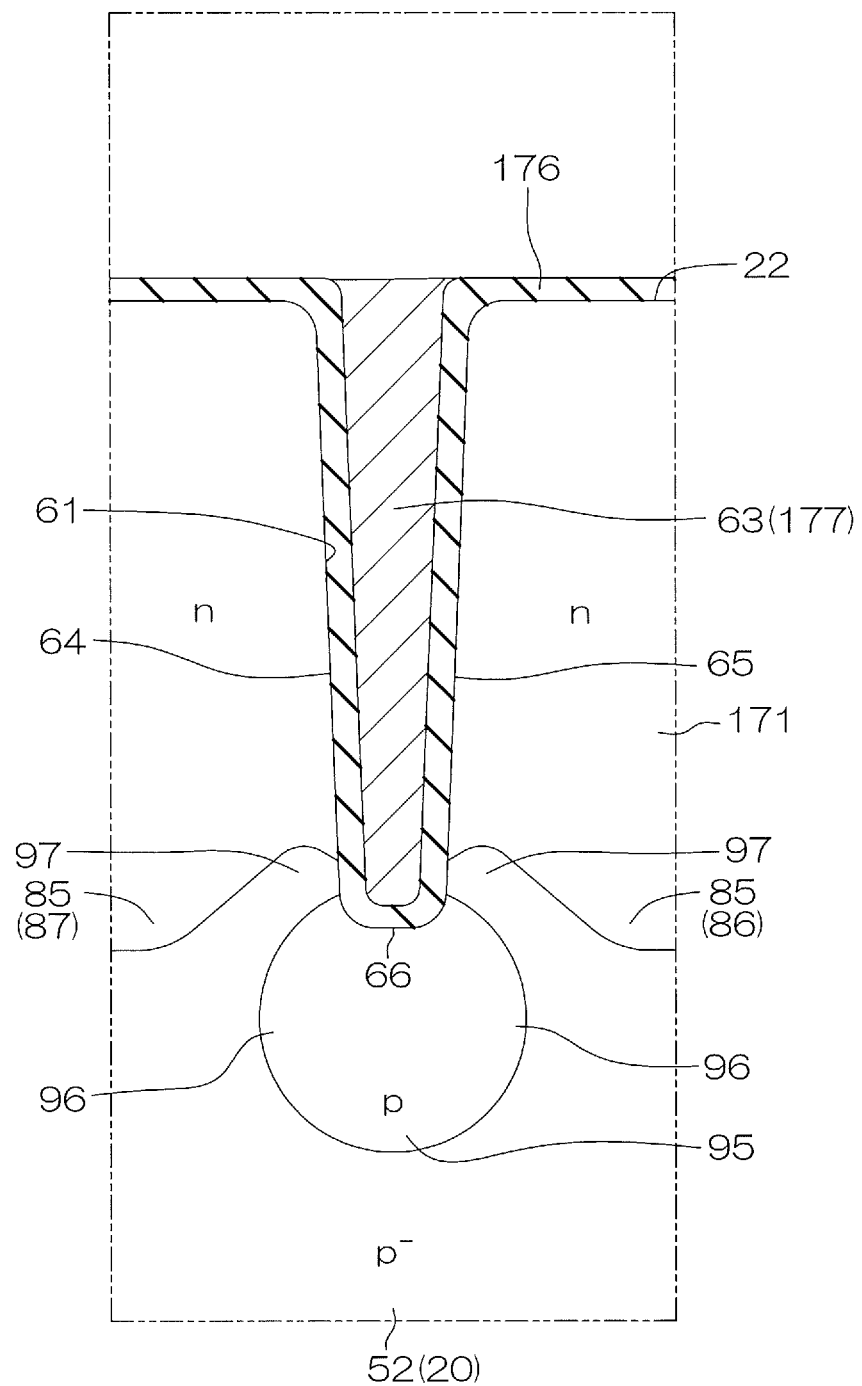
FIG. 18G is an enlarged view showing a step after FIG. 18F.

Next, referring to FIG. 18G, unnecessary portions of the base conductor layer 177 are removed. The unnecessary portions of the base conductor layer 177 are removed until the first base insulation layer 176 is exposed. Hence, the plurality of gate electrodes 63, the plurality of gate contact electrodes 70, and the plurality of contact electrodes 76 are formed.

Figure 18H:
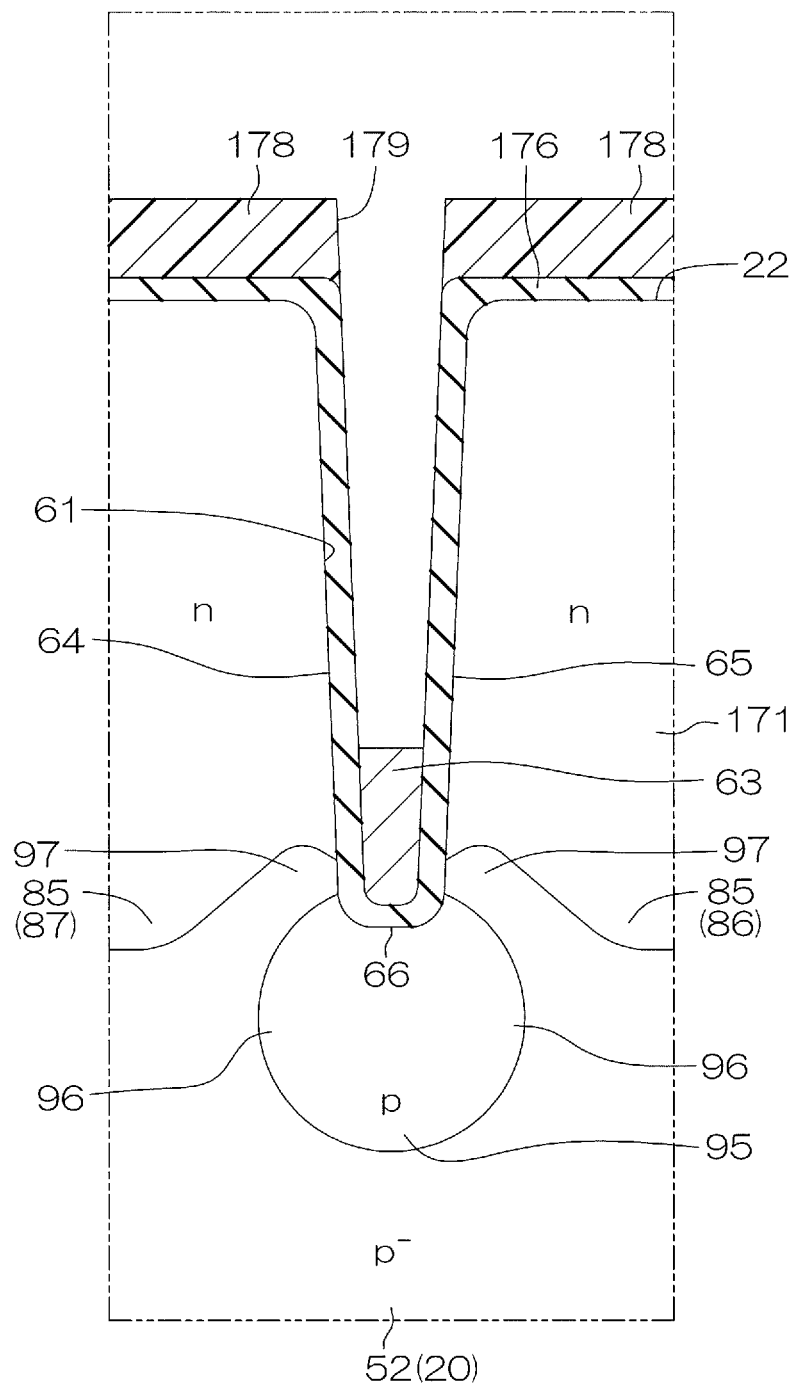
FIG. 18H is an enlarged view showing a step after FIG. 18G.
Figure 18:
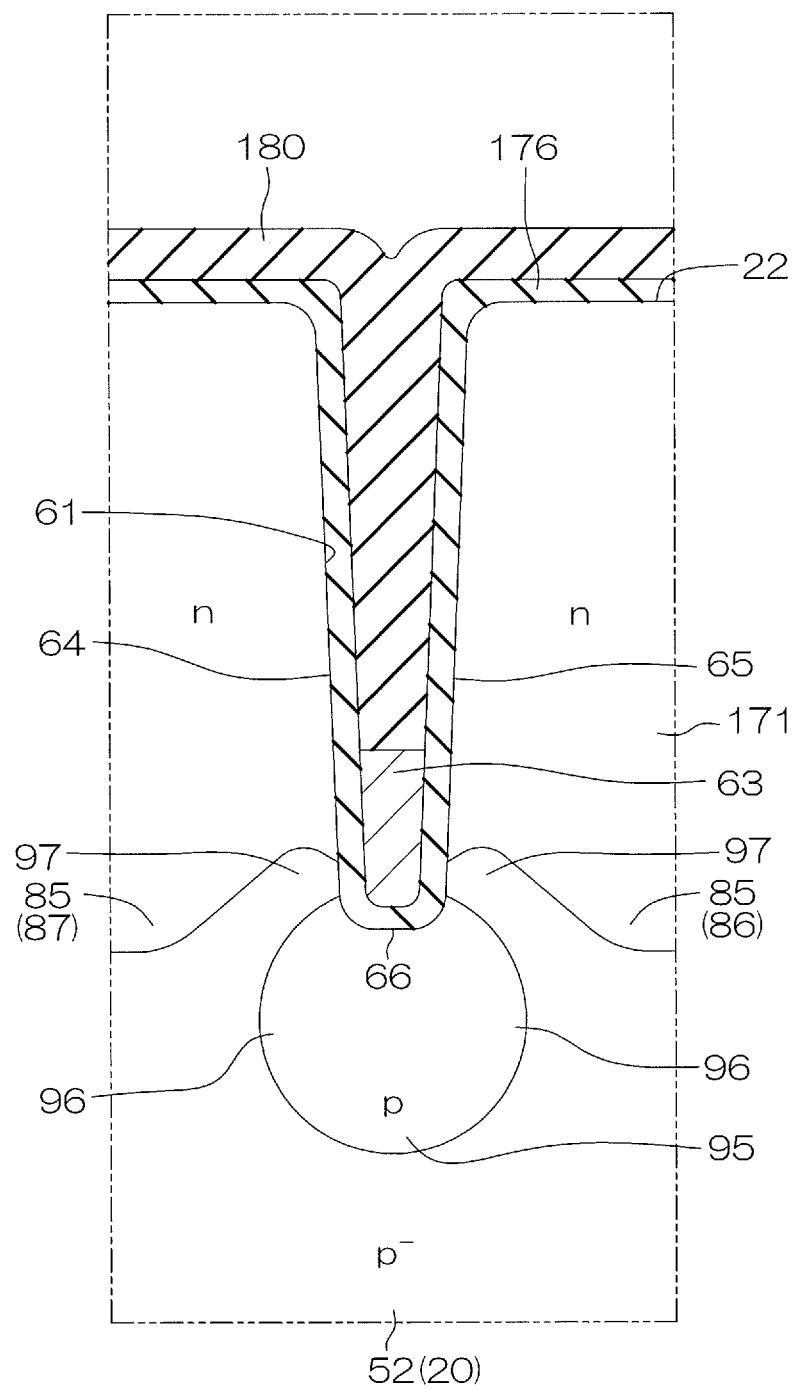
FIG. 18I is an enlarged view showing a step after FIG. 18H.
FIG. 18J is an enlarged view showing a step after FIG. 18I.
FIG. 18K is an enlarged view showing a step after FIG. 18J.
FIG. 18L is an enlarged view showing a step after FIG. 18K.

Next, referring to FIG. 18H, the unnecessary portions of the plurality of gate electrodes 63 are further removed. In this step, a mask 178 having a predetermined pattern is first formed on the first main surface 22. The mask 178 has a plurality of openings 179 that expose a region (i.e., part of the plurality of gate electrodes 63) in which the embedded insulator 69 is to be embedded in the gate trench 61.

Next, the unnecessary portions of each of the gate electrodes 63 are removed by an etching method through the mask 178 (for example, wet etching method). Each of the gate electrodes 63 is removed until an etching surface (upper end portion) is positioned at a halfway portion of each of the gate trenches 61.

Next, referring to FIG. 18I, a second base insulation layer 180 that serves as a base of the embedded insulator 69 is formed on the first main surface 22. The second base insulation layer 180 is formed in a film shape such as to cover the first main surface 22 by filling the plurality of gate trenches 61 therewith. The second base insulation layer 180 may be formed by a CVD method. Preferably, the CVD method is an HDP (High Density Plasma)-CVD method.

Figure 18J:
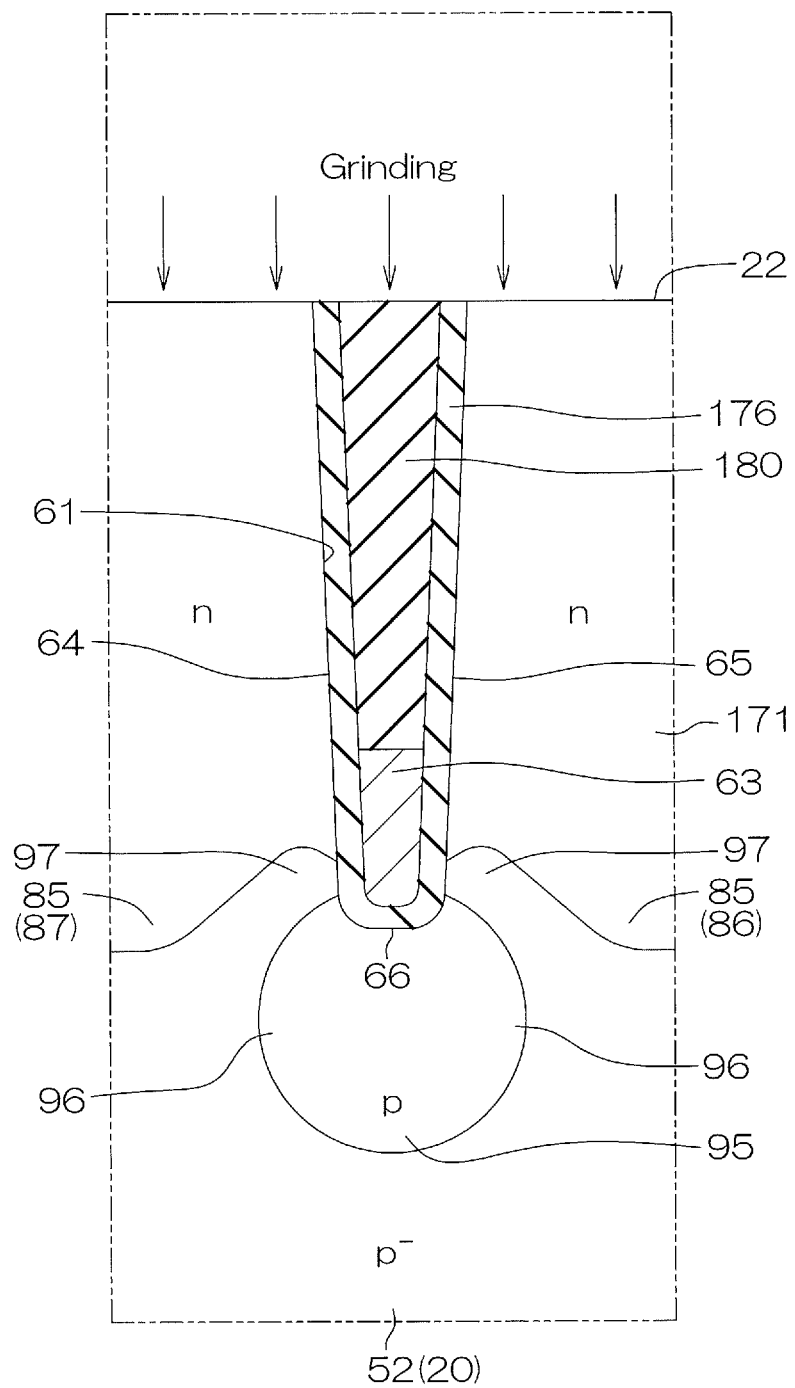

Next, referring to FIG. 18J, unnecessary portions of the second base insulation layer 180 are removed. In this embodiment, unnecessary portions of the first base insulation layer 176 are also removed in addition to the second base insulation layer 180. The unnecessary portions of the first base insulation layer 176 and the unnecessary portions of the second base insulation layer 180 may be removed by an etching method and/or a grinding method, respectively.

In this embodiment, the unnecessary portions of the first base insulation layer 176 and the unnecessary portions of the second base insulation layer 180 are removed by a CMP (Chemical Mechanical Polishing) method that is an example of the grinding method. The unnecessary portions of the first base insulation layer 176 and the unnecessary portions of the second base insulation layer 180 are removed until the first main surface 22 is exposed. Hence, the plurality of embedded insulators 69 are formed in the plurality of gate trenches 61, respectively. Also, the upper end portion of the gate contact electrode 70, the upper end portion of the contact electrode 76 and the upper end portion of the embedded insulator 69 are formed such as to be flush with the first main surface 22.

Figure 18K:
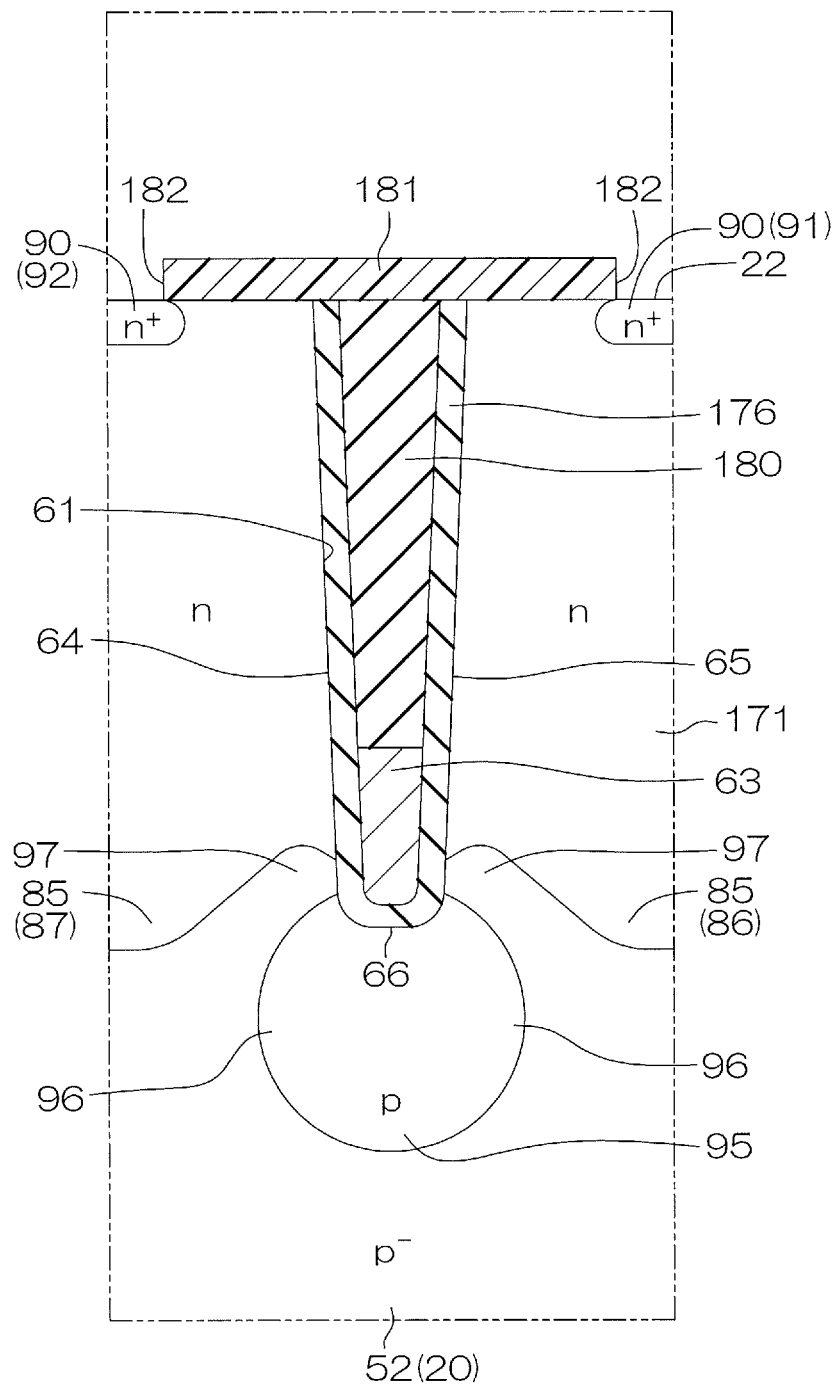

Next, referring to FIG. 18K, the plurality of source/drain regions 90 are each formed at the surface layer portion of the plurality of drift regions 85. In this step, an ion implantation mask 181 having a predetermined pattern is first formed on the first main surface 22. The ion implantation mask 181 has a plurality of openings 182 each of which exposes a region in which the source/drain region 90 is to be formed in the drift region 85.

Next, an n-type impurity is introduced into the surface layer portion of the plurality of drift regions 85 according to an ion implantation method through the ion implantation mask 181. Hence, the plurality of source/drain regions 90 are formed. The ion implantation mask 181 is removed thereafter.

Next, referring to FIG. 18L, the wiring structure is formed on the first main surface 22 of the semiconductor layer 20. A step of forming of the wiring structure 21 includes a step of forming the first insulation layer 105 on the first main surface 22. Also, the step of forming of the wiring structure 21 includes a step of embedding the base lowermost connection electrode 124, the gate lowermost connection electrode 134, the first source/drain lowermost connection electrode 144, and the second source/drain lowermost connection electrode 154 in the first insulation layer 105.

Also, the step of forming of the wiring structure includes a step of forming the base lowermost wiring layer 121, the gate lowermost wiring layer 131, the first source/drain lowermost wiring layer 141, and the second source/drain lowermost wiring layer 151 on the first insulation layer 105. Also, the step of forming of the wiring structure 21 includes a step of forming the second insulation layer 106 on the first insulation layer 105. Also, the step of forming of the wiring structure 21 includes a step of embedding the base intermediate connection electrode 125, the gate intermediate connection electrode 135, the first source/drain intermediate connection electrode 145, and the second source/drain intermediate connection electrode 155 in the second insulation layer 106.

Also, the step of forming of the wiring structure 21 includes a step of forming the base intermediate wiring layer 122, the gate intermediate wiring layer 132, the first source/drain intermediate wiring layer 142, and the second source/drain intermediate wiring layer 152 on the second insulation layer 106. Also, the step of forming of the wiring structure 21 includes a step of forming the third insulation layer 107 on the second insulation layer 106. The step of forming of the wiring structure 21 includes a step of forming the base uppermost wiring layer 123, the gate uppermost wiring layer 133, the first source/drain uppermost wiring layer 143, and the second source/drain uppermost wiring layer 153 on the third insulation layer 107.

Also, the step of forming of the wiring structure 21 includes a step of forming the fourth insulation layer 108 and the fifth insulation layer 109 on the third insulation layer 107. Also, the step of forming of the wiring structure 21 includes a step of forming the base terminal 6, the gate terminal 7, the first source/drain terminal 8, and the second source/drain terminal 9 on the insulation layer 100. The semiconductor device 1 is manufactured through steps including the above.

Figure 19:
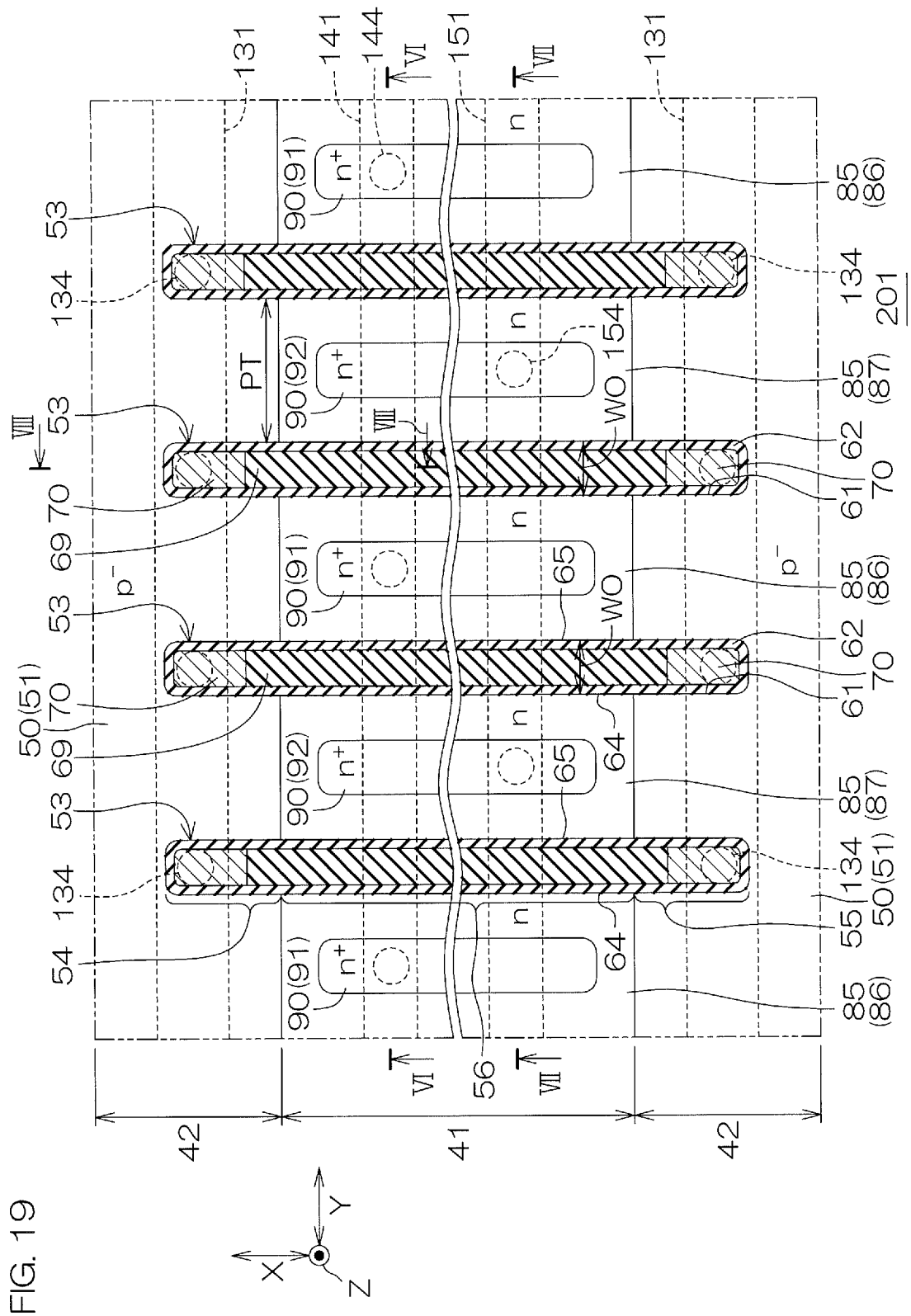
FIG. 19 is a plan view of a region corresponding to FIG. 5, showing a semiconductor device according to a second preferred embodiment of the present invention.

FIG. 19 is a plan view of a region corresponding to FIG. 5, showing a semiconductor device 201 according to a second preferred embodiment of the present invention. The same reference sign is hereinafter given to a structure corresponding to each structure described relative to the semiconductor device 1, and a description of this structure is omitted.

Referring to FIG. 19, the semiconductor device 201 does not include the plurality of trench contact structures 71, and has only the plurality of trench gate structures 53. The gate lowermost connection electrode 134 of the gate wiring 102 is electrically connected to the gate lowermost wiring layer 131 and to the gate contact electrode 70.

As described above, with the semiconductor device 201, it is likewise possible to fulfill the same effect as the effect described relative to the semiconductor device 1.

Figure 20:
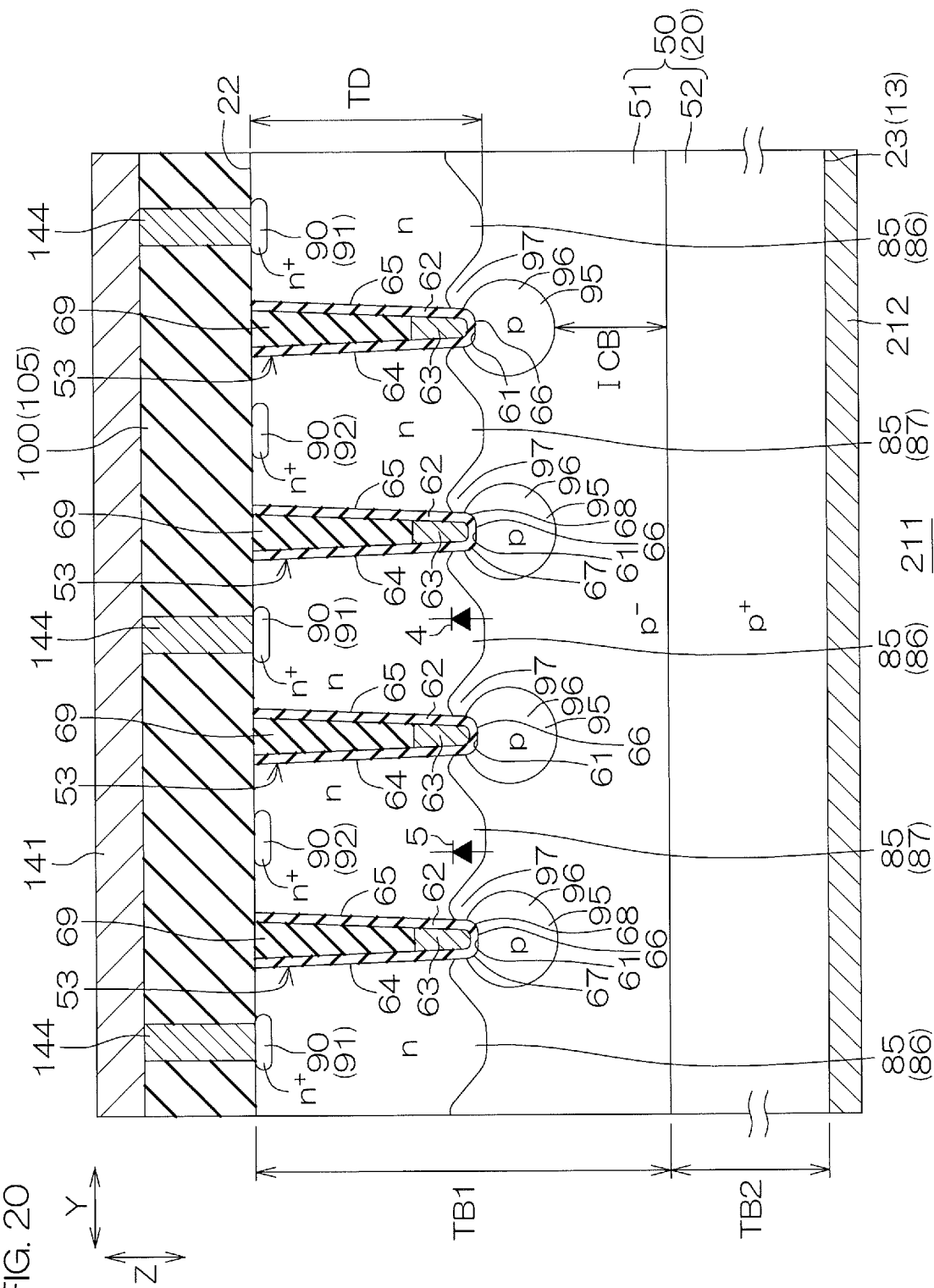
FIG. 20 is a cross-sectional view of a region corresponding to FIG. 6, showing a semiconductor device according to a third preferred embodiment of the present invention.

FIG. 20 is a cross-sectional view of a region corresponding to FIG. 6, showing a semiconductor device 211 according to a third preferred embodiment of the present invention. The same reference sign is hereinafter given to a structure corresponding to each structure described relative to the semiconductor device 1, and a description of this structure is omitted.

Referring to FIG. 20, the semiconductor device 211 includes a base electrode layer 212 formed on the second main surface 23 of the semiconductor layer 20 instead of or in addition to the base wiring 101. The base electrode layer 212 is electrically connected to the second main surface 23. The base electrode layer 212 provides the reference voltage (for example, ground voltage) from the second main surface 23 to the base region 50.

The base electrode layer 212 may include at least one among a Ti layer, an Ni layer, an Au layer, an Ag layer, and an Al layer. The base electrode layer 212 may have a single layer structure including a Ti layer, an Ni layer, an Au layer, an Ag layer, or an Al layer. The base electrode layer 212 may have a laminated structure in which at least two among a Ti layer, an Ni layer, an Au layer, an Ag layer, and an Al layer are laminated together in an arbitrary manner.

As described above, with the semiconductor device 211, it is likewise possible to fulfill the same effect as the effect described relative to the semiconductor device 1.

Figure 21:
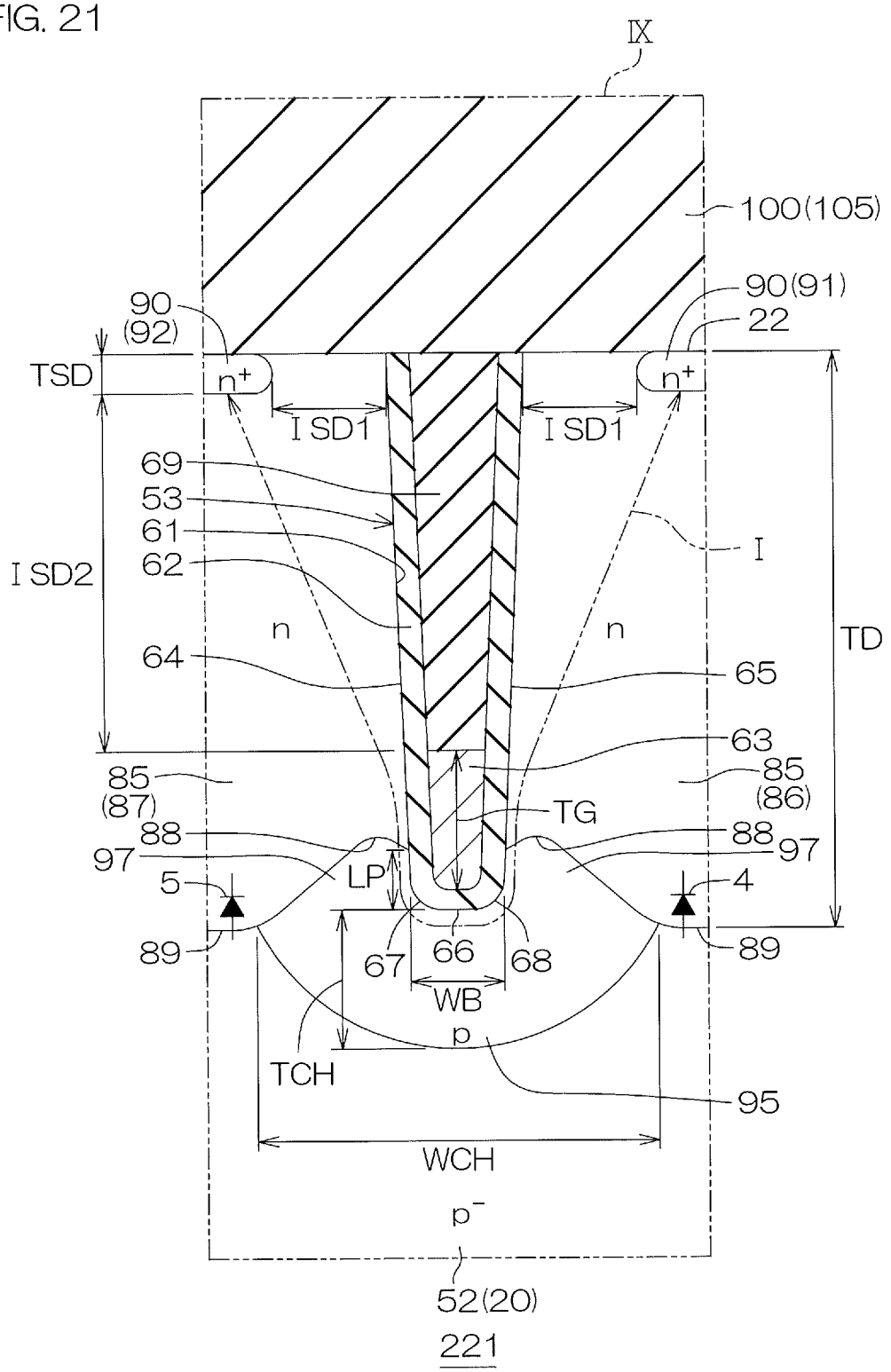
FIG. 21 is an enlarged view of a region corresponding to FIG. 9, showing a semiconductor device according to a fourth preferred embodiment of the present invention.

FIG. 21 is an enlarged view of a region corresponding to FIG. 9, showing a semiconductor device 221 according to a fourth preferred embodiment of the present invention. The same reference sign is hereinafter given to a structure corresponding to each structure described relative to the semiconductor device 1, and a description of this structure is omitted.

Referring to FIG. 21, the semiconductor device 221 includes the high concentration channel region 95 connected to the plurality of drift regions 85. Therefore, the semiconductor device 221 does not have the low concentration channel region 97.

As described above, with the semiconductor device 221, it is possible to fulfill the same effect as the effect described relative to the semiconductor device 1, excluding the effect brought about by the low concentration channel region 97.

Figure 22:
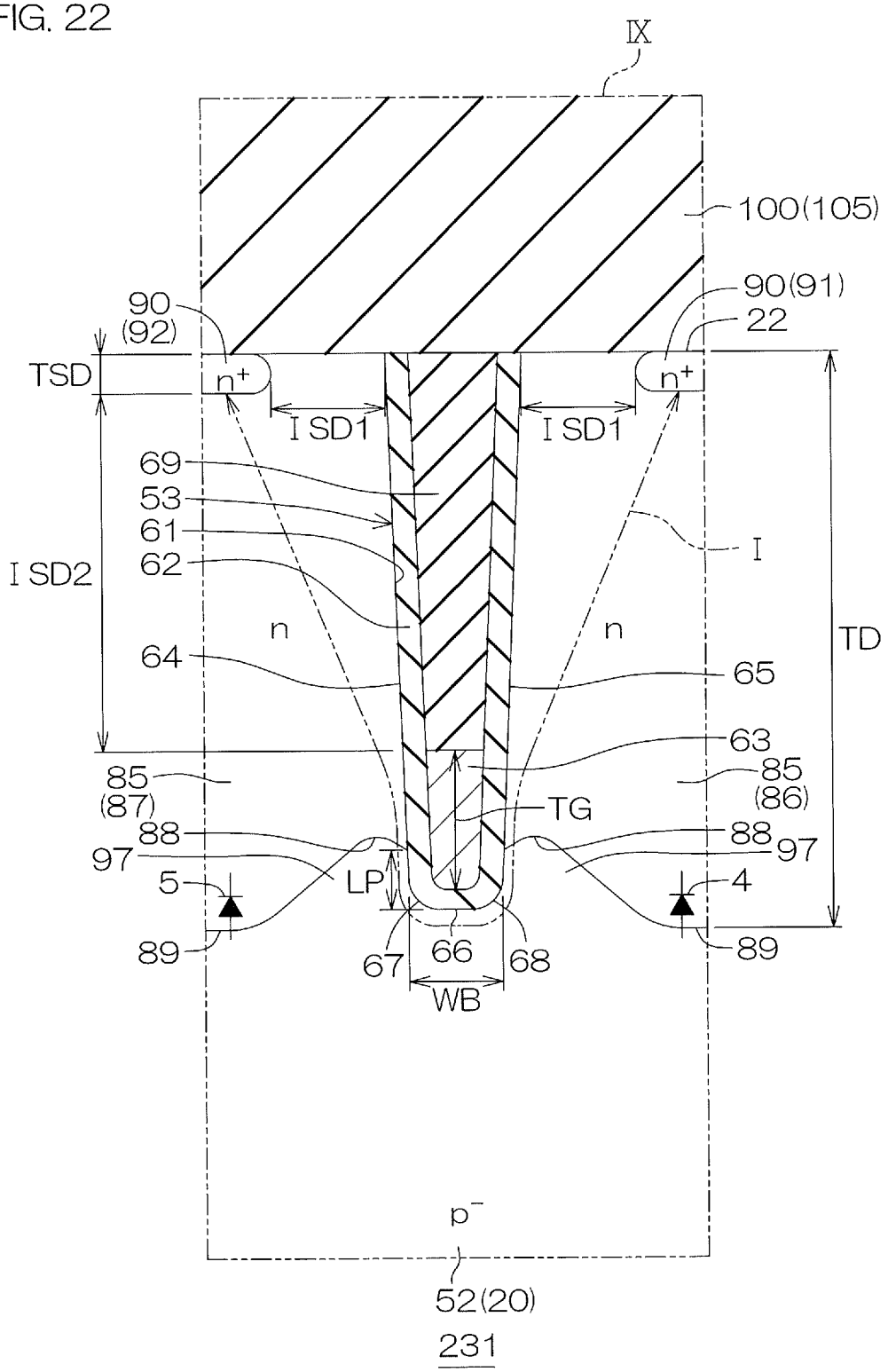
FIG. 22 is an enlarged view of the region corresponding to FIG. 9, showing a semiconductor device according to a fifth preferred embodiment of the present invention.

FIG. 22 is an enlarged view of the region corresponding to FIG. 9, showing a semiconductor device 231 according to a fifth preferred embodiment of the present invention. The same reference sign is hereinafter given to a structure corresponding to each structure described relative to the semiconductor device 1, and a description of this structure is omitted.

Referring to FIG. 22, the semiconductor device 231 does not have a combination structure in which the high concentration channel region 95 and the low concentration channel region 97 are combined. The channel of the MISFET 2 is formed in a region along the gate trench 61 in the low concentration base region 51.

As described above, with the semiconductor device 231, it is possible to fulfill the same effect as the effect described relative to the semiconductor device 1, excluding the effect brought about by the high concentration channel region 95 and the low concentration channel region 97.

Figure 23:
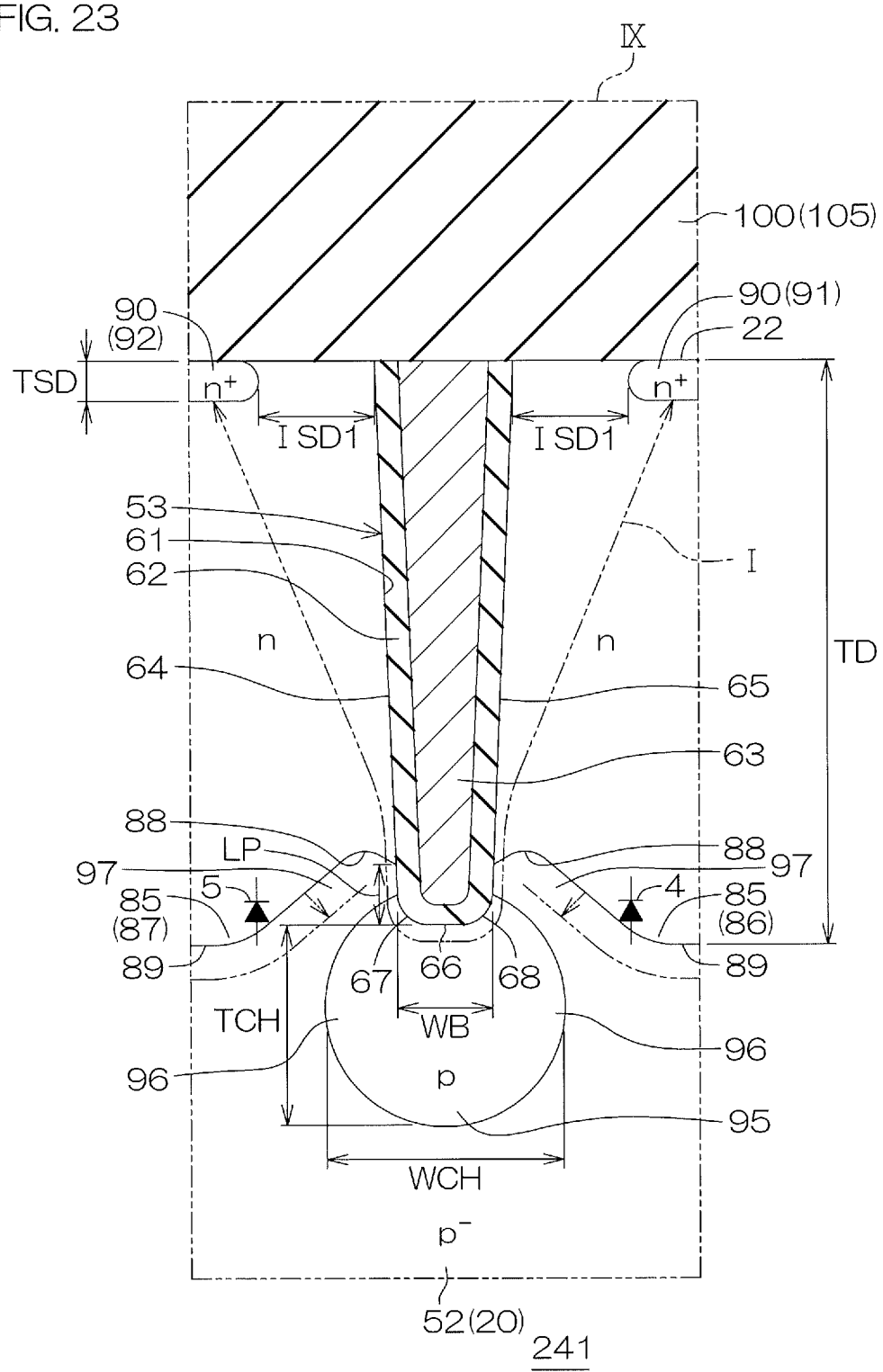
FIG. 23 is an enlarged view of the region corresponding to FIG. 9, showing a semiconductor device according to a sixth preferred embodiment of the present invention.

FIG. 23 is an enlarged view of the region corresponding to FIG. 9, showing a semiconductor device 241 according to a sixth preferred embodiment of the present invention. The same reference sign is hereinafter given to a structure corresponding to each structure described relative to the semiconductor device 1, and a description of this structure is omitted.

Referring to FIG. 23, the semiconductor device 241 includes the gate electrode 63 embedded in the gate trench 61 as an integral object with the gate insulation layer 62 between the gate electrode 63 and the gate trench 61. In other words, the semiconductor device 241 does not have the embedded insulator 69. The upper end portion of the gate electrode 63 is exposed from the first main surface 22 of the semiconductor layer 20. The upper end portion of the gate electrode 63 may be formed such as to be flush with the first main surface 22. The upper end portion of the gate electrode 63 may have a grinding mark. The upper end portion of the gate electrode 63 may be positioned at the bottom wall 66 side of the gate trench 61 with respect to the first main surface 22.

As described above, with the semiconductor device 241, it is possible to fulfill the same effect as the effect described relative to the semiconductor device 1, excluding an electric-field reduction effect between the gate electrode 63 and the source/drain region 90.

Figure 24:
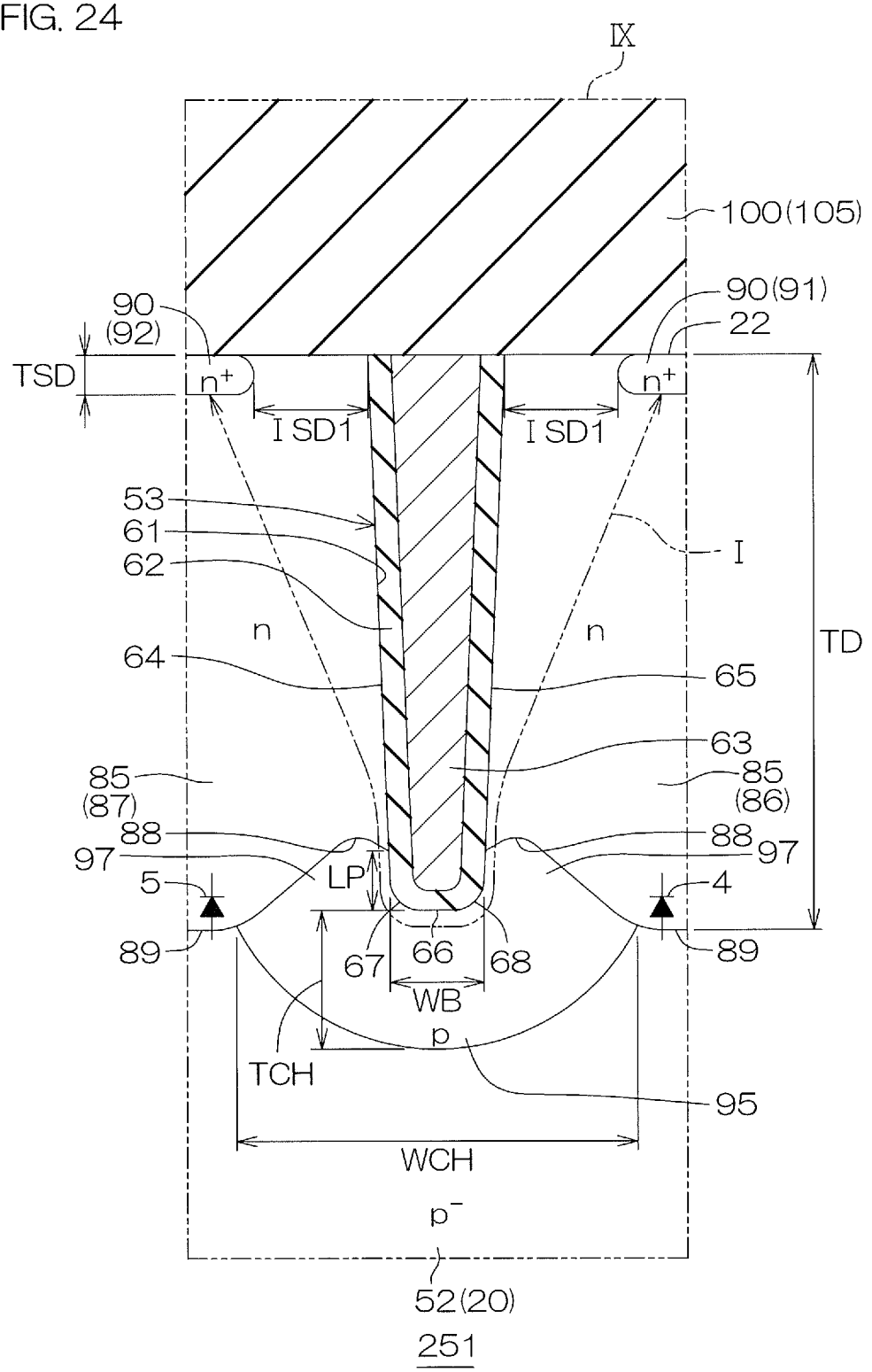
FIG. 24 is an enlarged view of the region corresponding to FIG. 9, showing a semiconductor device according to a seventh preferred embodiment of the present invention.

FIG. 24 is an enlarged view of the region corresponding to FIG. 9, showing a semiconductor device 251 according to a seventh preferred embodiment of the present invention. The same reference sign is hereinafter given to a structure corresponding to each structure described relative to the semiconductor device 1, and a description of this structure is omitted.

Referring to FIG. 24, the semiconductor device 251 includes the gate electrode 63 embedded in the gate trench 61 as an integral object with the gate insulation layer 62 between the gate electrode 63 and the gate trench 61. In other words, the semiconductor device 251 does not have the embedded insulator 69. Also, the semiconductor device 251 includes the high concentration channel region 95 connected to the plurality of drift regions 85. In other words, the semiconductor device 251 does not have the low concentration channel region 97.

The upper end portion of the gate electrode 63 is exposed from the first main surface 22 of the semiconductor layer 20. The upper end portion of the gate electrode 63 may be formed such as to be flush with the first main surface 22. The upper end portion of the gate electrode 63 may have a grinding mark. The upper end portion of the gate electrode 63 may be positioned at the bottom wall 66 side of the gate trench 61 with respect to the first main surface 22.

As described above, with the semiconductor device 251, it is possible to fulfill the same effect as the effect described relative to the semiconductor device 1, excluding the electric-field reduction effect between the gate electrode 63 and the source/drain region 90 and the effect brought about by the low concentration channel region 97.

Figure 25:
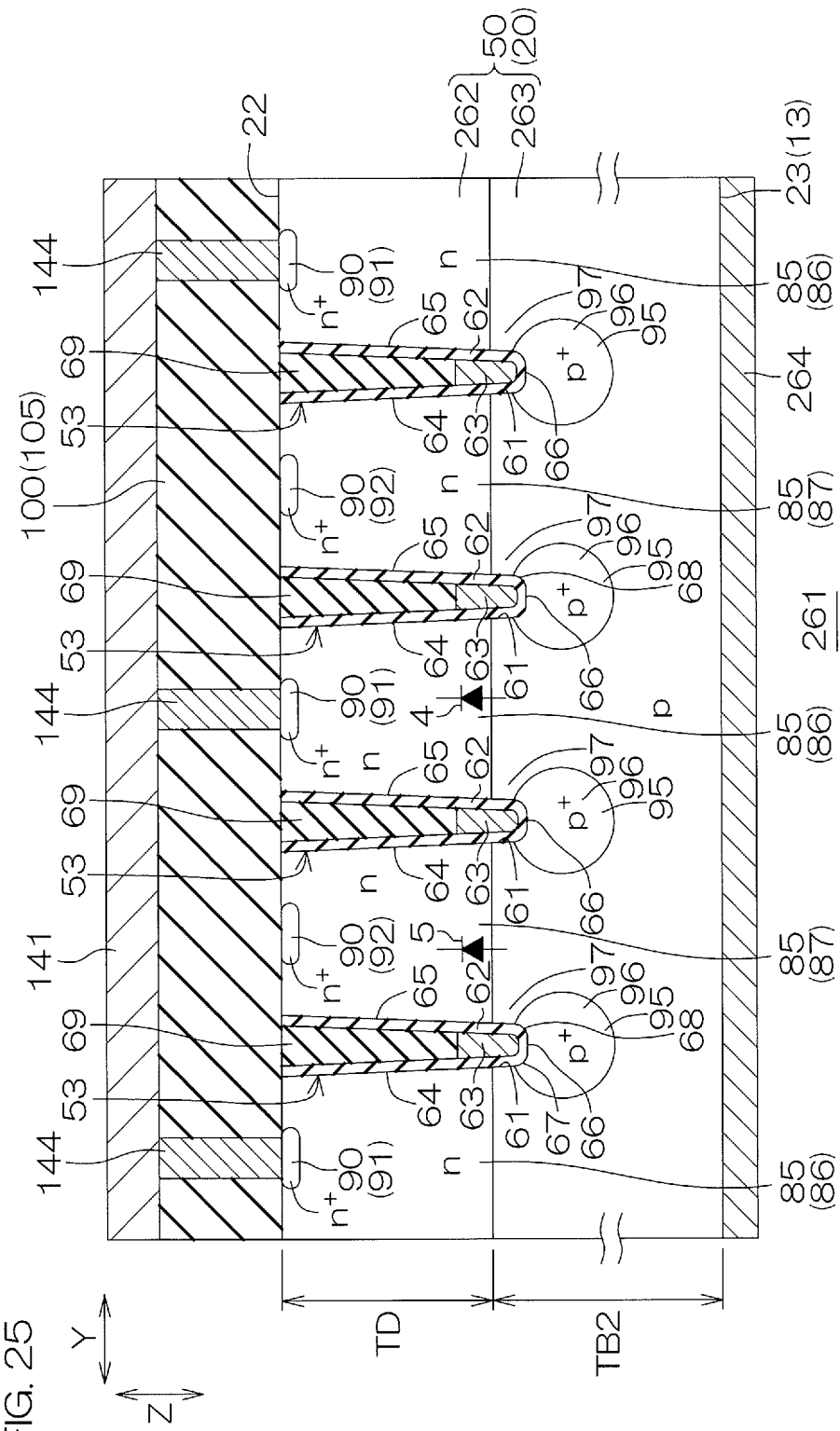
FIG. 25 is a cross-sectional view of the region corresponding to FIG. 6, showing a semiconductor device according to an eighth preferred embodiment of the present invention.

FIG. 25 is a cross-sectional view of the region corresponding to FIG. 6, showing a semiconductor device 261 according to an eighth preferred embodiment of the present invention. The same reference sign is hereinafter given to a structure corresponding to each structure described relative to the semiconductor device 1, and a description of this structure is omitted.

Referring to FIG. 25, the semiconductor layer 20 of the semiconductor device 261 includes an n-type drift region 262 and a p-type base region 263, instead of the base region 50 (the low concentration base region 51 and the high concentration base region 52).

The drift region 262 is a region corresponding to the drift region 85 of the semiconductor device 1. The drift region 262 is formed in a region at the first main surface 22 side of the semiconductor layer 20. The drift region 262 is exposed from the first main surface 22 and the side surfaces 24A to 24D. An n-type impurity concentration of the drift region 262 may be not less than $5 \times 10^{15}$ cm$^{-3}$ and not more than $5 \times 10^{16}$ cm$^{-3}$. In this embodiment, the n-type impurity concentration of the drift region 262 is about $8 \times 10^{15}$ cm$^{-3}$. Preferably, the drift region 262 includes phosphorus that is an example of the n-type impurity.

The thickness TD of the drift region 262 may be not less than 0.4 μm and less than 2 μm. The thickness TD may be not less than 0.4 μm and not more than 0.6 μm, not less than 0.6 μm and not more than 0.8 μm, not less than 0.8 μm and not more than 1 μm, not less than 1 μm and not more than 1.2 μm, not less than 1.2 μm and not more than 1.4 μm, not less than 1.4 μm and not more than 1.6 μm, not less than 1.6 μm and not more than 1.8 μm, or not less than 1.8 μm and less than 2 μm.

The base region 263 is formed in a region at the second main surface 23 side of the semiconductor layer 20 with respect to the drift region 262. The boundary between the base region 263 and the drift region 262 extends in parallel with the first main surface 22. The base region 263 is exposed from the second main surface 23 and the side surfaces 24A to 24D of the semiconductor layer 20. A p-type impurity concentration of the base region 263 may be not less than $5 \times 10^{14}$ cm$^{-3}$ and not more than $5 \times 10^{16}$ cm$^{-3}$. In this embodiment, the p-type impurity concentration of the base region 263 is about $8 \times 10^{15}$ cm$^{-3}$. The base region 263 may include boron that is an example of the p-type impurity.

The base region 263 may have a thickness of not less than 50 µm and not more than 500 µm. The thickness of the base region 263 may be not less than 50 µm and not more than 100 µm, not less than 100 µm and not more than 150 µm, not less than 150 µm and not more than 200 µm, not less than 200 µm and not more than 250 µm, not less than 250 µm and not more than 300 µm, not less than 300 µm and not more than 350 µm, not less than 350 µm and not more than 400 µm, not less than 400 µm and not more than 450 µm, or not less than 450 µm and not more than 500 µm.

In this embodiment, the drift region 262 is formed by an n-type epitaxial layer. In this embodiment, the base region 263 is formed by a p-type semiconductor substrate.

The plurality of gate trenches 61 and the plurality of contact trenches 74 are formed in the first main surface 22 such as to pass through the drift region 262 and reach the base region 263. The plurality of source/drain regions 90 are each formed at the surface layer portion of the drift region 262 in a region between the plurality of gate trenches 61 that adjoin each other.

The high concentration channel region 95 is formed in a region along the bottom wall 66 of the gate trench 61 such as to face the gate electrode 63 with the gate insulation layer 62 between the high concentration channel region 95 and the gate electrode 63 in the base region 263. A p-type impurity concentration of the high concentration channel region 95 may be not less than $5 \times 10^{16}$ cm$^{-3}$ and not more than $5 \times 10^{18}$ cm$^{-3}$. In this embodiment, the p-type impurity concentration of the high concentration channel region 95 is about $1 \times 10^{17}$ cm$^{-3}$. The high concentration channel region 95 may include boron that is a p-type impurity.

The low concentration channel region 97 is formed in a region between the drift region 262 and the high concentration channel region 95 in the base region 263. The p-type impurity concentration of the low concentration channel region 97 may be not less than $5 \times 10^{14}$ cm$^{-3}$ and not more than $5 \times 10^{16}$ cm$^{-3}$. In this embodiment, a p-type impurity concentration of the low concentration channel region 97 is about $8 \times 10^{15}$ cm$^{-3}$. The low concentration channel region 97 may include boron that is an example of the p-type impurity.

In this embodiment, the low concentration channel region 97 is formed by using a part of the base region 263. The low concentration channel region 97 may have the p-type impurity concentration that is equal to or more than the p-type impurity concentration of the base region 263 by including the p-type impurity that has diffused from the high concentration channel region 95.

The semiconductor device 261 includes a base electrode layer 264 formed on the second main surface 23 instead of the base wiring 101. The base electrode layer 264 is electrically connected to the second main surface 23. The base electrode layer 264 provides a reference voltage (for example, ground voltage) from the second main surface 23 side to the base region 50.

The base electrode layer 264 may include at least one among a Ti layer, an Ni layer, an Au layer, an Ag layer, and an Al layer. The base electrode layer 264 may have a single layer structure including a Ti layer, an Ni layer, an Au layer, an Ag layer, or an Al layer. The base electrode layer 264 may have a laminated structure in which at least two among a Ti layer, an Ni layer, an Au layer, an Ag layer, and an Al layer are laminated together in an arbitrary manner.

As described above, with the semiconductor device 261, it is likewise possible to fulfill the same effect as the effect described relative to the semiconductor device 1.

Figure 26:
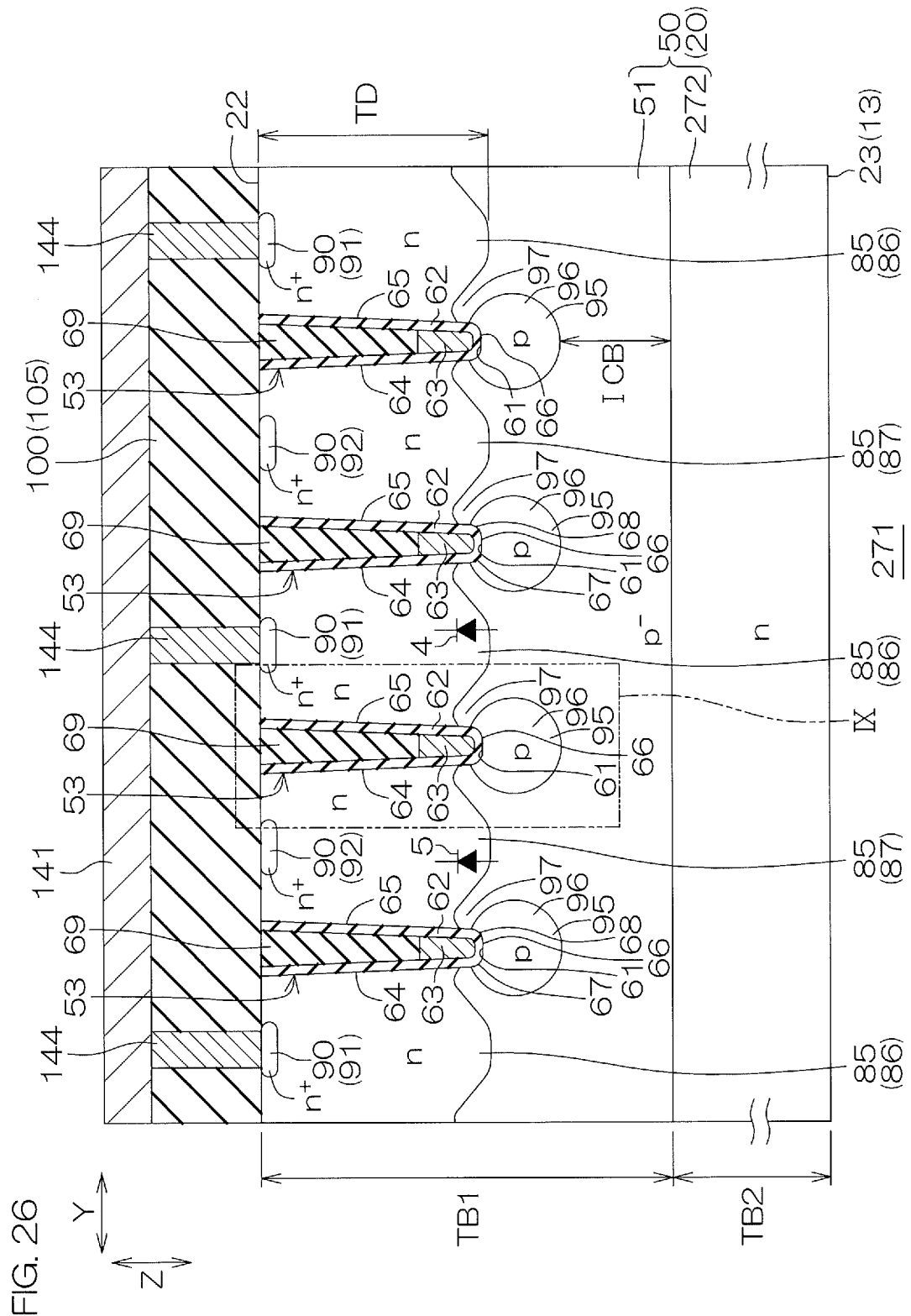
FIG. 26 is a cross-sectional view of the region corresponding to FIG. 6, showing a semiconductor device according to a ninth preferred embodiment of the present invention.

FIG. 26 is a cross-sectional view of a region corresponding to FIG. 6, showing a semiconductor device 271 according to a ninth preferred embodiment of the present invention. The same reference sign is hereinafter given to a structure corresponding to each structure described relative to the semiconductor device 1, and a description of this structure is omitted.

Referring to FIG. 26, the semiconductor layer 20 of the semiconductor device 271 includes an n-type impurity region 272 instead of the high concentration base region 52. The impurity region 272 is formed in a region at the second main surface 23 side of the semiconductor layer 20 with respect to the low concentration base region 51. The impurity region 272 is exposed from the second main surface 23 and the side surfaces 24A to 24D of the semiconductor layer 20. The boundary between the low concentration base region 51 and the impurity region 272 extends in parallel with the first main surface 22 of the semiconductor layer 20.

An n-type impurity concentration of the impurity region 272 may be not less than $1 \times 10^{15}$ cm$^{-3}$ and not more than $1 \times 10^{21}$ cm$^{-3}$. The n-type impurity concentration of the impurity region 272 is arbitrary. The impurity region 272 may include arsenic or phosphorus that is an example of the n-type impurity.

The impurity region 272 may have a thickness of not less than 50 µm and not more than 500 µm. The thickness of the impurity region 272 may be not less than 50 µm and not more than 100 µm, not less than 100 µm and not more than 150 µm, not less than 150 µm and not more than 200 µm, not less than 200 µm and not more than 250 µm, not less than 250 µm and not more than 300 µm, not less than 300 µm and not more than 350 µm, not less than 350 µm and not more than 400 µm, not less than 400 µm and not more than 450 µm, or not less than 450 µm and not more than 500 µm.

In this embodiment, the low concentration base region 51 is formed by a p$^-$-type epitaxial layer. In this embodiment, the impurity region 272 is formed by an n-type semiconductor substrate.

As described above, with the semiconductor device 271, it is likewise possible to fulfill the same effect as the effect described relative to the semiconductor device 1.

Although the preferred embodiments of the present invention have been described as above, the present invention can be embodied in yet other forms.

In the embodiments having the structure in which the embedded insulator 69 is embedded in the gate trench 61 with the gate insulation layer 62 between the embedded insulator 69 and the gate trench 61, the gate insulation layer 62 interposed between the embedded insulator 69 and the gate trench 61 may be removed. In other words, the embedded insulator 69 may be embedded in the gate trench 61 without the gate insulation layer 62 sandwiched therebetween. In this case, the drift region 85 is formed at the surface layer portion of the semiconductor layer 20 such as to come into contact with the embedded insulator 69 that is exposed from the first sidewall 64 and the second sidewall 65 of the gate trench 61.

In each of the embodiments, the structure in which the conductivity type of each semiconductor portion is reversed may be employed. In other words, the p-type portion may be formed such as to be the n-type, and the n-type portion may be formed such as to be the p-type.

With each of the embodiments, an example where the semiconductor layer 20 made of silicon is employed was described. However, in each of the embodiments, the semiconductor layer 20 made of a wide bandgap semiconductor may be employed. The semiconductor layer 20 may be made of SiC (silicon carbide) that is an example of the wide bandgap semiconductor. The semiconductor layer 20 may be an SiC monocrystal that is a hexagonal crystal.

The hexagonal SiC monocrystal has a plurality of polytypes that include 2H (Hexagonal)-SiC monocrystal, 4H—SiC monocrystal, and 6H—SiC monocrystal in accordance with the cycle of the atomic arrangement. Preferably, the semiconductor layer 20 is made of a 4H—SiC monocrystal among the plurality of polytypes.

In this case, preferably, the first main surface 22 of the semiconductor layer 20 is formed by a (0001)-plane (silicon plane) of the SiC monocrystal, and the second main surface 23 of the semiconductor layer 20 is formed by a (000-1)-plane (carbon plane) of the SiC monocrystal. Of course, the first main surface 22 may be formed by the (000-1)-plane, and the second main surface 23 may be formed by the (0001)-plane. The (0001)-plane and the (000-1)-plane of the SiC monocrystal are each referred to as a c-plane. The normal direction Z of the c-plane of the SiC monocrystal is referred to as a c-axis ([0001] direction).

The first main surface 22 and the second main surface 23 of the semiconductor layer 20 may have an off angle θ in which the main surfaces are inclined in a [11-20]-direction at an angle of 10° or less with respect to the c-plane of the SiC monocrystal. In this case, the normal direction Z of the semiconductor layer 20 is inclined by an off angle θ with respect to the c-axis of the SiC monocrystal.

The off angle θ may be not less than 0° and not more than 5.0°. The off angle θ may be set within an angle range of not less than 0° and not more than 1.0°, not less than 1.0° and not more than 1.5°, not less than 1.5° and not more than 2.0°, not less than 2.0° and not more than 2.5°, not less than 2.5° and not more than 3.0°, not less than 3.0° and not more than 3.5°, not less than 3.5° and not more than 4.0°, not less than 4.0° and not more than 4.5°, or not less than 4.5° and not more than 5.0°. Preferably, the off angle θ exceeds 0°. The off angle θ may be less than 4.0°.

The off angle θ may be set within an angle range of not less than 3.0° and not more than 4.5°. In this case, preferably, the off angle θ is set within an angle range of not less than 3.0° and not more than 3.5° or of not less than 3.5° and not more than 4.0°. The off angle θ may be set within an angle range of not less than 1.5° and not more than 3.0°. In this case, preferably, the off angle θ is set within an angle range of not less than 1.5° and not more than 2.0° or of not less than 2.0° and not more than 2.5°.

Preferably, the plurality of trench gate structures 53 are each formed in a band shape extending in an m-axis direction of the SiC monocrystal, and are formed with intervals between the trench gate structures 53 in an a-axis direction of the SiC monocrystal. Of course, the plurality of trench gate structures 53 may be each formed in a band shape extending in the a-axis direction of the SiC monocrystal, and may be formed with intervals between the trench gate structures 53 in the m-axis direction of the SiC monocrystal. The m-axis direction is a [1-100]-direction and a [−1100]-direction of the SiC monocrystal. The a-axis direction is a [11-20]-direction and a [−1-120]-direction of the SiC monocrystal.

With each of the aforementioned preferred embodiments, an example where the semiconductor devices 1, 211, 221, 231, 241, 251, 261, and 271 are each a device of a wafer level chip size package was described. However, the semiconductor devices 1, 211, 221, 231, 241, 251, 261, and 271 are not necessarily required to be a device of a wafer level chip size package, and may be designed and changed to forms corresponding to various semiconductor packages.

SOP (Small Outline Package), TO (Transistor Outline), QFN (Quad For Non Lead Package), DFP (Dual Flat Package), DIP (Dual Inline Package), QFP (Quad Flat Package), SIP (Single Inline Package, or SOJ (Small Outline J-leaded Package) or various forms similar to these packages can be mentioned as the semiconductor package.

This description does not impose limitations on any combination form of features shown in the first to ninth preferred embodiments. The first to ninth preferred embodiments can be combined together in an arbitrary manner and in an arbitrary form among the preferred embodiments. In other words, a semiconductor device may be employed in which features shown in the first to ninth preferred embodiments are combined together in an arbitrary manner and in an arbitrary form.

Features extracted from this description and the drawings will be hereinafter shown.

[A1] A semiconductor device comprising: a semiconductor layer that has a main surface, a trench gate structure that includes a trench formed in the main surface and having a first sidewall at one side, a second sidewall at the other side and a bottom wall in a cross-sectional view, an insulation layer formed on an inner wall of the trench, and a gate electrode embedded in the trench with the insulation layer between the trench and the gate electrode and having an upper end portion positioned at a bottom-wall side with respect to the main surface, a plurality of first-conductivity-type drift regions that are respectively formed in a region at the first sidewall side of the trench and in a region at the second sidewall side of the trench such as to face each other with the trench interposed therebetween in a surface layer portion of the main surface and that are positioned in a region at the main surface side with respect to the bottom wall, and a plurality of first-conductivity-type source/drain regions that are formed in surface layer portions of the plurality of drift regions, respectively.

With this semiconductor device, it is possible to reduce an electric field strength generated between the gate electrode and each of the source/drain regions. This makes it possible to suppress an electric-field concentration to the trench gate structure. As a result, it is possible to provide a semiconductor device capable of improving a withstand voltage.

[A2] The semiconductor device according to A1, wherein the plurality of source/drain regions are formed in regions at the main surface sides with respect to the upper end portion of the gate electrode.

[A3] The semiconductor device according to A1 or A2, wherein the trench gate structure includes an embedded insulator that is embedded in a region on the upper end portion of the gate electrode in the trench.

[A4] The semiconductor device according to A3, wherein the plurality of source/drain regions face the embedded insulator in a direction along the main surface of the semiconductor layer.

[A5] The semiconductor device according to any one of A1 to A4, wherein the upper end portion of the gate electrode is positioned at the bottom-wall side of the trench with respect to an intermediate portion of the trench.

[A6] The semiconductor device according to any one of A1 to A5, further comprising: a second-conductivity-type base region that is formed in a region below the plurality of drift regions in the semiconductor layer, and a second-conductivity-type high concentration channel region that is formed in a region along the bottom wall of the trench in the semiconductor layer such as to face the gate electrode with the insulation layer interposed therebetween and that has a second-conductivity-type impurity concentration exceeding a second-conductivity-type impurity concentration of the base region.

[A7] The semiconductor device according to A6, wherein the high concentration channel region is formed at a distance from the plurality of drift regions.

[A8] The semiconductor device according to A7, further comprising: a second-conductivity-type low concentration channel region that is interposed in a region between the plurality of drift regions and the high concentration channel region in the semiconductor layer and that has a second-conductivity-type impurity concentration less than the second-conductivity-type impurity concentration of the high concentration channel region.

[A9] The semiconductor device according to any one of A6 to A8, wherein the gate electrode has a lower end portion positioned at the bottom-wall side of the trench with respect to the plurality of drift regions, and the high concentration channel region faces the lower end portion of the gate electrode with the insulation layer interposed therebetween.

[A10] A semiconductor device comprising: a semiconductor layer that has a main surface, a trench gate structure that includes a trench formed in the main surface and having a first sidewall, a second sidewall and a bottom wall in a cross-sectional view, an insulation layer formed on an inner wall of the trench, and a gate electrode that is embedded in the trench with the insulation layer between the trench and the gate electrode, a plurality of first-conductivity-type drift regions that are respectively formed in a region at the first sidewall side of the trench and in a region at the second sidewall side of the trench such as to face each other with the trench interposed therebetween in a surface layer portion of the main surface and that are positioned in a region at the main surface side with respect to the bottom wall, a plurality of first-conductivity-type source/drain regions that are formed in surface layer portions of the plurality of drift regions, respectively, a second-conductivity-type base region that is formed in a region below the plurality of drift regions in the semiconductor layer, and a second-conductivity-type high concentration channel region that is formed in a region along the bottom wall of the trench such as to face the gate electrode with the insulation layer interposed therebetween and that has a second-conductivity-type impurity concentration exceeding a second-conductivity-type impurity concentration of the base region.

With this semiconductor device, the high concentration channel region is capable of preventing depletion layers spreading from the plurality of drift regions from overlapping each other at the bottom wall of the trench. This makes it possible to suppress punch-through. As a result, it is possible to provide a semiconductor device capable of improving a withstand voltage.

[A11] The semiconductor device according to A10, wherein the high concentration channel region is formed at a distance from the plurality of drift regions.

[A12] The semiconductor device according to A10 or A11, further comprising: a second-conductivity-type low concentration channel region that is interposed in a region between the plurality of drift regions and the high concentration channel region in the semiconductor layer and that has a second-conductivity-type impurity concentration less than the second-conductivity-type impurity concentration of the high concentration channel region.

[A13] The semiconductor device according to any one of A10 to A12, wherein the plurality of drift regions are formed in a region of the main surface of the semiconductor layer with respect to a lower end portion of the gate electrode, and the high concentration channel region faces the lower end portion of the gate electrode with the insulation layer interposed therebetween.

[A14] The semiconductor device according to any one of A1 to A13, wherein the plurality of source/drain regions are formed at a distance from the trench.

[A15] The semiconductor device according to any one of A1 to A14, wherein the plurality of source/drain regions have a first-conductivity-type impurity concentration exceeding a first-conductivity-type impurity concentration of the plurality of drift regions.

[A16] The semiconductor device according to any one of A1 to A15, wherein the plurality of source/drain regions include a first-conductivity-type impurity that differs from a first-conductivity-type impurity of the plurality of drift regions.

[A17] The semiconductor device according to any one of A1 to A16, wherein the plurality of source/drain regions include a first-conductivity-type impurity that has a diffusion coefficient less than a diffusion coefficient of the first-conductivity-type impurity of the plurality of drift regions.

[A18] The semiconductor device according to any one of A1 to A17, wherein the trench extends in a band shape in plan view.

[A19] The semiconductor device according to any one of A1 to A18, wherein the trench is formed in a tapered shape in a cross-sectional view.

[A20] The semiconductor device according to any one of A1 to A19, wherein the semiconductor layer is made of silicon or of silicon carbide.

This application corresponds to Japanese Patent Application No. 2019-021005 filed in the Japan Patent Office on Feb. 7, 2019, the entire disclosure of which is incorporated herein by reference. Although the preferred embodiments of the present invention have been described in detail, these are merely concrete examples used to clarify the technical contents of the present invention, and the present invention should not be understood by being limited to these concrete examples, and the scope of the present invention is limited solely by the appended Claims.

REFERENCE SIGNS LIST 1 semiconductor device
20 semiconductor layer
22 first main surface
50 base region
53 trench gate structure
61 gate trench
62 gate insulating layer
63 gate electrode
64 first sidewall
65 second sidewall
66 bottom wall
69 buried insulator (buried object)

85 drift region
90 source/drain region
95 high concentration channel region
97 low concentration channel region
211 semiconductor device
221 semiconductor device
231 semiconductor device
241 semiconductor device
251 semiconductor device
261 semiconductor device
271 semiconductor device

The invention claimed is:

1. A semiconductor device comprising:
a semiconductor layer that has a main surface;
a trench gate structure that includes a trench formed in the main surface and having a first sidewall at one side, a second sidewall at the other side and a bottom wall, the trench having a minimum width between lower ends of the first sidewall and second sidewall in a cross-sectional view, an insulation layer formed on an inner wall of the trench, and a gate electrode embedded in the trench with the insulation layer between the trench and the gate electrode and having an upper end portion positioned at a bottom-wall side with respect to the main surface;
a plurality of first-conductivity-type drift regions that are respectively formed in a region at the first sidewall side of the trench and in a region at the second sidewall side of the trench such as to face each other with the trench interposed therebetween in a surface layer portion of the main surface and that are positioned in a region at the main surface side with respect to the bottom wall;
a plurality of first-conductivity-type source/drain regions that are formed in surface layer portions of the plurality of drift regions, respectively;
a second-conductivity-type base region that is formed in a region below the plurality of drift regions in the semiconductor layer; and
a second-conductivity-type high concentration channel region that is formed in a region along the bottom wall of the trench in the semiconductor layer such as to face the gate electrode with the insulation layer interposed therebetween and that has a second-conductivity-type impurity concentration exceeding a second-conductivity-type impurity concentration of the base region,
wherein the trench further includes a first corner portion having a curved shape that extends from the lower end of the first sidewall to the bottom wall, and a second corner portion having a curved shape that extends from the lower end of the second sidewall to the bottom wall in a cross-sectional view, and
wherein the second-conductivity-type high concentration channel region is positioned at a lower region of the first corner portion and the second corner portion.

2. The semiconductor device according to claim 1, wherein the plurality of source/drain regions are formed in regions at the main surface sides with respect to the upper end portion of the gate electrode.

3. The semiconductor device according to claim 1, wherein the trench gate structure includes an embedded insulator that is embedded in a region on the upper end portion of the gate electrode in the trench.

4. The semiconductor device according to claim 3, wherein the plurality of source/drain regions face the embedded insulator in a direction along the main surface of the semiconductor layer.

5. The semiconductor device according to claim 1, wherein the upper end portion of the gate electrode is positioned at the bottom-wall side of the trench with respect to an intermediate portion of the trench.

6. The semiconductor device according to claim 1, wherein the high concentration channel region is formed at a distance from the plurality of drift regions.

7. The semiconductor device according to claim 6, further comprising:
a second-conductivity-type low concentration channel region that is interposed in a region between the plurality of drift regions and the high concentration channel region in the semiconductor layer and that has a second-conductivity-type impurity concentration less than the second-conductivity-type impurity concentration of the high concentration channel region,
wherein the second-conductivity-type low concentration channel region is formed by a region of a part of the second-conductivity-type base region.

8. The semiconductor device according to claim 1, wherein the gate electrode has a lower end portion positioned at the bottom-wall side of the trench with respect to the plurality of drift regions, and
the high concentration channel region faces the lower end portion of the gate electrode with the insulation layer interposed therebetween.

9. A semiconductor device comprising:
a semiconductor layer that has a main surface;
a trench gate structure that includes a trench formed in the main surface and having a first sidewall at one side, a second sidewall at the other side, and a bottom wall, the trench has a minimum width between lower ends of the first sidewall and second sidewall in a cross-sectional view, an insulation layer formed on an inner wall of the trench, and a gate electrode that is embedded in the trench with the insulation layer between the trench and the gate electrode;
a plurality of first-conductivity-type drift regions that are respectively formed in a region at the first sidewall side of the trench and in a region at the second sidewall side of the trench such as to face each other with the trench interposed therebetween in a surface layer portion of the main surface and that are positioned in a region at the main surface side with respect to the bottom wall;
a plurality of first-conductivity-type source/drain regions that are formed in surface layer portions of the plurality of drift regions, respectively;
a second-conductivity-type base region that is formed in a region below the plurality of drift regions in the semiconductor layer; and
a second-conductivity-type high concentration channel region that is formed in a region along the bottom wall of the trench such as to face the gate electrode with the insulation layer interposed therebetween and that has a second-conductivity-type impurity concentration exceeding a second-conductivity-type impurity concentration of the base region,
wherein the trench further includes a first corner portion having a curved shape that extends from the lower end of the first sidewall to the bottom wall, and a second corner portion having a curved shape that extends from the lower end of the second sidewall to the bottom wall in a cross-sectional view, and
wherein the second-conductivity-type high concentration channel region is positioned at a lower region of the first corner portion and the second corner portion.

10. The semiconductor device according to claim 9, wherein the high concentration channel region is formed at a distance from the plurality of drift regions.

11. The semiconductor device according to claim 9, further comprising:
- a second-conductivity-type low concentration channel region that is interposed in a region between the plurality of drift regions and the high concentration channel region in the semiconductor layer and that has a second-conductivity-type impurity concentration less than the second-conductivity-type impurity concentration of the high concentration channel region,
- wherein the second-conductivity-type low concentration channel region is formed by a region of a part of the second-conductivity-type base region.

12. The semiconductor device according to claim 9, wherein the plurality of drift regions are formed in a region of the main surface of the semiconductor layer with respect to a lower end portion of the gate electrode, and
- the high concentration channel region faces the lower end portion of the gate electrode with the insulation layer interposed therebetween.

13. The semiconductor device according to claim 1, wherein the plurality of source/drain regions are formed at a distance from the trench.

14. The semiconductor device according to claim 1, wherein the plurality of source/drain regions have a first-conductivity-type impurity concentration exceeding a first-conductivity-type impurity concentration of the plurality of drift regions.

15. The semiconductor device according to claim 1, wherein the plurality of source/drain regions include a first-conductivity-type impurity that differs from a first-conductivity-type impurity of the plurality of drift regions.

16. The semiconductor device according to claim 1, wherein the plurality of source/drain regions include a first-conductivity-type impurity that has a diffusion coefficient less than a diffusion coefficient of the first-conductivity-type impurity of the plurality of drift regions.

17. The semiconductor device according to claim 1, wherein the trench extends in a band shape in plan view.

18. The semiconductor device according to claim 1, wherein the trench is formed in a tapered shape in a cross-sectional view.

19. The semiconductor device according to claim 1, wherein the semiconductor layer is made of silicon or of silicon carbide.

* * * * *